(12) United States Patent
Kim et al.

(10) Patent No.: US 11,812,659 B2
(45) Date of Patent: Nov. 7, 2023

(54) ORGANIC ELECTROLUMINESCENCE DEVICE AND POLYCYCLIC COMPOUND FOR ORGANIC ELECTROLUMINESCENCE DEVICE

(71) Applicants: Samsung Display Co., Ltd., Yongin-si (KR); Lapto Co., Ltd., Seongnam-si (KR)

(72) Inventors: Seulong Kim, Hwaseong-si (KR); Eu-gene Oh, Seoul (KR); Munsoo Kim, Seongnam-si (KR); JuWan Maeng, Seongnam-si (KR); Kap-jong Han, Gwangju-si (KR); Jaeweon Hur, Seoul (KR); Hyewon Choi, Suwon-si (KR); Kyungsik Kim, Suwon-si (KR); Sung-Soo Bae, Seoul (KR)

(73) Assignees: Samsung Display Co., Ltd., Yongin-si (KR); Lapto Co., Ltd., Seongnam-si (KR)

( * ) Notice: Subject to any disclaimer, the term of this patent is extended or adjusted under 35 U.S.C. 154(b) by 524 days.

(21) Appl. No.: 17/028,922

(22) Filed: Sep. 22, 2020

(65) Prior Publication Data

US 2021/0098715 A1 Apr. 1, 2021

(30) Foreign Application Priority Data

Sep. 30, 2019 (KR) .................. 10-2019-0121058

(51) Int. Cl.

| | | |
|---|---|---|
| *H10K 85/60* | (2023.01) | |
| *H10K 85/30* | (2023.01) | |
| *C09K 11/06* | (2006.01) | |
| *H10K 50/11* | (2023.01) | |
| *H10K 50/15* | (2023.01) | |
| *H10K 50/165* | (2023.01) | |
| *H10K 101/10* | (2023.01) | |
| *H10K 102/00* | (2023.01) | |

(52) U.S. Cl.
CPC .......... *H10K 85/6572* (2023.02); *C09K 11/06* (2013.01); *H10K 85/324* (2023.02); *H10K 85/636* (2023.02); *H10K 85/654* (2023.02); *H10K 85/656* (2023.02); *C09K 2211/1044* (2013.01); *H10K 50/11* (2023.02); *H10K 50/157* (2023.02); *H10K 50/165* (2023.02); *H10K 2101/10* (2023.02); *H10K 2102/00* (2023.02)

(58) Field of Classification Search
CPC ...................................................... C09K 11/06
See application file for complete search history.

(56) References Cited

U.S. PATENT DOCUMENTS

| 10,211,411 | B2 | 2/2019 | Li et al. | |
|---|---|---|---|---|
| 2007/0241670 | A1* | 10/2007 | Sapochak | .......... H10K 85/6572 549/6 |
| 2008/0114924 | A1* | 5/2008 | Frayer | ................ G06F 13/4239 711/E12.083 |
| 2017/0069849 | A1* | 3/2017 | Lee | ........................ C07F 9/6561 |
| 2017/0077420 | A1* | 3/2017 | Li | ........................ C07F 9/6561 |

FOREIGN PATENT DOCUMENTS

| KR | 10-1305934 B1 | 9/2013 | | |
|---|---|---|---|---|
| KR | 10-2015-0130797 A | 11/2015 | | |
| KR | 10-2017-0030130 A | 3/2017 | | |
| KR | 10-2017-0111387 A | 10/2017 | | |
| WO | WO-2012077582 A1 * | 6/2012 | .......... | C07D 471/06 |

* cited by examiner

*Primary Examiner* — Christopher M Rodd

(74) *Attorney, Agent, or Firm* — Lewis Roca Rothgerber Christie LLP

(57) ABSTRACT

An organic electroluminescence device of an embodiment includes a first electrode, a second electrode opposite the first electrode, and an emission layer between the first electrode and the second electrode, wherein the emission layer includes a polycyclic compound represented by Formula 1, thereby showing improved emission efficiency.

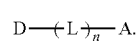

Formula 1

18 Claims, 2 Drawing Sheets

ORGANIC ELECTROLUMINESCENCE DEVICE AND POLYCYCLIC COMPOUND FOR ORGANIC ELECTROLUMINESCENCE DEVICE

CROSS-REFERENCE TO RELATED APPLICATION

This application claims priority to and the benefit of Korean Patent Application No. 10-2019-0121058, filed on Sep. 30, 2019, the entire content of which is hereby incorporated by reference.

BACKGROUND

One or more aspects of embodiments of the present disclosure relate to an organic electroluminescence device and a polycyclic compound used therein, and for example, to a polycyclic compound used as a light-emitting material and an organic electroluminescence device including the same.

Development of organic electroluminescence displays as image displays is being actively conducted. An organic electroluminescence display differs from a liquid crystal display by being a so-called self-luminescent display, in which holes and electrons injected from a first electrode and a second electrode recombine in an emission layer, and a light-emitting material that includes an organic compound in the emission layer emits light to achieve display.

In the application of an organic electroluminescence device to a display, a decrease in driving voltage and an increase of emission efficiency and/or lifespan of the organic electroluminescence device are beneficial, and development of materials for an organic electroluminescence device capable of stably accomplishing these characteristics is desired.

In order to accomplish an organic electroluminescence device with high efficiency, techniques to harness phosphorescence emission (which uses energy in a triplet state) and/or delayed fluorescence emission (which uses singlet excitons generated by the collision of triplet excitons (triplet-triplet annihilation, TTA)) are being developed, and materials for thermally activated delayed fluorescence (TADF) are being developed.

SUMMARY

One or more aspects of embodiments of the present disclosure are directed toward an organic electroluminescence device having improved emission efficiency.

One or more aspects of embodiments of the present disclosure are directed toward a polycyclic compound that may improve the emission efficiency of an organic electroluminescence device.

One or more example embodiments of the present disclosure provide an organic electroluminescence device including a first electrode, a second electrode oppositely disposed to the first electrode, and an emission layer disposed between the first electrode and the second electrode and including a polycyclic compound represented by Formula 1:

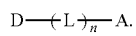

Formula 1

In Formula 1, L may be a substituted or unsubstituted arylene group of 6 to 30 carbon atoms for forming a ring, or a substituted or unsubstituted heteroarylene group of 2 to 30 carbon atoms for forming a ring, A may be a substituted or unsubstituted aryl group of 6 to 30 carbon atoms for forming a ring, or a substituted or unsubstituted heteroaryl group of 2 to 30 carbon atoms for forming a ring, where at least one among L and A includes an electron acceptor substituent, n may be an integer of 1 to 3, and D may be represented by Formula 2:

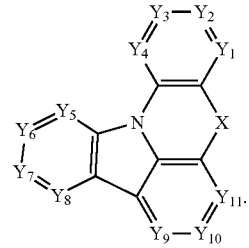

Formula 2

In Formula 2, X may be O, S, $NR_1$, or $SiR_2R_3$, $Y_1$ to $Y_{11}$ may each independently be N or $CR_4$, $R_1$ to $R_4$ may each independently be a hydrogen atom, a deuterium atom, a halogen atom, a substituted or unsubstituted silyl group, a substituted or unsubstituted amine group, a substituted or unsubstituted alkyl group of 1 to 20 carbon atoms, a substituted or unsubstituted aryl group of 6 to 30 carbon atoms for forming a ring, or a substituted or unsubstituted heteroaryl group of 2 to 30 carbon atoms for forming a ring, or may be combined with an adjacent group to form a ring, and any one among $R_1$ to $R_4$ may be a connecting part with (e.g., connected with) L in Formula 1.

In an embodiment, the emission layer may be to emit delayed fluorescence.

In an embodiment, the emission layer may be a delayed fluorescence emission layer including a host and a dopant. The dopant may include the polycyclic compound represented by Formula 1.

In an embodiment, the emission layer may include a host having a first lowest triplet excitation energy level, a first dopant having a second lowest triplet excitation energy level lower than the first lowest triplet excitation energy level, and a second dopant having a third lowest triplet excitation energy level lower than the second lowest triplet excitation energy level. The first dopant may include the polycyclic compound represented by Formula 1.

In an embodiment, the first dopant may be a delayed fluorescence dopant, and the second dopant may be a fluorescence dopant.

In an embodiment, the organic electroluminescence device according to an embodiment of the present disclosure may further include a hole transport region disposed between the first electrode and the emission layer; and an electron transport region disposed between the emission layer and the second electrode.

In an embodiment, A may be represented by one of Formula A-1 to Formula A-3:

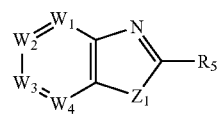

Formula A-1

-continued

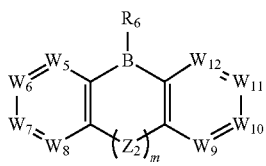
Formula A-2

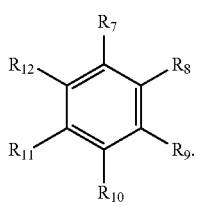
Formula A-3

In Formula A-1 to Formula A-3, $W_1$ to $W_{12}$ may each independently be N or $CR_{13}$, $Z_1$ may be O or S, $Z_2$ may be O, S, $NR_{14}$, $CR_{15}R_{16}$, or $SiR_{17}R_{18}$, m may be 0 or 1, $R_5$ to $R_{18}$ may each independently be a hydrogen atom, a deuterium atom, a halogen atom, a cyano group, a substituted or unsubstituted silyl group, a substituted or unsubstituted amine group, a substituted or unsubstituted alkyl group of 1 to 20 carbon atoms, a substituted or unsubstituted aryl group of 6 to 30 carbon atoms for forming a ring, or a substituted or unsubstituted heteroaryl group of 2 to 30 carbon atoms for forming a ring, or may be combined with an adjacent group to form a ring, at least one among $R_7$ to $R_{12}$ may be a halogen atom or a cyano group, and any one of $R_5$ to $R_{18}$ may be a connecting part with L in Formula 1.

In an embodiment, A may be represented by one of Formula A-1-1 to Formula A-3-3:

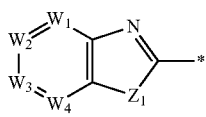
Formula A-1-1

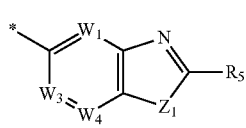
Formula A-1-2

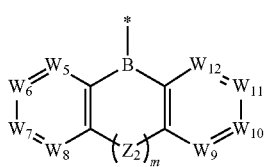
Formula A-2-1

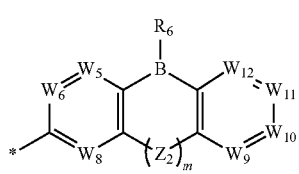
Formula A-2-2

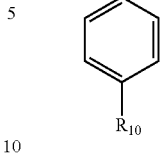
Formula A-3-1

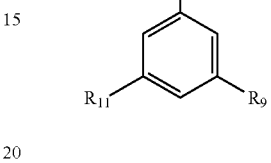
Formula A-3-2

Formula A-3-3

In Formula A-1-1 to Formula A-3-3, $W_1$ to $W_{12}$, $Z_1$, $Z_2$, m, and $R_5$ to $R_{18}$ may each independently be the same as defined in Formula A-1 to Formula A-3.

In an embodiment, the polycyclic compound represented by Formula 1 may be represented by Formula 3:

$$D_1\text{-}L_1\text{-}A\text{-}L_2 D_2 \qquad \text{Formula 3}$$

In Formula 3, $L_1$ and $L_2$ may each independently be a substituted or unsubstituted arylene group of 6 to 30 carbon atoms for forming a ring, or a substituted or unsubstituted heteroarylene group of 2 to 30 carbon atoms for forming a ring, $D_1$ may be represented by Formula 2, and $D_2$ may be an electron donor substituent. In Formula 3, A may be the same as defined in Formula 1.

In an embodiment, $D_2$ may be a substituted or unsubstituted arylamine group, a substituted or unsubstituted carbazole group, a substituted or unsubstituted acridine group, or a substituted or unsubstituted phenoxazine group.

In an embodiment, D may be represented by one of Formula 2-1 to Formula 2-5:

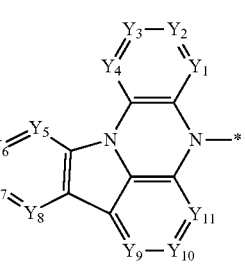
Formula 2-1

-continued

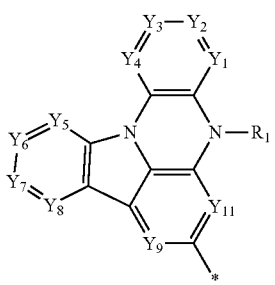

Formula 2-2

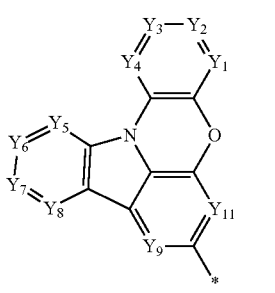

Formula 2-3

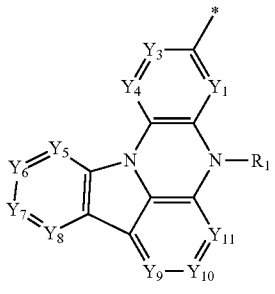

Formula 2-4

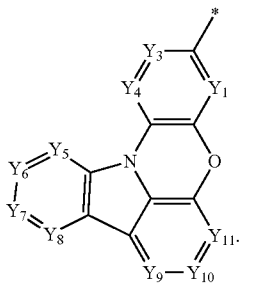

Formula 2-5

In Formula 2-1 to Formula 2-5, $Y_1$ to $Y_{11}$, and $R_1$ to $R_4$ may each independently be the same as defined in Formula 2.

In an embodiment, L may be a substituted or unsubstituted phenylene group, a substituted or unsubstituted pyridinylene group, a substituted or unsubstituted triazinylene group, a substituted or unsubstituted benzoxazolylene group, a substituted or unsubstituted benzothiazolylene group, a substituted or unsubstituted benzimidazolylene group, a substituted or unsubstituted imidazopyridinylene group, a substituted or unsubstituted oxazolopyridinylene group, a substituted or unsubstituted thiazolopyridinylene group, a substituted or unsubstituted dibenzoborynylene group, or a substituted or unsubstituted dibenzoxaborynylene group.

One or more example embodiments of the present disclosure provide a polycyclic compound represented by Formula 1 above.

In some embodiments, the first electrode and the second electrode may each independently include at least one selected from Ag, Mg, Cu, Al, Pt, Pd, Au, Ni, Nd, Ir, Cr, Li, Ca, LiF/Ca, LiF/Al, Mo, Ti, In, Sn, and Zn, a compound of two or more thereof, a mixture of two or more thereof, and an oxides of one or more thereof.

In an embodiment, an absolute value of a difference between a lowest singlet excitation energy level (S1) and a lowest triplet excitation energy level (T1) in the polycyclic compound represented by Formula 1 may be about 0.2 eV.

BRIEF DESCRIPTION OF THE DRAWINGS

The accompanying drawings are included to provide a further understanding of the present disclosure, and are incorporated in and constitute a part of this specification. The drawings illustrate example embodiments of the present disclosure and, together with the description, serve to explain principles of the present disclosure. In the drawings.

DETAILED DESCRIPTION

Figure 1:
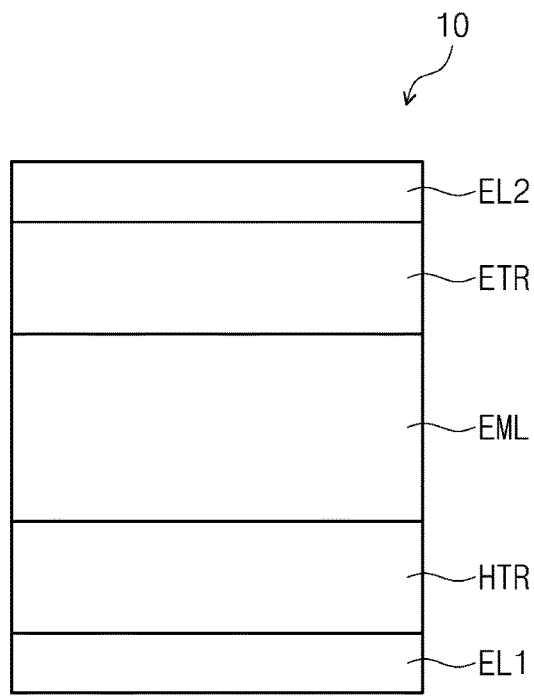
FIG. 1 is a schematic cross-sectional view illustrating an organic electroluminescence device according to an embodiment of the present disclosure.

The above objects, other objects, features and advantages of the present disclosure will be easily understood from example embodiments with reference to the accompanying drawings. The present disclosure may, however, be embodied in different forms and should not be construed as being limited to the embodiments set forth herein. Rather, example embodiments are provided so that the contents disclosed herein may be thorough and complete, and the spirit of the present disclosure may be sufficiently described for a person skilled in the art.

Like reference numerals refer to like elements throughout, and duplicative descriptions thereof may not be provided. In the drawings, the dimensions of structures may be exaggerated for clarity of illustration. It will be understood that, although the terms first, second, etc. may be used herein to describe various elements, these elements should not be limited by these terms. These terms are only used to distinguish one element from another element. Thus, a first element could be termed a second element without departing from the teachings of the present disclosure. Similarly, a second element could be termed a first element. As used herein, the singular forms are intended to include the plural forms as well, unless the context clearly indicates otherwise.

It will be further understood that the terms "includes," "including," "comprises," and/or "comprising," when used in this specification, specify the presence of stated features, numerals, steps, operations, elements, parts, or the combination thereof, but do not preclude the presence or addition of one or more other features, numerals, steps, operations, elements, parts, or the combination thereof. In addition, it will also be understood that when a layer, a film, a region, a plate, etc. is referred to as being "on" another part, it can be "directly on" the other part, or intervening layers may also be present. On the contrary, it will also be understood that when a layer, a film, a region, a plate, etc. is referred to as being "under" another part, it can be "directly under" the other part, or intervening layers may also be present.

As used herein, expressions such as "at least one of", "one of", and "selected from", when preceding a list of elements, modify the entire list of elements and do not modify the individual elements of the list. As used herein, the term "and/or" includes any and all combinations of one or more of the associated listed items. Further, the use of "may" when describing embodiments of the present disclosure refers to "one or more embodiments of the present disclosure".

Hereinafter, an organic electroluminescence device according to an embodiment of the present disclosure and a polycyclic compound of an embodiment included therein will be explained with reference to the attached drawings.

FIGS. 1 to 4 are schematic cross-sectional views showing organic electroluminescence devices according to example embodiments of the present disclosure. Referring to FIGS. 1 to 4, in an organic electroluminescence device 10 according to an embodiment, a first electrode EL1 and a second electrode EL2 are oppositely disposed, and between the first electrode EL1 and the second electrode EL2, a plurality of organic layers may be disposed. The plurality of the organic layers may include a hole transport region HTR, an emission layer EML, and an electron transport region ETR. For example, the organic electroluminescence device 10 of an embodiment may include a first electrode EL1, a hole transport region HTR, an emission layer EML, an electron transport region ETR, and a second electrode, stacked in order. A capping layer CPL may be further disposed on the second electrode EL2.

The organic electroluminescence device 10 of an embodiment may include a polycyclic compound of an embodiment, which will be explained later, in at least one organic layer selected from the plurality of organic layers disposed between the first electrode EL1 and the second electrode EL2. For example, the organic electroluminescence device 10 of an embodiment may include a polycyclic compound of an embodiment in the emission layer EML disposed between the first electrode EL1 and the second electrode EL2. However, an embodiment of the present disclosure is not limited thereto. For example, the organic electroluminescence device 10 of an embodiment may include a polycyclic compound of an embodiment in at least one organic layer included in the hole transport region HTR and the electron transport region ETR, which are among the plurality of organic layers disposed between the first electrode EL1 and the second electrode EL2 in addition to the emission layer EML, or for example, may include a polycyclic compound of an embodiment in a capping layer CPL disposed on the second electrode EL2.

Figure 2:
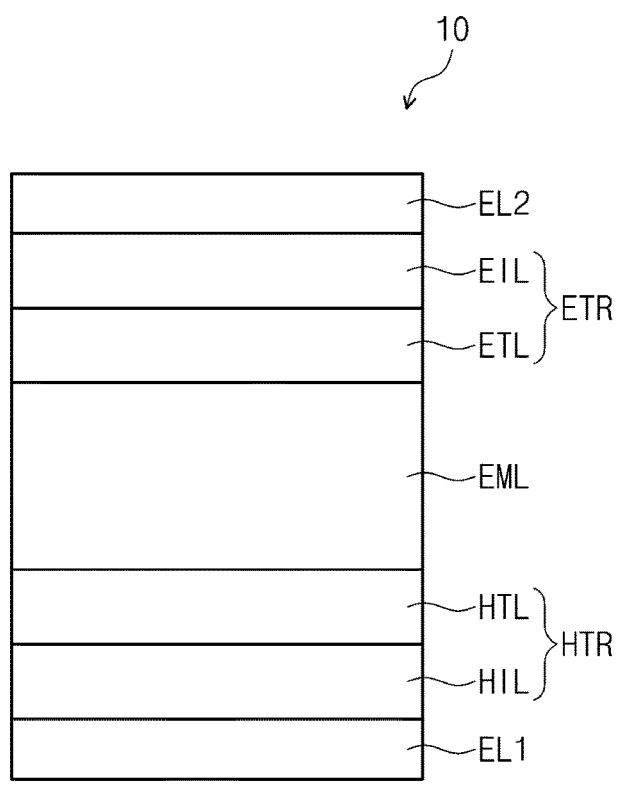
FIG. 2 is a schematic cross-sectional view illustrating an organic electroluminescence device according to an embodiment of the present disclosure.
Figure 3:
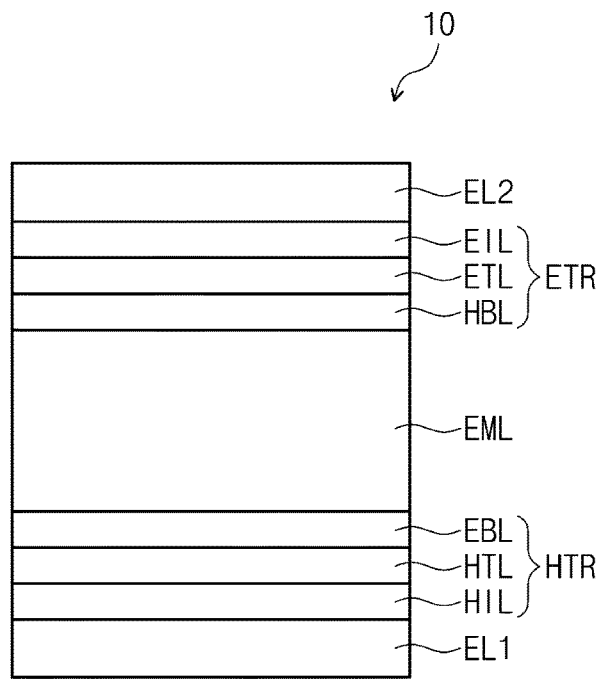
FIG. 3 is a schematic cross-sectional view illustrating an organic electroluminescence device according to an embodiment of the present disclosure.
Figure 4:
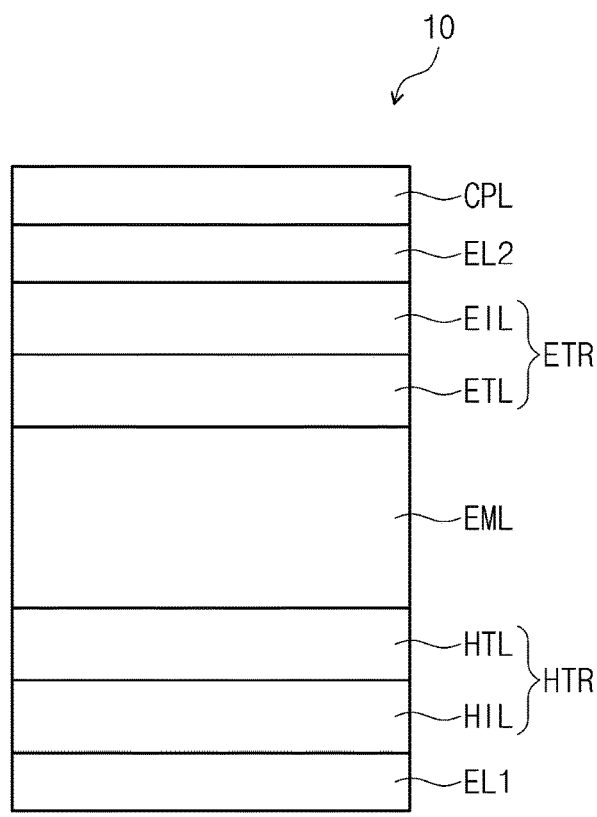
FIG. 4 is a schematic cross-sectional view illustrating an organic electroluminescence device according to an embodiment of the present disclosure.

When compared with FIG. 1, FIG. 2 shows the cross-sectional view of an organic electroluminescence device 10 of an embodiment in which the hole transport region HTR includes a hole injection layer HIL and a hole transport layer HTL, and the electron transport region ETR includes an electron injection layer EIL and an electron transport layer ETL. When compared with FIG. 1, FIG. 3 shows the cross-sectional view of an organic electroluminescence device 10 of an embodiment, wherein the hole transport region HTR includes the hole injection layer HIL, the hole transport layer HTL, and an electron blocking layer EBL, and the electron transport region ETR includes the electron injection layer EIL, the electron transport layer ETL, and a hole blocking layer HBL. When compared with FIG. 2, FIG. 4 shows the cross-sectional view of an organic electroluminescence device 10 of an embodiment further including a capping layer CPL disposed on the second electrode EL2.

Hereinafter, in explaining the organic electroluminescence device 10 of an embodiment, the emission layer EML is described as including the polycyclic compound of an embodiment but embodiments of the present disclosure are not limited thereto. For example, the polycyclic compound according to an embodiment may be included in the hole transport region HTR, the electron transport region ETR, and/or the capping layer CPL.

The first electrode EL1 may have conductivity (e.g., may be conductive). The first electrode EL1 may be formed using a metal alloy and/or a conductive compound. The first electrode EL1 may be an anode. In some embodiments, the first electrode EL1 may be a pixel electrode. The first electrode EL1 may be a transmissive electrode, a transflective electrode, or a reflective electrode. When the first electrode EL1 is a transmissive electrode, the first electrode EL1 may include or be formed of a transparent metal oxide, for example, indium tin oxide (ITO), indium zinc oxide (IZO), zinc oxide (ZnO), indium tin zinc oxide (ITZO), etc. When the first electrode EL1 is a transflective electrode or a reflective electrode, the first electrode EU may include or be formed of silver (Ag), magnesium (Mg), copper (Cu), aluminum (Al), platinum (Pt), palladium (Pd), gold (Au), nickel (Ni), neodymium (Nd), iridium (Ir), chromium (Cr), lithium (Li), calcium (Ca), LiF/Ca, LiF/Al, molybdenum (Mo), titanium (Ti), a compound thereof, or a mixture thereof (for example, a mixture of Ag and Mg). In some embodiments, the first electrode EU may have a structure including a plurality of layers including a reflective layer and/or a transflective layer formed using the above materials, and a transmissive conductive layer formed using ITO, IZO, ZnO, ITZO, etc. For example, the first electrode EL1 may include a three-layer structure of ITO/Ag/ITO. However, an embodiment of the present disclosure is not limited thereto. The thickness of the first electrode EU may be about 1,000 Å to about 10,000 Å, for example, about 1,000 Å to about 3,000 Å.

The hole transport region HTR is disposed on the first electrode EL1. The hole transport region HTR may include at least one of a hole injection layer HIL, a hole transport layer HTL, a hole buffer layer, or an electron blocking layer EBL. The thickness of the hole transport region HTR may be, for example, about 50 Å to about 1,500 Å.

The hole transport region HTR may have or be a single layer formed using a single material, a single layer formed using a plurality of different materials, or a multilayer structure including a plurality of layers formed using a plurality of different materials.

For example, the hole transport region HTR may have a single layer structure including the hole injection layer HIL or the hole transport layer HTL, or a single layer structure formed using a hole injection material and a hole transport material (e.g., mixed together). In some embodiments, the hole transport region HTR may have a structure of a single layer formed using a plurality of different materials, or a multi-layer structure stacked from (on) the first electrode EL1 and including a hole injection layer HIL/hole transport layer HTL, hole injection layer HIL/hole transport layer HTL/hole buffer layer, hole injection layer HIL/hole buffer layer, hole transport layer HTL/hole buffer layer, or hole injection layer HIL/hole transport layer HTL/electron blocking layer EBL, without limitation.

The hole transport region HTR may be formed using any suitable method (such as a vacuum deposition method, a spin coating method, a cast method, a Langmuir-Blodgett (LB) method, an inkjet printing method, a laser printing method, and/or a laser induced thermal imaging (LITI) method).

The hole injection layer HIL may include, for example, a phthalocyanine compound (such as copper phthalocyanine), N,N'-diphenyl-N,N'-bis-[4-(phenyl-m-tolyl-amino)-phenyl]-biphenyl-4,4'-diamine (DNTPD), 4,4',4''-tris(3-methylphenylphenylamino) triphenylamine (m-MTDATA), 4,4',4''-tris(N,N-diphenylamino)triphenylamine (TDATA), 4,4',4''-tris{N,-2-naphthyl)-N-phenylamino}-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N'-di(1-naphthalene-1-yl)-N,N'-diphenyl-benzidine (NPB), triphenylamine-containing polyetherketone (TPAPEK), 4-isopropyl-4'-methyldiphenyliodonium tetrakis(pentafluorophenyl)borate, and dipyrazino[2,3-f:2',3'-h]quinoxaline-2,3,6,7,10,11-hexacarbonitrile (HAT-CN).

The hole transport layer HTL may include, for example, carbazole derivatives (such as N-phenyl carbazole and/or polyvinyl carbazole), fluorene-based derivatives, N,N'-bis(3-methylphenyl)-N,N'-diphenyl-[1,1-biphenyl]-4,4'-diamine (TPD), triphenylamine-based derivatives (such as 4,4',4''-tris(carbazol-9-yl)triphenylamine (TCTA)), N,N'-di(naphthalene-1-yl)-N,N'-diphenyl-benzidine (NPB), 4,4'-cyclohexylidene bis[N,N-bis(4-methylphenyl)benzeneamine] (TAPC), 4,4'-bis[N,N'-(3-tolyl)amino]-3,3'-dimethylbiphenyl (HMTPD), 1,3-bis(N-carbazolyl)benzene (mCP), 9-(4-tert-butylphenyl)-3,6-bis(triphenylsilyl)-9H-carbazole (CzSi), etc.

The thickness of the hole transport region HTR may be about 100 Å to about 10,000 Å, for example, about 100 Å to about 5,000 Å. The thickness of the hole injection region HIL may be, for example, about 30 Å to about 1,000 Å, and the thickness of the hole transport layer HTL may be about 30 Å to about 1,000 Å. In some embodiments, the thickness of the electron blocking layer EBL may be about 10 Å to about 1,000 Å. When the thicknesses of the hole transport region HTR, the hole injection layer HIL, the hole transport layer HTL and/or the electron blocking layer EBL satisfy the above-described ranges, satisfactory hole transport properties may be achieved without a substantial increase in driving voltage.

The hole transport region HTR may further include a charge generating material to increase conductivity in addition to the above-described materials. The charge generating material may be dispersed substantially uniformly or non-uniformly in the hole transport region HTR. The charge generating material may be, for example, a p-dopant. The p-dopant may be a quinone derivative, metal oxide, or cyano group-containing compound, without limitation. Non-limiting examples of the p-dopant include quinone derivatives (such as tetracyanoquinodimethane (TCNQ) and/or 2,3,5,6-tetrafluoro-7,7,8,8-tetracyanoquinodimethane (F4-TCNQ)), metal oxides (such as tungsten oxide and/or molybdenum oxide), etc.

As described above, the hole transport region HTR may further include at least one of a hole buffer layer or an electron blocking layer EBL in addition to the hole injection layer HIL and the hole transport layer HTL. The hole buffer layer may compensate for an optical resonance distance according to the wavelength of light emitted from the emission layer EML to thereby increase the light emission efficiency. The materials included in the hole transport region HTR may be the same as the materials included in the hole buffer layer. The electron blocking layer EBL may prevent or reduce electron injection from the electron transport region ETR into the hole transport region HTR.

The emission layer EML is disposed on the hole transport region HTR. The emission layer EML may have a thickness of, for example, about 100 Å to about 1,000 Å, or about 100 Å to about 300 Å. The emission layer EML may have or be a single layer formed using a single material, a single layer formed using a plurality of different materials, or a multi-layer structure having a plurality of layers formed using a plurality of different materials.

In the organic electroluminescence device 10 of an embodiment, the emission layer EML may include the polycyclic compound of an embodiment.

In the description, ——— * refers to a connecting part.

In the description, the term "substituted or unsubstituted" refers to being unsubstituted, or being substituted with at least one substituent selected from the group consisting of a deuterium atom, a halogen atom, a cyano group, a nitro group, an amino group, a silyl group, an oxy group, a thio group, a sulfinyl group, a sulfonyl group, a carbonyl group, a boryl group, a phosphine oxide group, a phosphine sulfide group, an alkyl group, an alkenyl group, an alkoxy group, a hydrocarbon ring group, an aryl group, and a heterocyclic group. In addition, each of the substituents may be further substituted or unsubstituted. For example, a biphenyl group may be interpreted as an aryl group, or as a phenyl group substituted with a phenyl group.

In the description, the term "forming a ring via combination with an adjacent group" may refer to forming a substituted or unsubstituted hydrocarbon ring or a substituted or unsubstituted heterocycle when the group or atom is bonded to an adjacent group. The term "hydrocarbon ring" includes an aliphatic hydrocarbon ring and an aromatic hydrocarbon ring. The term "heterocycle" includes an aliphatic heterocycle and an aromatic heterocycle. The hydrocarbon ring and the heterocycle, and in some embodiments the ring formed via combination with an adjacent group may be a monocyclic ring or a polycyclic ring. In some embodiments, the ring formed via combination with an adjacent group may be further combined with another ring to form a spiro structure.

In the description, the term "adjacent group" may refer to a substituent on the same atom or point, a substituent on an atom that is directly connected to the base atom or point, or a substituent sterically positioned (e.g., within intramolecular bonding distance) to the corresponding substituent. For example, in 1,2-dimethylbenzene, the two methyl groups may be interpreted as "adjacent groups" to each other, and in 1,1-diethylcyclopentane, the two ethyl groups may be interpreted as "adjacent groups" to each other.

In the description, the term "halogen atom" may refer to a fluorine atom, a chlorine atom, a bromine atom, or an iodine atom.

In the description, the term "alkyl" may refer to a linear, branched or cyclic alkyl group. The carbon number of the alkyl may be 1 to 50, 1 to 30, 1 to 20, 1 to 10, or 1 to 6. Non-limiting examples of the alkyl include methyl, ethyl, n-propyl, isopropyl, n-butyl, s-butyl, t-butyl, i-butyl, 2-ethylbutyl, 3,3-dimethylbutyl, n-pentyl, i-pentyl, neopentyl, t-pentyl, cyclopentyl, 1-methylpentyl, 3-methylpentyl, 2-ethylpentyl, 4-methyl-2-pentyl, n-hexyl, 1-methylhexyl, 2-ethylhexyl, 2-butylhexyl, cyclohexyl, 4-methylcyclohexyl, 4-t-butylcyclohexyl, n-heptyl, 1-methylheptyl, 2,2-dimethylheptyl, 2-ethylheptyl, 2-butylheptyl, n-octyl, t-octyl, 2-ethyloctyl, 2-butyloctyl, 2-hexyloctyl, 3,7-dimethyloctyl, cyclooctyl, n-nonyl, n-decyl, adamantyl, 2-ethyldecyl, 2-butyldecyl, 2-hexyldecyl, 2-octyldecyl, n-undecyl, n-dodecyl, 2-ethyldodecyl, 2-butyldodecyl, 2-hexyldocecyl, 2-octyldodecyl, n-tridecyl, n-tetradecyl, n-pentadecyl, n-hexadecyl, 2-ethylhexadecyl, 2-butylhexadecyl, 2-hexylhexadecyl, 2-octylhexadecyl, n-heptadecyl, n-octadecyl, n-nonadecyl, n-eicosyl, 2-ethyleicosyl, 2-butyleicosyl, 2-hexyleicosyl, 2-octyleicosyl, n-henicosyl, n-docosyl, n-tricosyl, n-tetracosyl, n-pentacosyl, n-hexacosyl, n-heptacosyl, n-octacosyl, n-nonacosyl, n-triacontyl, etc.

In the description, the term "hydrocarbon ring" may refer to an optional functional group or substituent derived from an aliphatic hydrocarbon ring, or an optional functional group or substituent derived from an aromatic hydrocarbon ring. The carbon number of the hydrocarbon ring for forming a ring may be 5 to 60.

In the description, the term "heterocyclic group" may refer to an optional functional group of substituent derived from a heterocycle including at least one heteroatom as a ring-forming element. The carbon number of the heterocyclic group for forming a ring may be 5 to 60.

In the description, the term "aryl group" may refer to an optional functional group or substituent derived from an aromatic hydrocarbon ring. The aryl group may be a monocyclic aryl group or a polycyclic aryl group. The carbon number for forming a ring in the aryl group may be 6 to 30, 6 to 20, or 6 to 15. Non-limiting examples of the aryl group include phenyl, naphthyl, fluorenyl, anthracenyl, phenanthryl, biphenyl, terphenyl, quaterphenyl, quinqphenyl, sexiphenyl, triphenylenyl, pyrenyl, benzofluoranthenyl, chrysenyl, etc.

In the description, the fluorenyl group may be substituted (e.g., at the 9H position), and two substituents at the 9H position may be combined with each other to form a spiro structure. Non-limiting examples of a substituted fluorenyl group are as follows. However, an embodiment of the present disclosure is not limited thereto.

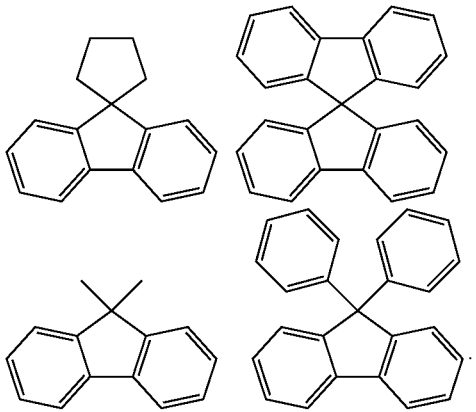

In the description, the term "heteroaryl" may refer to an aryl group including one or more boron (B), oxygen (O), nitrogen (N), phosphorus (P), silicon (Si), and sulfur (S) atoms. When the heteroaryl includes two or more heteroatoms, the two or more heteroatoms may be the same or different. The heteroaryl may be a monocyclic heteroaryl or a polycyclic heteroaryl. The carbon number for forming a ring of the heteroaryl may be 2 to 30, 2 to 20, or 2 to 10. Non-limiting examples of the heteroaryl include thiophene, furan, pyrrole, imidazole, thiazole, oxazole, oxadiazole, triazole, pyridine, bipyridine, pyrimidine, triazine, triazole, acridyl, pyridazine, pyrazinyl, quinoline, quinazoline, quinoxaline, phenoxazine, phthalazine, pyrido pyrimidine, pyrido pyrazine, pyrazino pyrazine, isoquinoline, indole, carbazole, N-arylcarbazole, N-heteroarylcarbazole, N-alkylcarbazole, benzoxazole, benzimidazole, benzothiazole, benzocarbazole, benzothiophene, dibenzothiophene, thienothiophene, benzofuran, phenanthroline, thiazole, isooxazole, oxadiazole, thiadiazole, phenothiazine, dibenzosilole, dibenzofuran, etc.

In the description, the term "silyl group" includes an alkylsilyl group and an arylsilyl group. Non-limiting examples of the silyl group include trimethylsilyl, triethylsilyl, t-butyldimethylsilyl, vinyldimethylsilyl, propyldimethylsilyl, triphenylsilyl, diphenylsilyl, phenylsilyl, etc. However, an embodiment of the present disclosure is not limited thereto.

In the description, the term "boryl group" includes an alkyl boryl group and an aryl boryl group. Non-limiting examples of the boryl group include a trimethylboryl group, a triethylboryl group, a t-butyldimethylboryl group, a triphenylboryl group, a diphenylboryl group, a phenylboryl group, etc.

In the description, the carbon number of the amine group is not specifically limited, but may be 1 to 30. The amine group may include an alkyl amine group and an aryl amine group. Non-limiting examples of the amine group include a methylamine group, a dimethylamine group, a phenylamine group, a diphenylamine group, a naphthylamine group, a 9-methyl-anthracenylamine group, a triphenylamine group, etc.

In the description, the term "heterocyclic group" may include one or more of B, O, N, P, Si and S as heteroatoms. When the heterocyclic group includes two or more heteroatoms, the two or more heteroatoms may be the same or different. The heterocyclic group may be a monocyclic heterocyclic group or a polycyclic heterocyclic group, and in some embodiments may include a heteroaryl group. The carbon number for forming a ring of the heterocyclic group may be 2 to 30, 2 to 20, or 2 to 10.

The polycyclic compound of an embodiment may include a substituted or unsubstituted indolophenazine group, or a substituted or unsubstituted indolophenoxazine group. For example, the polycyclic compound of an embodiment may include a substituted or unsubstituted indolophenazine group or a substituted or unsubstituted indolophenoxazine group as an electron donor substituent.

The polycyclic compound of an embodiment may be represented by Formula 1:

Formula 1

In Formula 1, L may be a substituted or unsubstituted arylene group of 6 to 30 carbon atoms for forming a ring, or a substituted or unsubstituted heteroarylene group of 2 to 30 carbon atoms for forming a ring. In an embodiment, L may be a substituted or unsubstituted phenylene group, a substituted or unsubstituted pyridinylene group, a substituted or unsubstituted triazinylene group, a substituted or unsubstituted benzoxazolylene group, a substituted or unsubstituted benzothiazolylene group, a substituted or unsubstituted benzimidazolylene group, a substituted or unsubstituted imidazopyridinylene group, a substituted or unsubstituted oxazolopyridinylene group, a substituted or unsubstituted thiazolopyridinylene group, a substituted or unsubstituted dibenzoborynylene group, or a substituted or unsubstituted dibenzoxaborynylene group.

In Formula 1, n may be an integer of 1 to 3.

In Formula 1, A may be a substituted or unsubstituted aryl group of 6 to 30 carbon atoms for forming a ring, or a substituted or unsubstituted heteroaryl group of 2 to 30 carbon atoms for forming a ring. In an embodiment, A may be a substituted or unsubstituted phenyl group, a substituted or unsubstituted pyridine group, a substituted or unsubstituted triazine group, a substituted or unsubstituted benzoxazole group, a substituted or unsubstituted benzothiazole group, a substituted or unsubstituted benzimidazole group, a substituted or unsubstituted imidazopyridine group, a substituted or unsubstituted oxazolopyridine group, a substituted or unsubstituted thiazolopyridine group, a substituted or unsubstituted dibenzoborynylene group, or a substituted or unsubstituted dibenzoxaborynyl group. In an embodiment, A may be a substituted or unsubstituted carbazole group, a substituted or unsubstituted arylamine group, a substituted or unsubstituted acridine group, or a substituted or unsubstituted phenoxazine group.

In Formula 1, at least one among L and A may include an electron acceptor substituent. In an embodiment, L may be a substituted or unsubstituted arylene group of 6 to 30 carbon atoms for forming a ring, and A may include an electron acceptor substituent. In an embodiment, L may include an electron acceptor substituent, and A may be a substituted or unsubstituted carbazole group, a substituted or unsubstituted arylamine group, a substituted or unsubstituted acridine group, or a substituted or unsubstituted phenoxazine group.

In Formula 1, D is an electron donor substituent. In some embodiments, D may be represented by Formula 2:

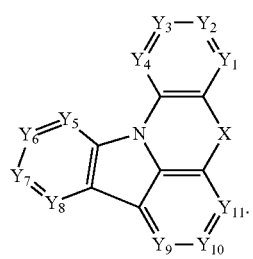

Formula 2

In Formula 2, X may be O, S, $NR_1$, or $SiR_2R_3$. In an embodiment, X may be O or $NR_1$. When X is O, the polycyclic compound represented by Formula 1 may include an indolophenoxazine group as an electron donor substituent. When X is $NR_1$, the polycyclic compound represented by Formula 1 may include an indolophenazine group as an electron donor substituent.

In Formula 2, $Y_1$ to $Y_{11}$ may each independently be N or $CR_4$. In an embodiment, each (all) of $Y_1$ to $Y_{11}$ may be $CR_4$. In an embodiment, any one of $Y_1$ to $Y_{11}$ may be N and the rest (remainder) may be $CR_4$.

In Formula 2, $R_1$ to $R_4$ may each independently be a hydrogen atom, a deuterium atom, a halogen atom, a substituted or unsubstituted silyl group, a substituted or unsubstituted amine group, a substituted or unsubstituted alkyl group of 1 to 20 carbon atoms, a substituted or unsubstituted aryl group of 6 to 30 carbon atoms for forming a ring, or a substituted or unsubstituted heteroaryl group of 2 to 30 carbon atoms for forming a ring. In some embodiments, $R_1$ to $R_4$ may each independently be combined with an adjacent group to form a ring. In an embodiment, $R_1$ may be a substituted or unsubstituted methyl group, or a substituted or unsubstituted phenyl group. In an embodiment, $R_4$ may be a hydrogen atom. When a plurality of $R_4$ are present, the $R_4$ groups may be the same or different.

In some embodiments, in Formula 2, one of $R_1$ to $R_4$ may represent a connection with (to) L in Formula 1. In an embodiment, in the substituent structure represented by Formula 2, X may be $NR_1$, and $R_1$ may represent a connection with L. In the substituent structure represented by Formula 2, $Y_2$ or $Y_{10}$ may be $CR_4$, and $R_4$ may represent a connection with L in Formula 1.

In Formula 1, A or the electron accepting substituent on L may be represented by one of Formula A-1 to Formula A-3:

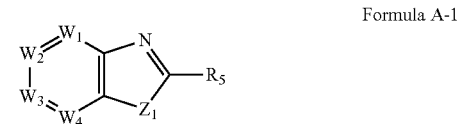

Formula A-1

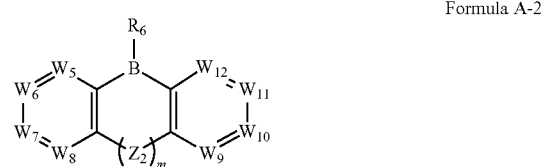

Formula A-2

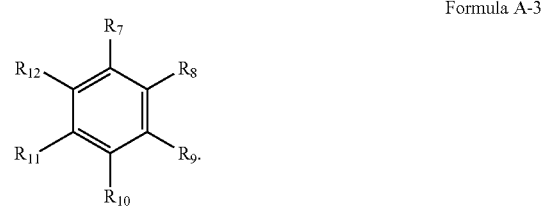

Formula A-3

In Formula A-1 to Formula A-3, $W_1$ to $W_{12}$ may each independently be N or $CR_{13}$. In Formula A-1, in some embodiments, $W_1$ to $W_4$ may each (all) be $CR_{13}$. In some embodiments, $W_1$ may be N, and $W_2$ to $W_4$ may be $CR_{13}$. In Formula A-2, in some embodiments, $W_5$ to $W_{12}$ may each (all) be $CR_{13}$.

In Formula A-1, $Z_1$ may be O or S. When $Z_1$ is O, the substituent represented by Formula A-1 may be a benzoxazole moiety. When $Z_1$ is S, the substituent represented by Formula A-1 may be a benzothiazole moiety.

In Formula A-2, $Z_2$ may be O, S, $NR_{14}$, $CR_{15}R_{16}$, or $SiR_{17}R_{18}$. In an embodiment, $Z_2$ may be O, or $CR_{15}R_{16}$. When $Z_2$ is O, the substituent represented by Formula A-2 may be a dibenzoxaborynyl moiety. When $Z_2$ is $CR_{15}R_{16}$, the substituent represented by Formula A-2 may be a dibenzoborynyl moiety.

In Formula A-2, m may be 0 or 1. When m is 0, $Z_2$ is not present (included) in the substituent represented by Formula A-2, and two six-member aromatic rings are substituted on a boron atom (e.g., without being bonded at another point). In an embodiment, when m is 0 and $W_5$ to $W_{12}$ are each $CR_{13}$, the substituent represented by Formula A-2 may be a diphenylborane moiety.

In Formula A-1 to Formula A-3, $R_5$ to $R_{18}$ may each independently be a hydrogen atom, a deuterium atom, a halogen atom, a cyano group, a substituted or unsubstituted silyl group, a substituted or unsubstituted amine group, a substituted or unsubstituted alkyl group of 1 to 20 carbon atoms, a substituted or unsubstituted aryl group of 6 to 30 carbon atoms for forming a ring, or a substituted or unsubstituted heteroaryl group of 2 to 30 carbon atoms for forming a ring. In an embodiment, $R_5$ and $R_6$ may each (all) be hydrogen atoms.

In Formula A-3, at least one selected from $R_7$ to $R_{12}$ may be a halogen atom or a cyano group. In an embodiment, one or two selected from $R_7$ to $R_{12}$ may be cyano groups. In some embodiments, $R_7$ to $R_{12}$ may each (all) be halogen atoms. In some embodiments, $R_7$ to $R_{12}$ may each (all) be fluorine atoms.

In Formula 1, A may be represented by one of Formula A-1-1 to Formula A-3-3:

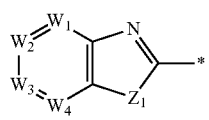

Formula A-1-1

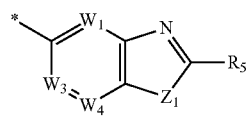

Formula A-1-2

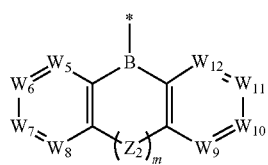

Formula A-2-1

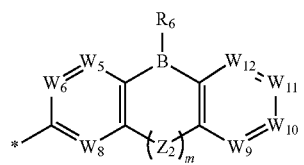

Formula A-2-2

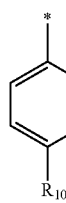

Formula A-3-1

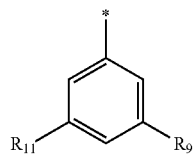

Formula A-3-2

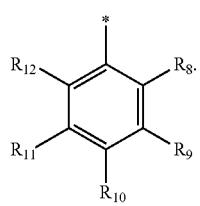

Formula A-3-3

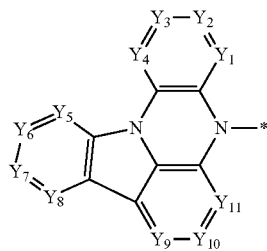

Formula 2-1

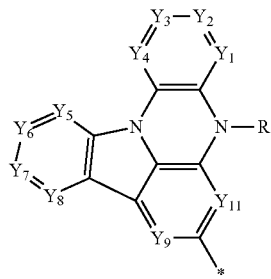

Formula 2-2

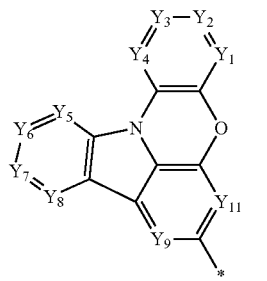

Formula 2-3

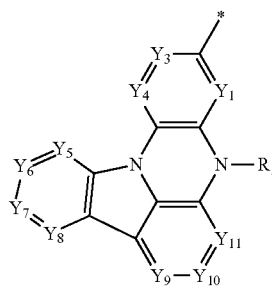

Formula 2-4

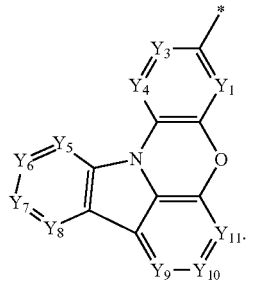

Formula 2-5

In Formula A-1-1 to Formula A-3-3, $W_1$ to $W_{12}$, $Z_1$, $Z_2$, m, and $R_5$ to $R_{18}$ may be the same as described herein in connection with Formula A-1 to Formula A-3.

In Formula 1, D may be represented by one of Formula 2-1 to Formula 2-5:

In Formula 2-1 to Formula 2-5, $Y_1$ to $Y_{11}$, and $R_1$ to $R_4$ may be the same as described herein in connection with Formula 2.

The polycyclic compound represented by Formula 1 may be represented by Formula 3:

$$D_1\text{-}L_1\text{-}A\text{-}L_2\text{-}D_2 \qquad \text{Formula 3}$$

In Formula 3, $L_1$ and $L_2$ may each independently be a substituted or unsubstituted arylene group of 6 to 30 carbon atoms for forming a ring, or a substituted or unsubstituted heteroarylene group of 2 to 30 carbon atoms for forming a ring. In an embodiment, $L_1$ and $L_2$ may each independently be a substituted or unsubstituted phenylene group, a substituted or unsubstituted pyridinylene group, a substituted or unsubstituted triazinylene group, a substituted or unsubstituted benzoxazolylene group, a substituted or unsubstituted benzothiazolylene group, a substituted or unsubstituted benzimidazolylene group, a substituted or unsubstituted imidazopyridinylene group, a substituted or unsubstituted oxazolopyridinylene group, a substituted or unsubstituted thiazolopyridinylene group, a substituted or unsubstituted dibenzoborynylene group, or a substituted or unsubstituted dibenzoxaborynylene group. In Formula 3, $L_1$ and $L_2$ may be the same as described herein in connection with L in Formula 1.

In Formula 3, $D_1$ may be an electron donor substituent. In some embodiments, $D_1$ may be represented by Formula 2. In Formula 3, $D_1$ may be the same as described herein in connection with D in Formula 1.

In Formula 3, $D_2$ may be an electron donor substituent. In some embodiments, $D_2$ may be a substituted or unsubstituted arylamine group, a substituted or unsubstituted carbazole group, a substituted or unsubstituted acridine group, or a substituted or unsubstituted phenoxazine group.

In Formula 3, $D_1$ and $D_2$ may be different from each other. In an embodiment, $D_1$ may be a substituted or unsubstituted indolophenazine group, and $D_2$ may be a substituted or unsubstituted arylamine group, a substituted or unsubstituted carbazole group, a substituted or unsubstituted acridine group, or a substituted or unsubstituted phenoxazine group. In an embodiment, $D_1$ may be a substituted or unsubstituted indolophenoxazine group, and $D_2$ may be a substituted or unsubstituted arylamine group, a substituted or unsubstituted carbazole group, a substituted or unsubstituted acridine group, or a substituted or unsubstituted phenoxazine group.

The polycyclic compound of an embodiment may be selected from the compounds represented in Compound Group 1 and Compound Group 2. The organic electroluminescence device 10 of an embodiment may include at least one polycyclic compound selected from Compound Group 1 in the emission layer EML.

Compound Group 1

1

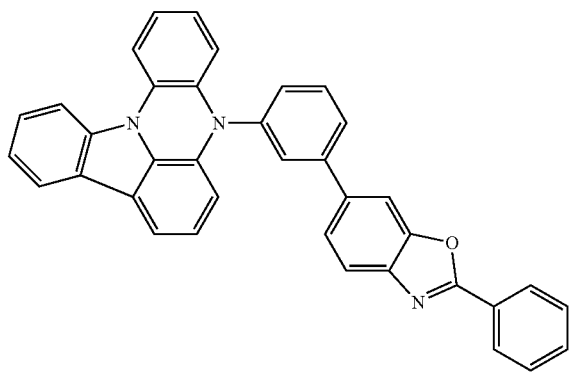

2

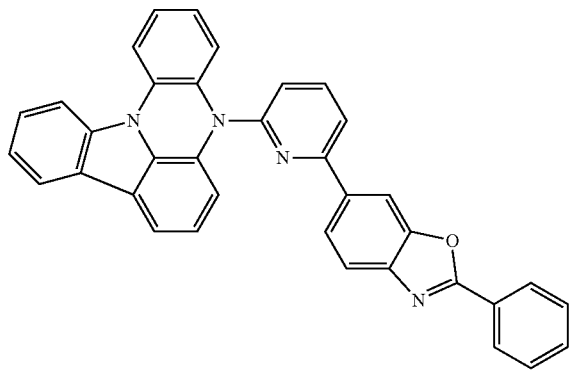

3

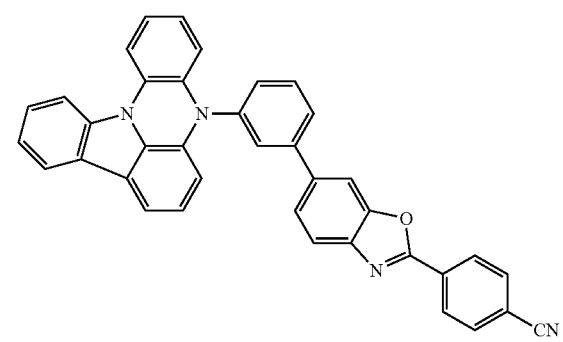

4

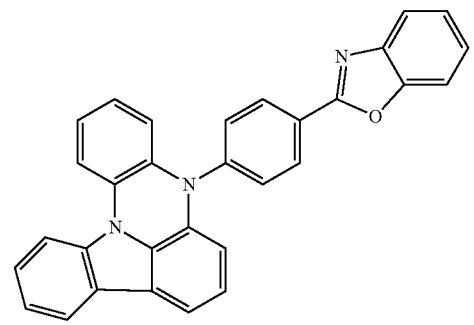

5

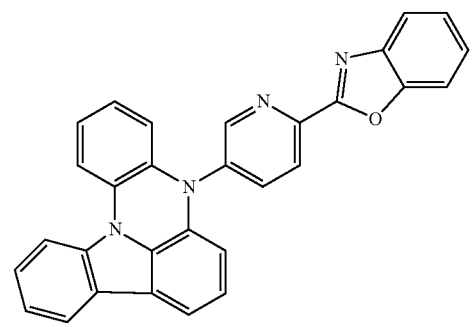

-continued
6
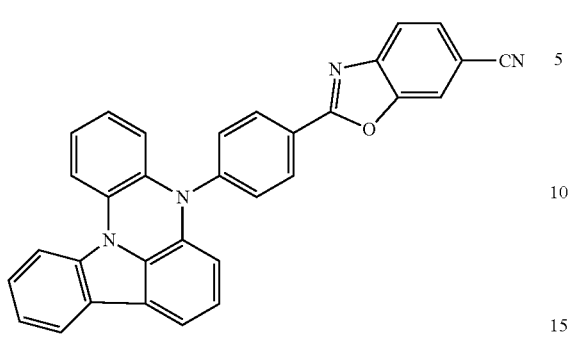
10
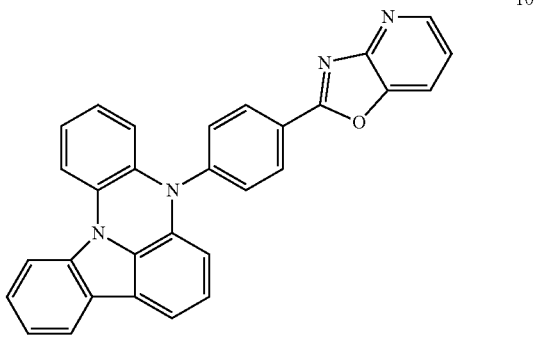
7
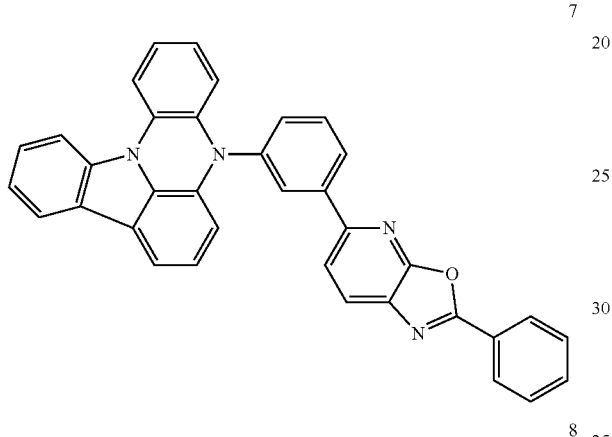
11
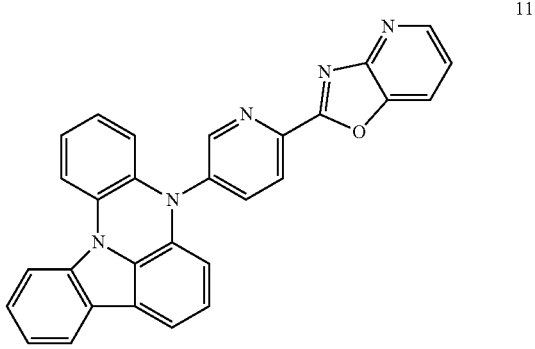
8
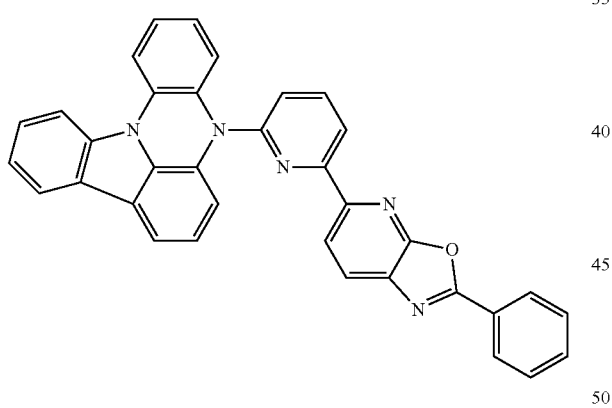
12
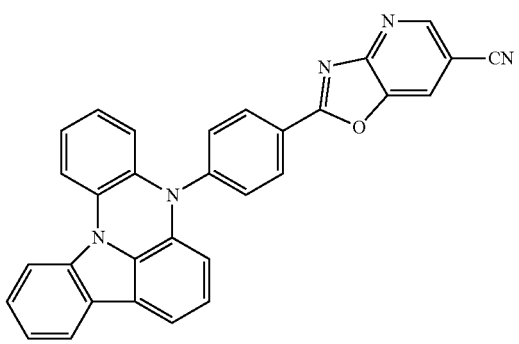
9
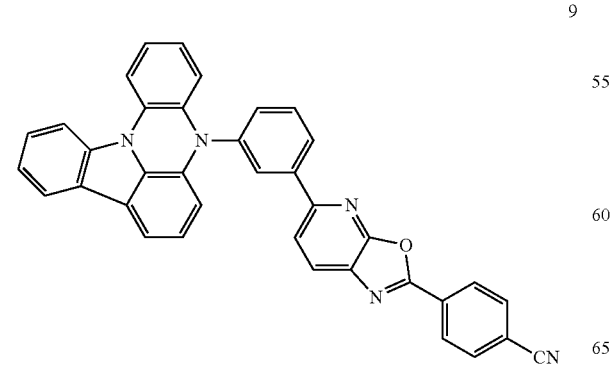
13
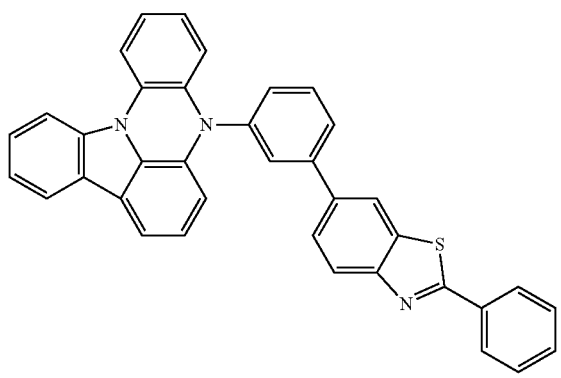

14
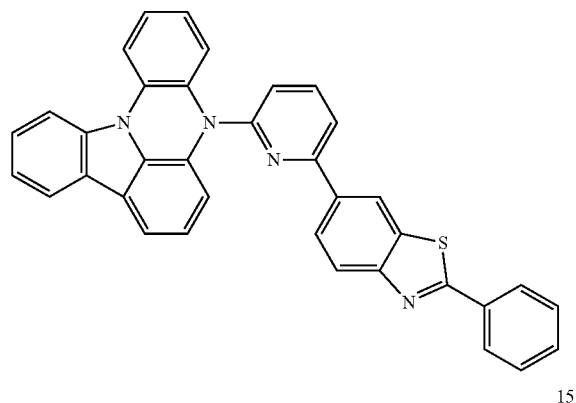
15
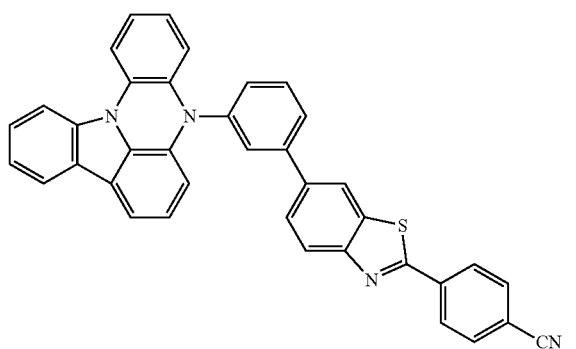
16
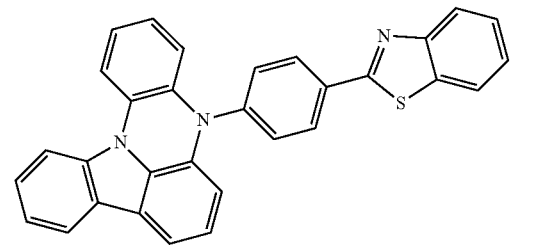
17
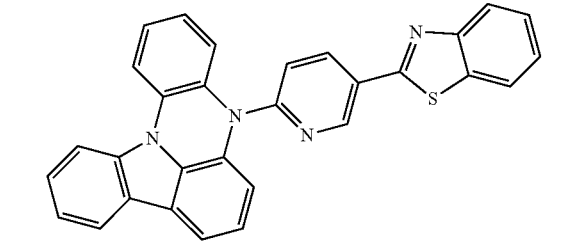
18
19
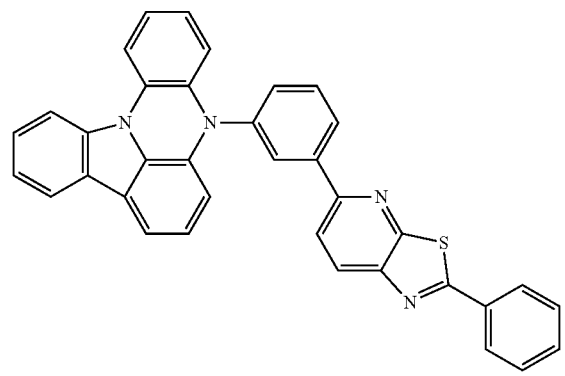
20
21
22
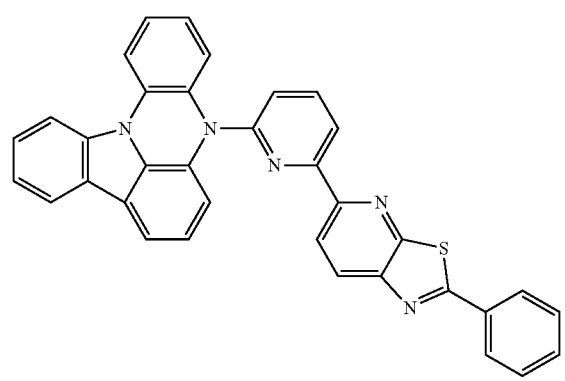

23
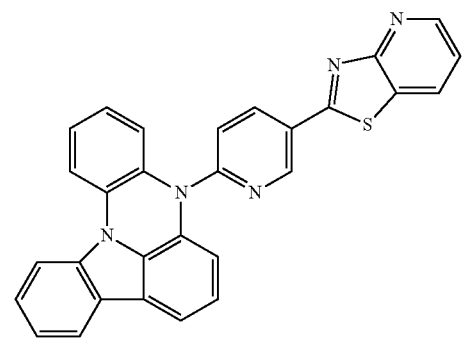
24
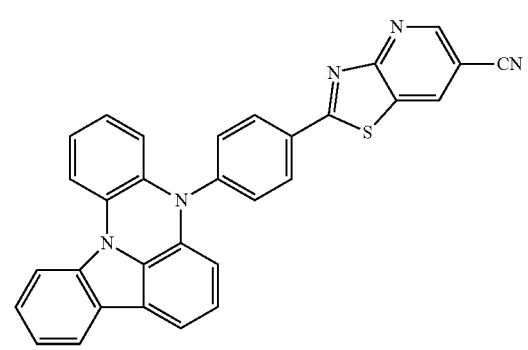
25
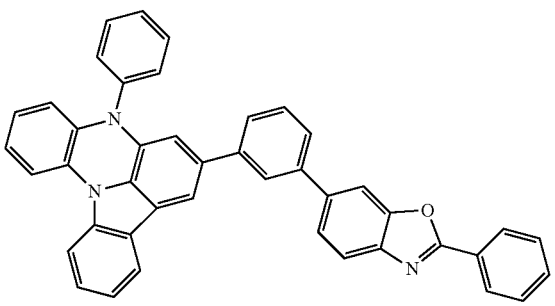
26
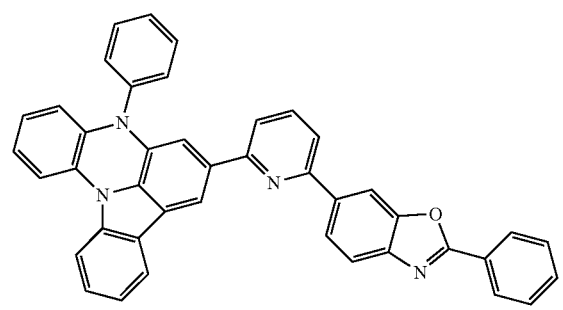
27
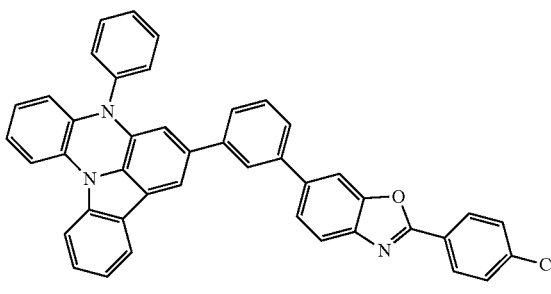
28
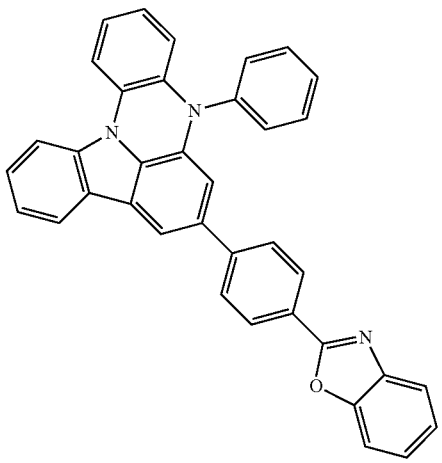
29
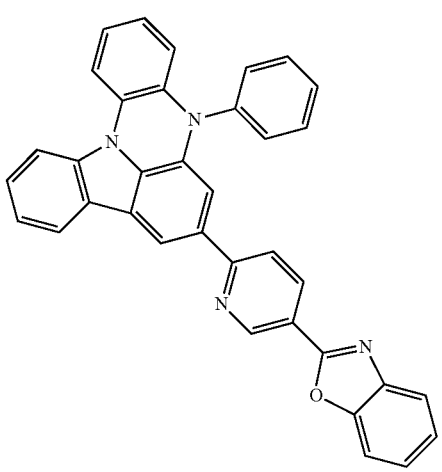
30
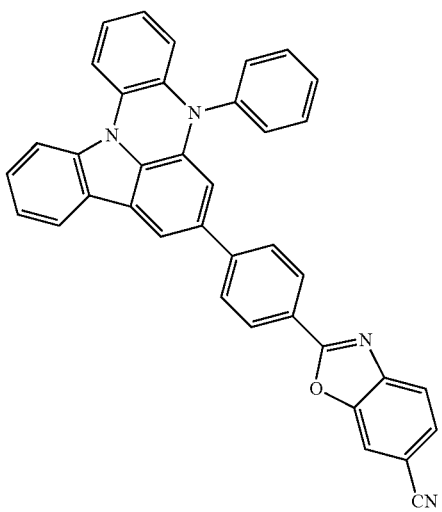

31
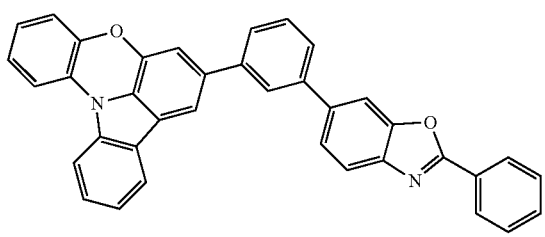
32
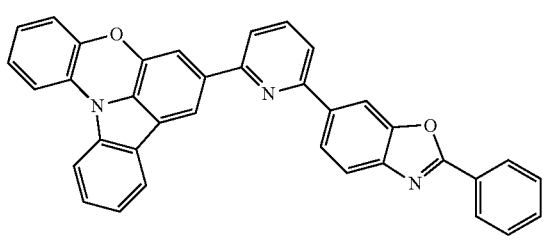
33
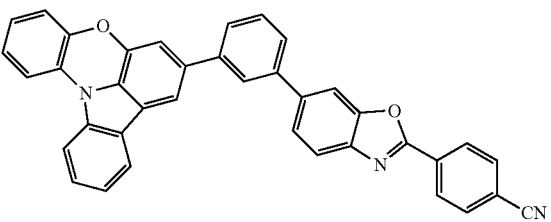
34
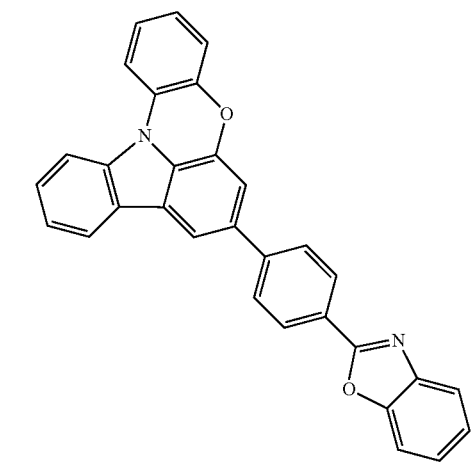
35
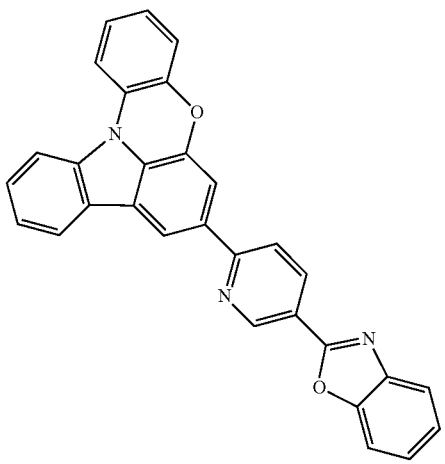
36
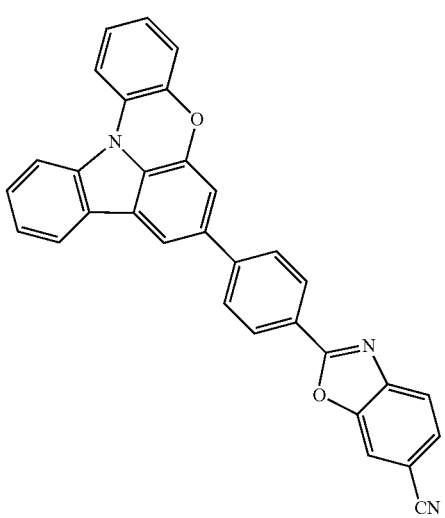
37
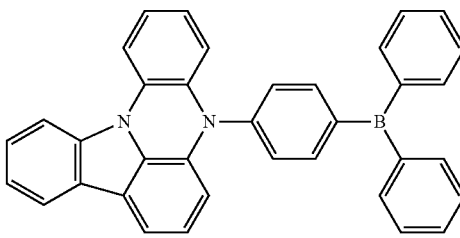
38
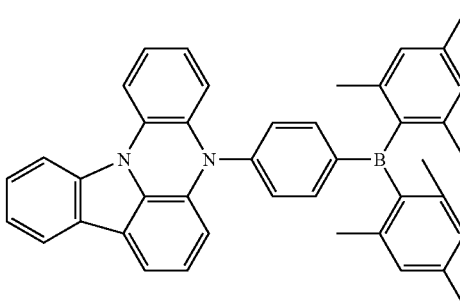

-continued
39
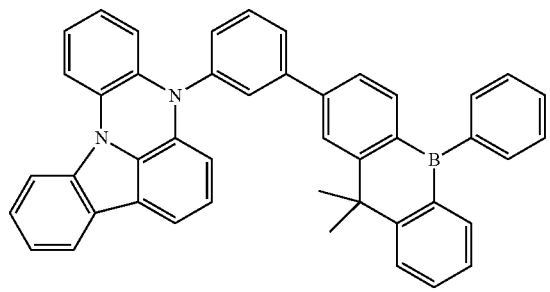
40
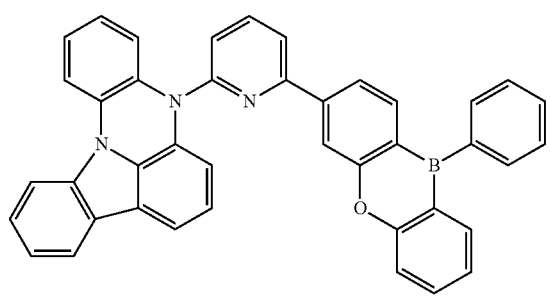
41
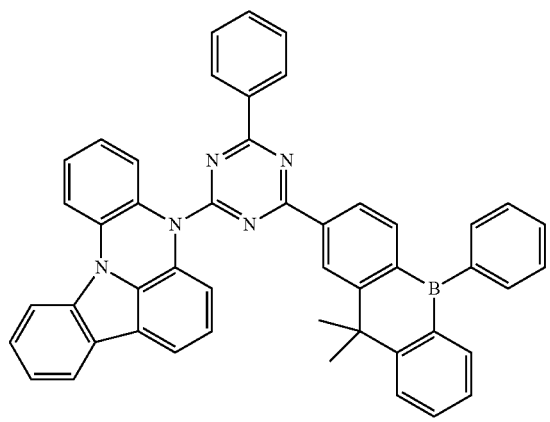
42
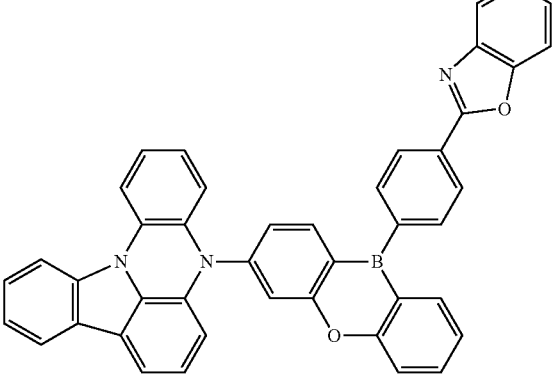
-continued
43
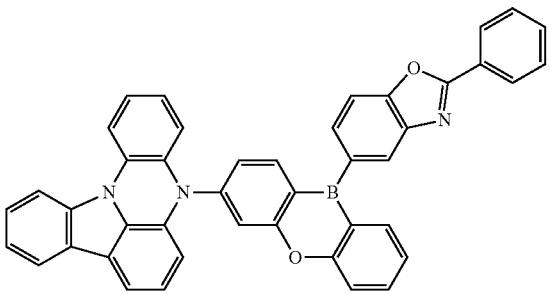
44
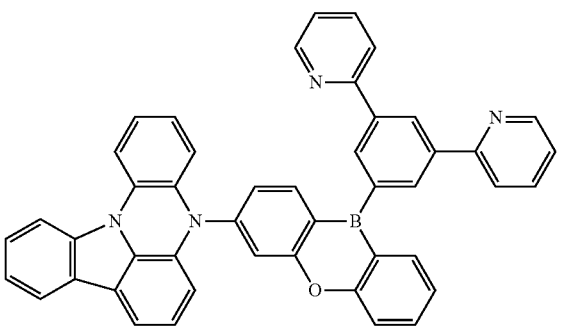
45
46
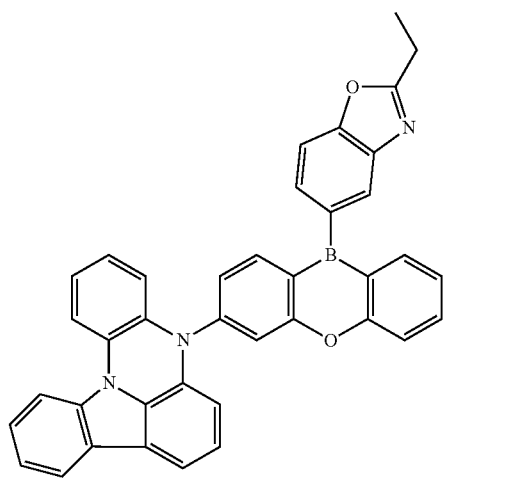

47
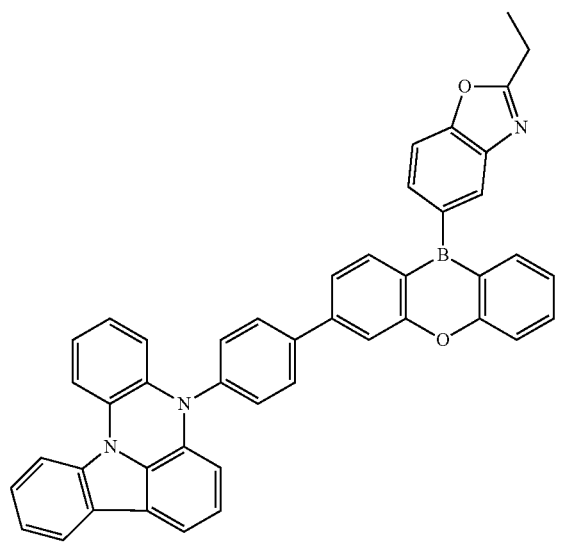
48
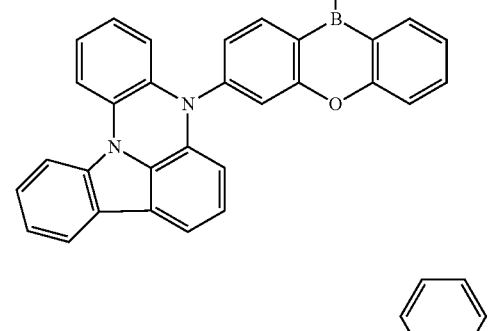
49
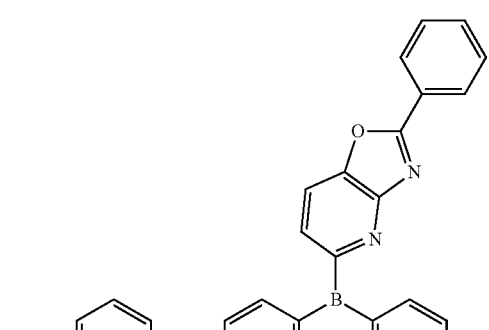
50
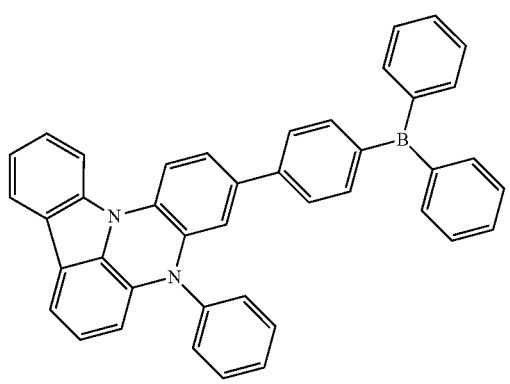
51
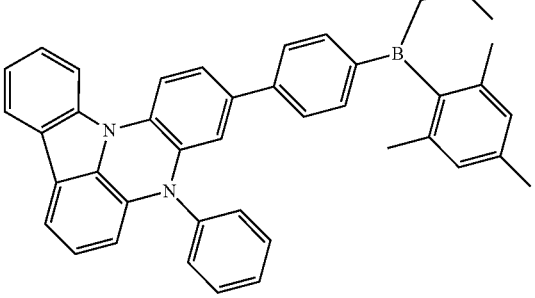
52
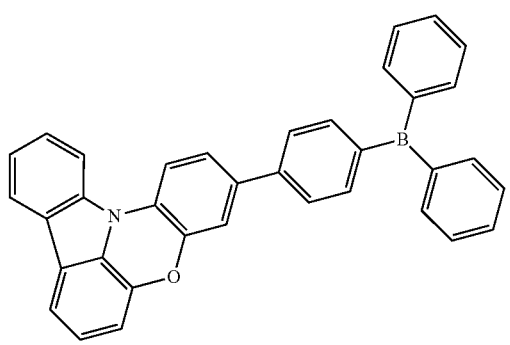
53
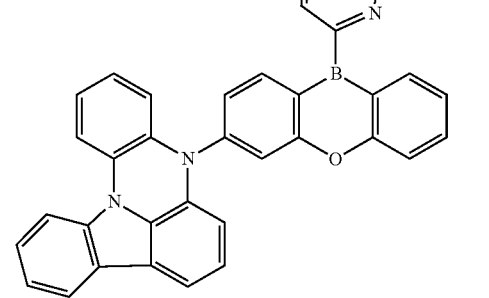

54
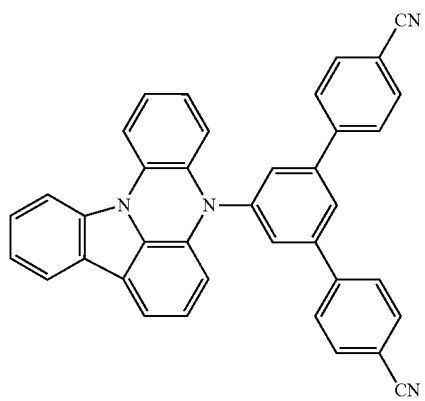
55
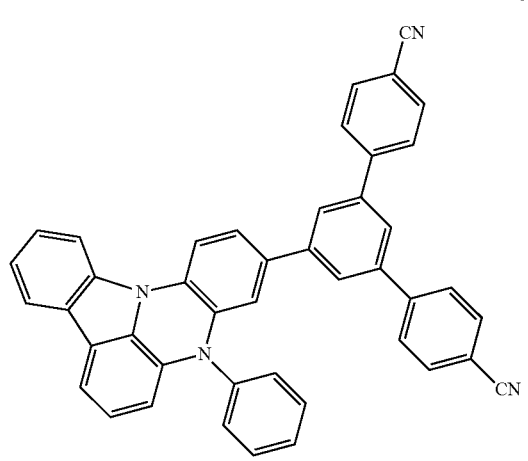
56
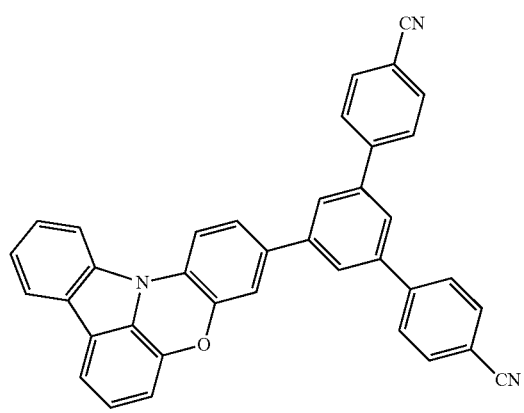
57
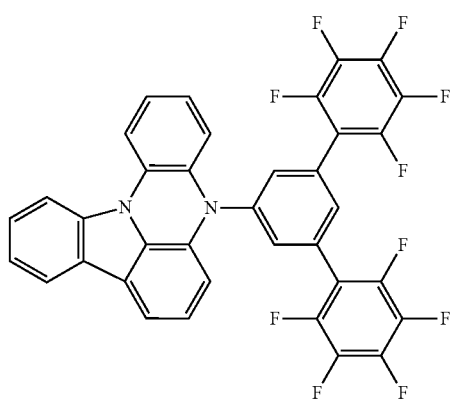
58
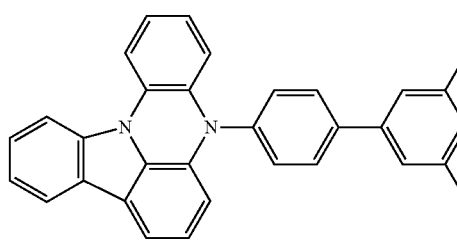
Compound Group 2
59
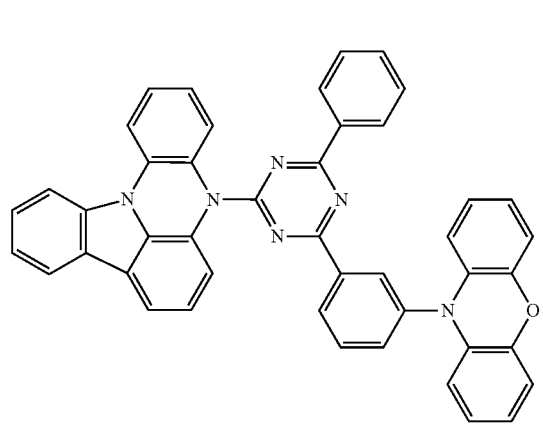
60
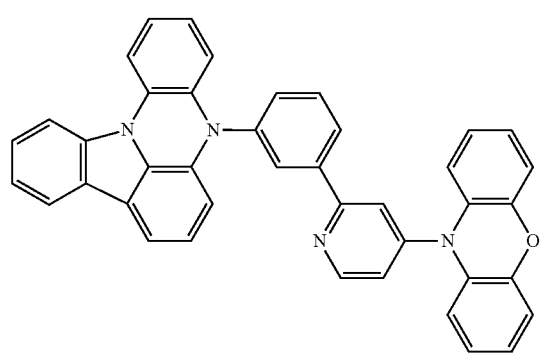

-continued
61
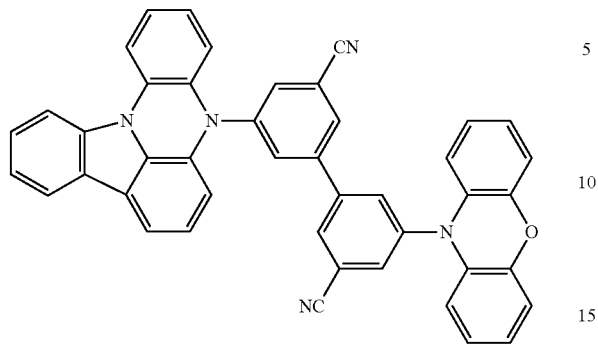
62
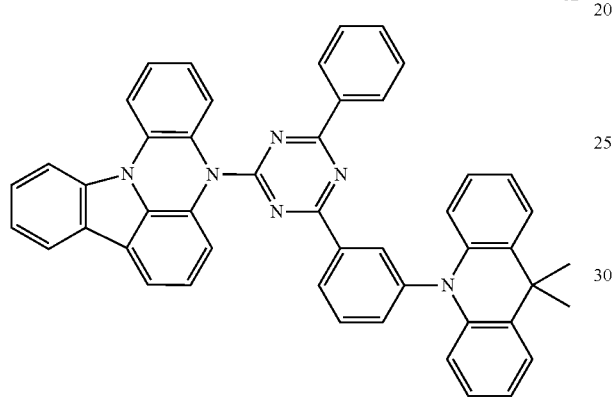
63
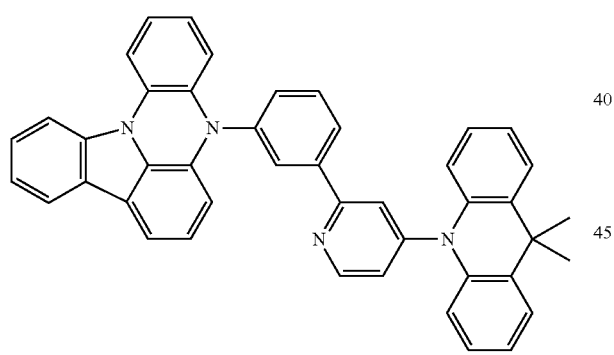
64
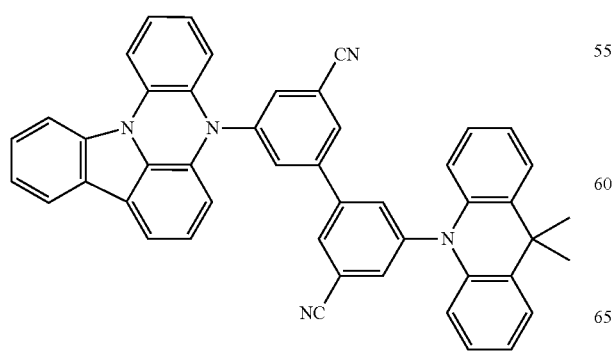
-continued
65
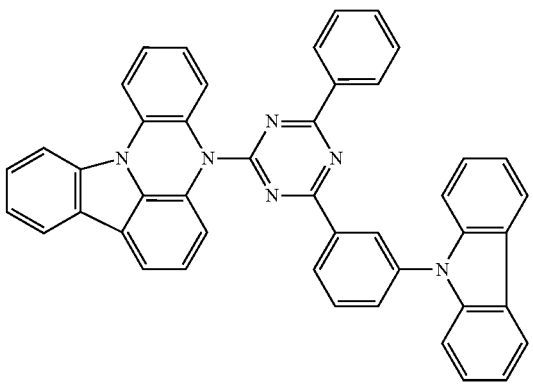
66
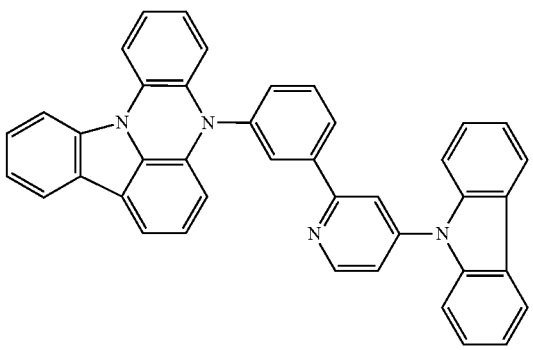
67
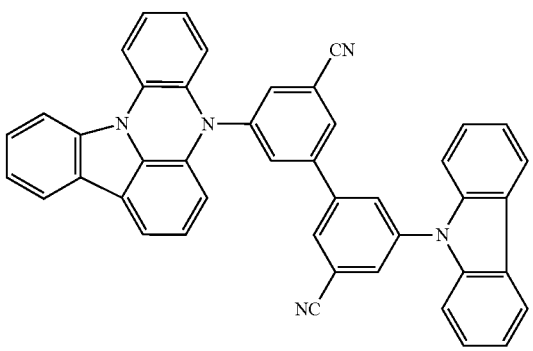
68
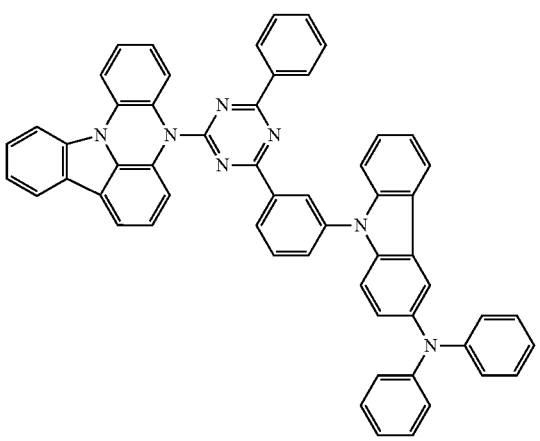

69
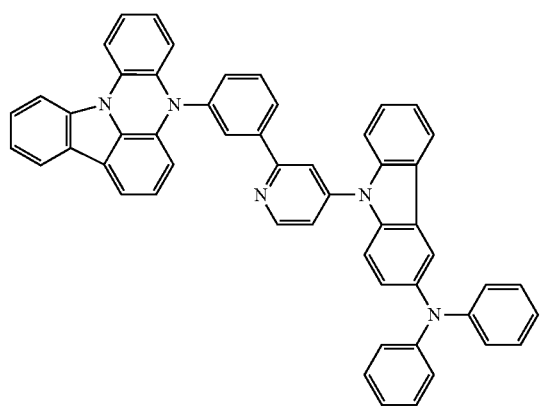
70
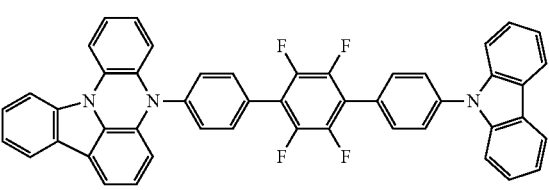
71
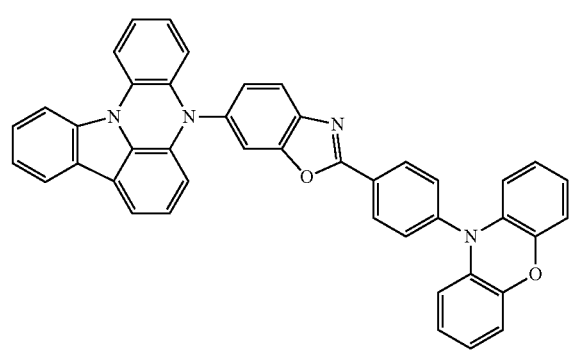
72
73
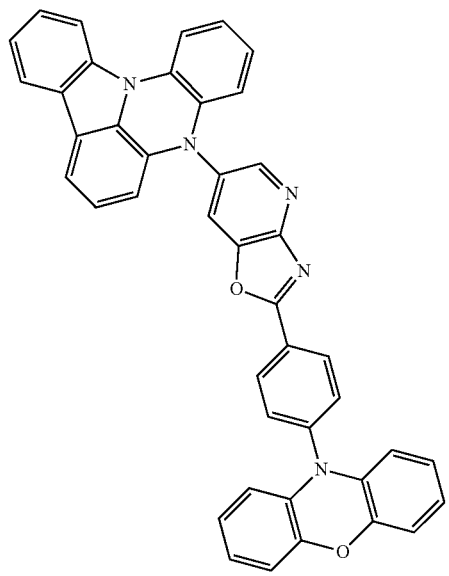
74
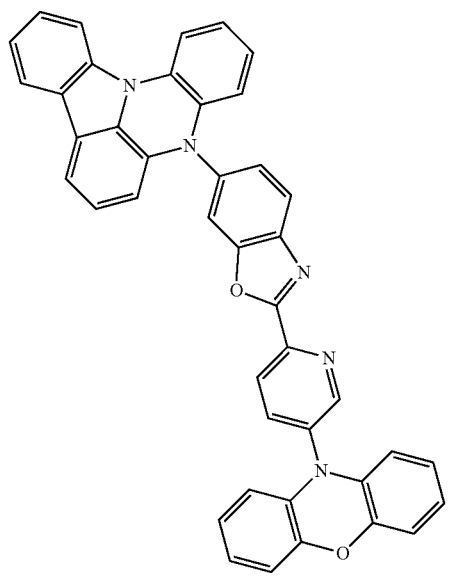

75
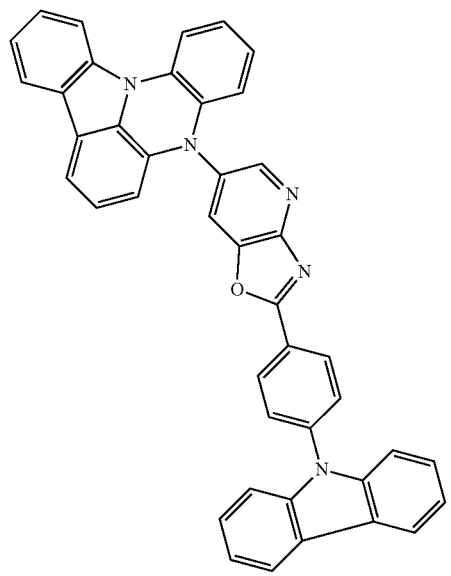
77
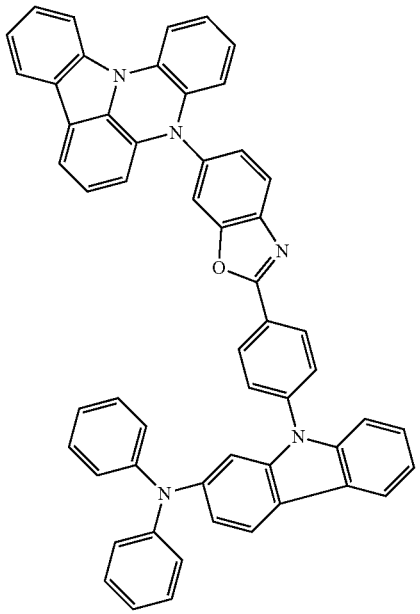
76
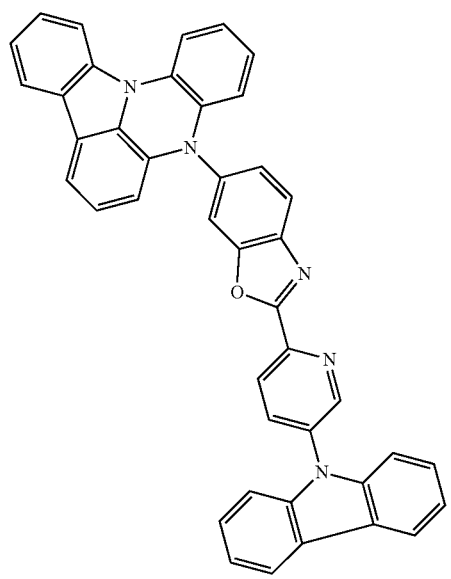
78
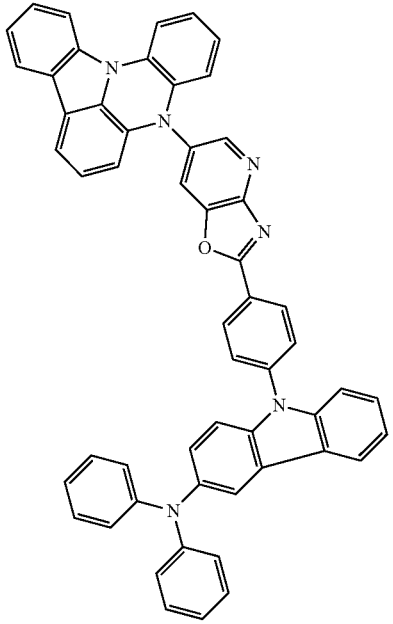

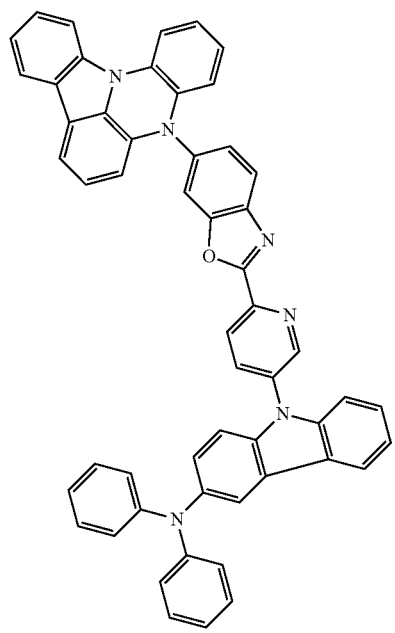
79
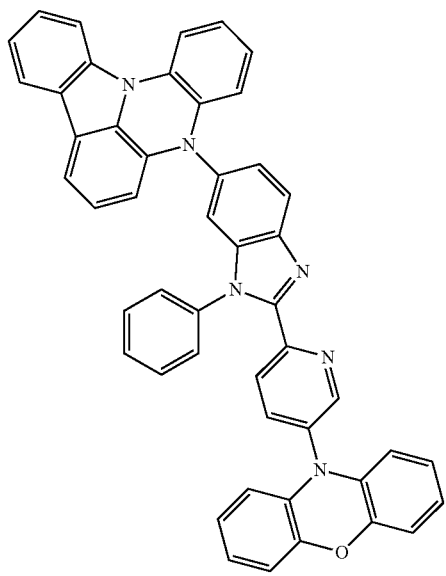
81
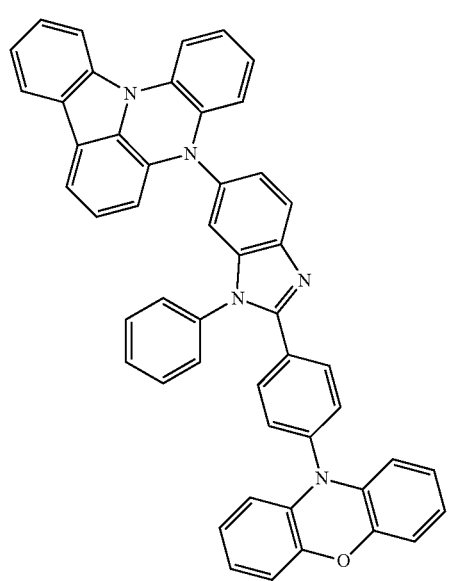
80
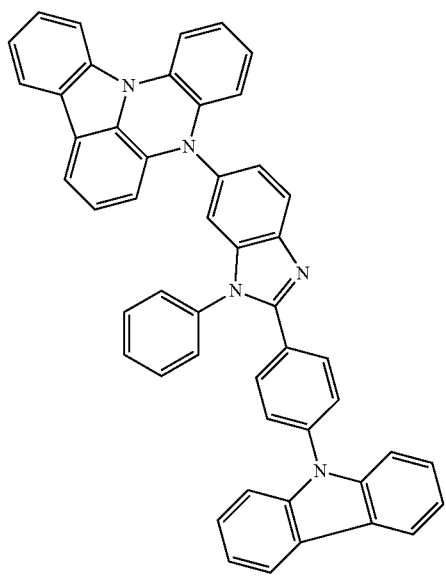
82

41
83
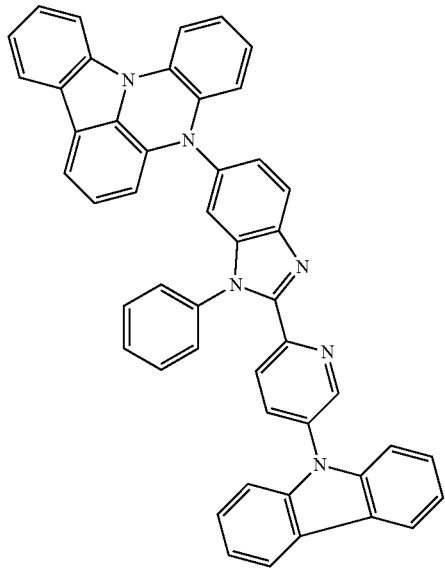
84
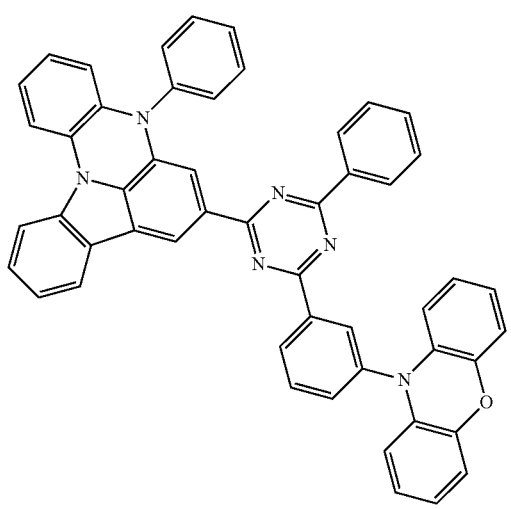
85
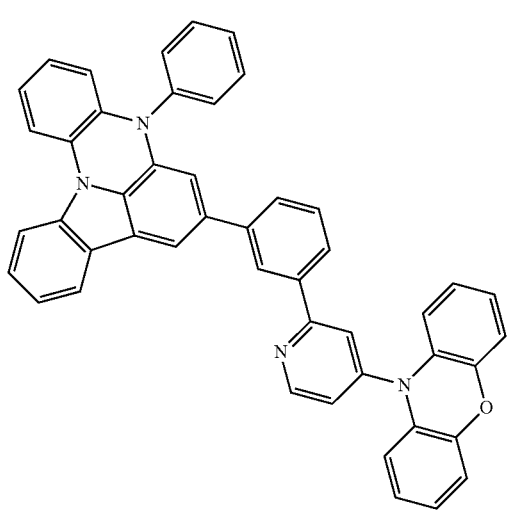
42
86
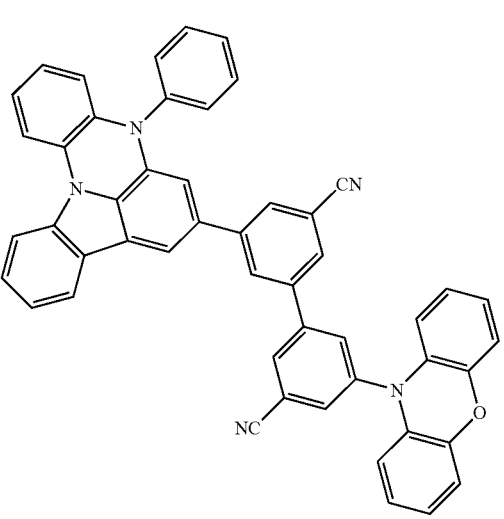
87
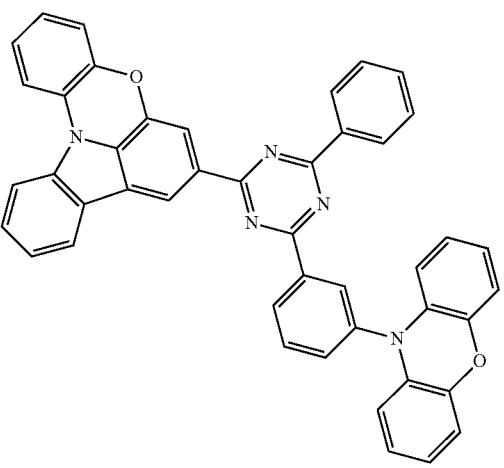
88
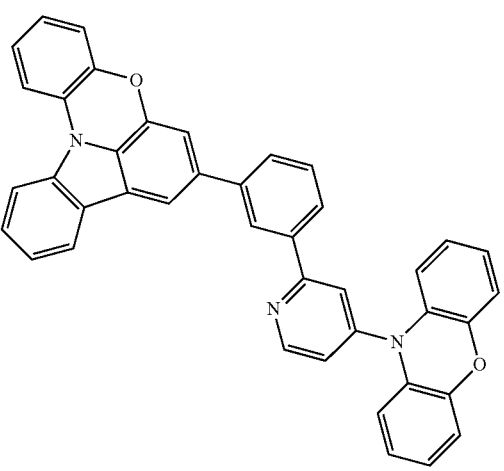

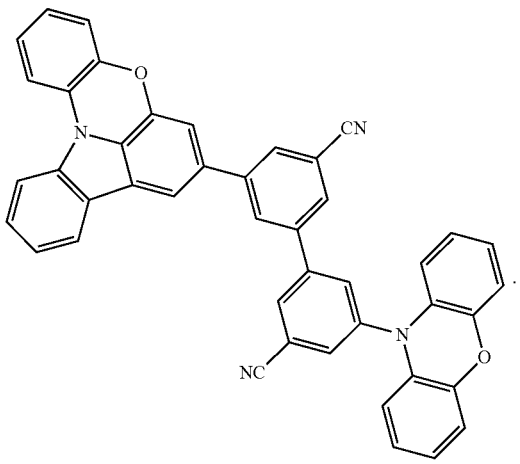

89

The polycyclic compound represented by Formula 1 according to embodiments of the present disclosure may be a material to emit thermally activated delayed fluorescence. In addition, the polycyclic compound represented by Formula 1 may be a thermally activated delayed fluorescence (TADF) dopant having a triple-singlet energy difference ($\Delta E_{ST}$) between the lowest triplet excitation energy level (T1 level) and the lowest singlet excitation energy level (S1 level) of about 0.2 eV or less. For example, the $\Delta E_{ST}$ of the polycyclic compound represented by Formula 1 may be about 0.10 eV or less.

In the organic electroluminescence device 10 of an embodiment, the emission layer EML may be to emit delayed fluorescence. For example, the emission layer EML may be to emit thermally activated delayed fluorescence (TADF).

The compound of an embodiment represented by Formula 1 may be a donor (D)-acceptor (A) type (e.g., structure) delayed fluorescence dopant material having a donor and an acceptor bonded within the same compound. In the compound of an embodiment represented by Formula 1, an indolophenazine or indolophenoxazine moiety may correspond to an electron donor, and a substituent represented by "A" may correspond to an electron acceptor. For example, the compound of an embodiment represented by Formula 1 may be a D-A type (structure) thermally activated delayed fluorescence dopant.

In some embodiments, the compound of an embodiment represented by Formula 1 may be further represented by Formula 3 and may be a D(donor)-A(acceptor)D-(donor) type delayed fluorescence dopant material. In the compound of an embodiment represented by Formula 3, the substituent parts represented by $D_1$ and $D_2$ may correspond to electron donors, and the substituent part represented by "A" may correspond to an electron acceptor.

The emission layer EML of the organic electroluminescence device 10 may be to emit red light or green light. However, an embodiment of the present disclosure is not limited thereto, and in some embodiments the emission layer EML may be to emit blue light.

The compound of an embodiment has a novel compound structure including an indolophenazine or indolophenoxazine moiety as an electron donor and may be a material to emit thermally activated delayed fluorescence, and may be used as a material in an emission layer of an organic electroluminescence device to improve emission efficiency. The compound according to an embodiment is used as a light-emitting material to emit light in a green or red wavelength region, and may show excellent emission efficiency.

In some embodiments, the organic electroluminescence device 10 of an embodiment may include a plurality of emission layers. The plurality of emission layers may be stacked in order in the device, and for example, the organic electroluminescence device 10 including the plurality of emission layers may be to emit white light. In some embodiments, the organic electroluminescence device including the plurality of emission layers may be an organic electroluminescence device having a tandem structure. When the organic electroluminescence device 10 includes a plurality of emission layers, at least one emission layer EML may include the above-described polycyclic compound of an embodiment.

In an embodiment, the emission layer EML may include a host in combination with the above-described polycyclic compound as the dopant. For example, in the organic electroluminescence device 10 of an embodiment, the emission layer EML may include a host to emit delayed fluorescence and a dopant to emit delayed fluorescence, and may include the above-described polycyclic compound as the dopant to emit delayed fluorescence. The emission layer EML may include the polycyclic compound represented in the above-described Compound Group 1 as a thermally activated delayed fluorescence dopant.

In an embodiment, the emission layer EML is a delayed fluorescence emission layer, and the emission layer EML may include any suitable host material and the above-described polycyclic compound. For example, in an embodiment, the polycyclic compound may be used as a TADF dopant.

As the host material of the emission layer EML, any suitable material may be used and may be selected from fluoranthene derivatives, pyrene derivatives, arylacetylene derivatives, anthracene derivatives, fluorene derivatives, perylene derivatives, chrysene derivatives, etc., without specific limitation. In some embodiments, pyrene derivatives, perylene derivatives, and anthracene derivatives may be used. In some embodiments, for example, an anthracene derivative represented by Formula 4 may be used as the host material in the emission layer EML.

Formula 4

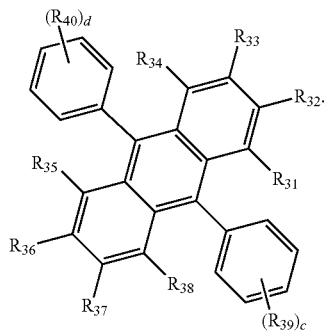

In Formula 4, $R_{31}$ to $R_{40}$ may each independently be a hydrogen atom, a deuterium atom, a halogen atom, a substituted or unsubstituted silyl group, a substituted or unsubstituted alkyl group of 1 to 10 carbon atoms, a substituted or unsubstituted aryl group of 6 to 30 carbon atoms for forming a ring, or a substituted or unsubstituted heteroaryl group of 2 to 30 carbon atoms for forming a ring, or may be combined with an adjacent group to form a ring. In some embodiments, $R_{31}$ to $R_{40}$ may be combined with an adjacent group to form a saturated hydrocarbon ring or an unsaturated hydrocarbon ring.

In Formula 4, "c" and "d" may each independently be an integer of 0 to 5.

Formula 4 may be represented by one selected from Formula 3-1 to Formula 3-16:

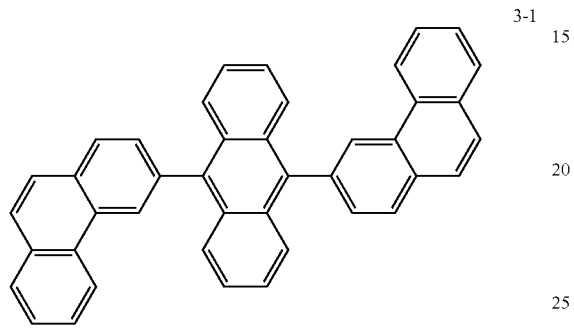

3-1

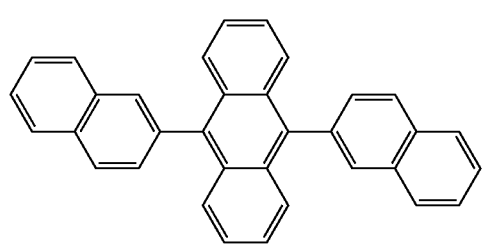

3-2

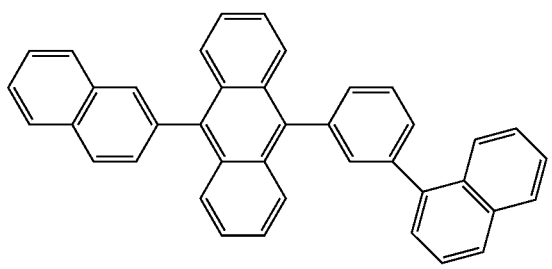

3-3

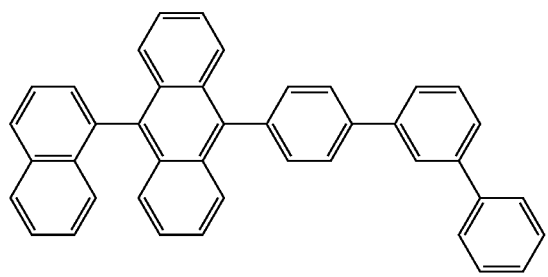

3-4

-continued

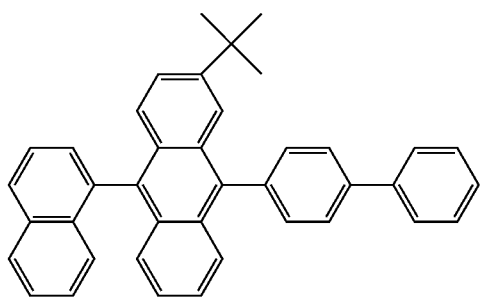

3-5

3-6

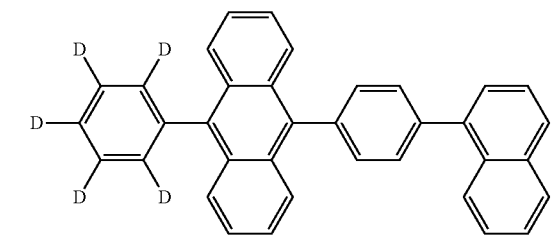

3-7

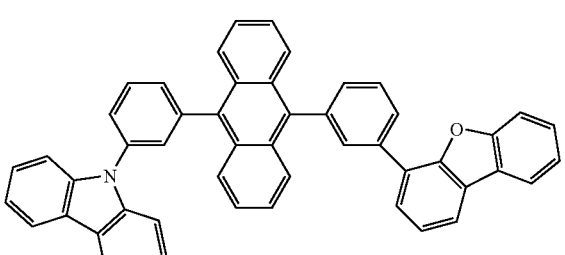

3-8

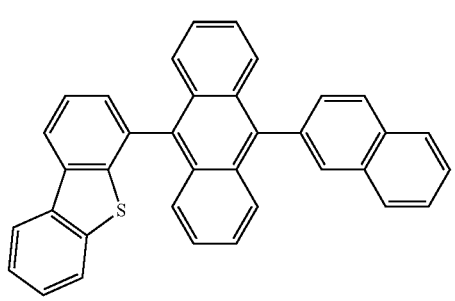

3-9

-continued 3-10
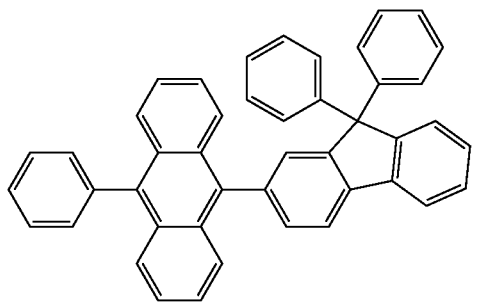

3-11
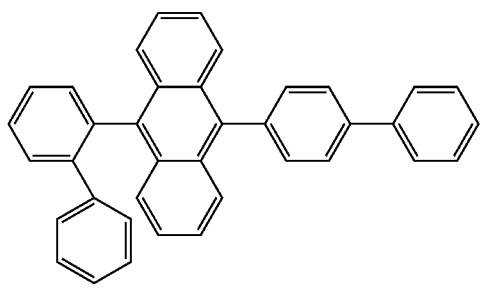

3-12
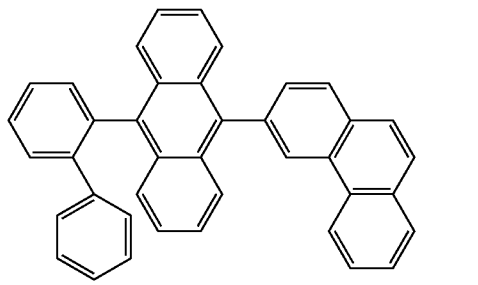

3-13
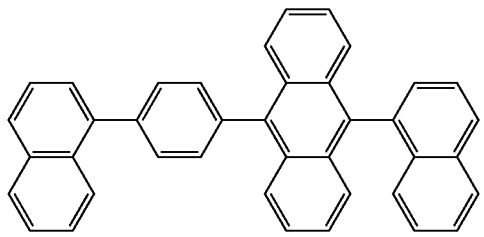

3-14
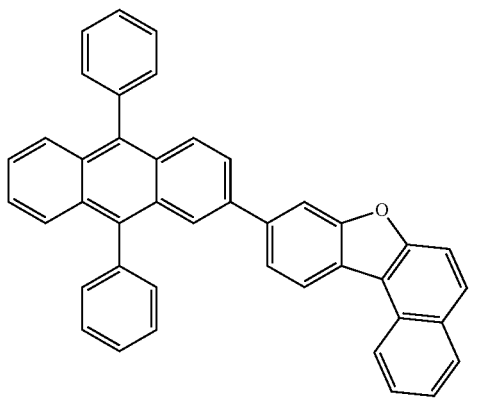

3-15
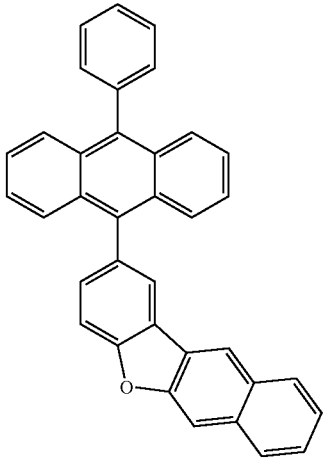

3-16
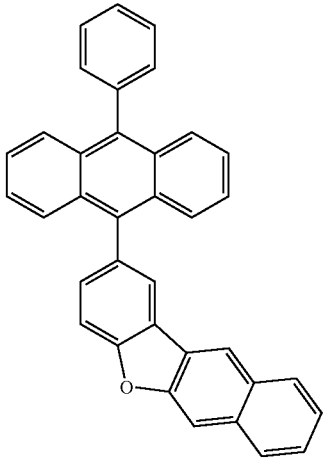

In an embodiment, the emission layer EML may include as a host material, tris(8-hydroxyquinolino)aluminum (Alq3), 4,4'-bis(N-carbazolyl)-1,1'-biphenyl (CBP), poly(N-vinylcarbazole) (PVK), 9,10-di(naphthalene-2-yl)anthracene (ADN), 4,4',4"-tris(carbazol-9-yl)-triphenylamine (TCTA), 1,3,5-tris(N-phenylbenzimidazole-2-yl)benzene (TPBi), 3-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), bis[2-(diphenylphosphino)phenyl]ether oxide (DPEPO), hexaphenyl cyclotriphosphazene (CP1), 1,4-bis(triphenylsilyl)benzene (UGH2), hexaphenylcyclotrisiloxane (DPSiO$_3$), octaphenylcyclotetrasiloxane (DPSiO$_4$), 2,8-bis(diphenylphosphoryl)dibenzofuran (PPF), 3,3'-bis(N-carbazolyl)-1,1'-biphenyl (mCBP), 1,3-bis(N-carbazolyl)benzene (mCP), etc. However, an embodiment of the present disclosure is not limited thereto. Any suitable host materials to emit delayed fluorescence other than the above host materials may be included.

However, an embodiment of the present disclosure is not limited thereto, and in some embodiments, the compound of an embodiment may be used as the host material of the emission layer EML. When the compound of an embodiment is used as the host material, any suitable dopant material may be used in addition to the compound of an embodiment in the emission layer EML.

In the organic electroluminescence device 10 of an embodiment, the emission layer EML may further include any suitable dopant material. In an embodiment, the emission layer EML may include as a dopant, styryl derivatives (for example, 1,4-bis[2-(3-N-ethylcarbazolyl)vinyl]benzene (BCzVB), 4-(di-p-tolylamino)-4'-[(di-p-tolylamino)styryl]stilbene (DPAVB), and N-(4-((E)-2-(6-((E)-4-(diphenylamino)styryl)naphthalen-2-yl)vinyl)phenyl)-N-phenylbenzenamine (N-BDAVBi)), perylene and derivatives thereof (for example, 2,5,8,11-tetra-t-butylperylene (TBP)), pyrene and derivatives thereof (for example, 1,1-dipyrene, 1,4-dipyrenylbenzene, 1,4-bis(N,N-diphenylamino)pyrene), etc.

In some embodiments, the emission layer EML may include two dopant materials having different lowest triplet excitation energy levels (T1 levels) from each other. In the organic electroluminescence device 10 of an embodiment, the emission layer EML may include a host having a first lowest triplet excitation energy level, a first dopant having a second lowest triplet excitation energy level that is lower than the first lowest triplet excitation energy level, and a second dopant having a third lowest triplet excitation energy level that is lower than the second lowest triplet excitation energy level. In an embodiment, the emission layer EML may include the above-described polycyclic compound as the first dopant.

In the organic electroluminescence device 10 of an embodiment, which may include the host, the first dopant and the second dopant in the emission layer EML, the first dopant may be a delayed fluorescence dopant, and the second dopant may be a fluorescence (e.g., fluorescent) dopant. In addition, in the organic electroluminescence device 10 of an embodiment, the polycyclic compound represented by Formula 1 may play the role of an assistant dopant.

For example, when the emission layer EML of the organic electroluminescence device 10 of an embodiment includes a plurality of dopants, the emission layer EML may include the polycyclic compound of an embodiment as the first dopant and any suitable dopant material (examples of which are described above) as the second dopant. For example, in the case where the emission layer EML is to emit blue light, the emission layer EML may further include, as the second dopant, one selected from the group consisting of spiro-DPVBi, spiro-6P, distyryl-benzene (DSB), distyryl-arylene (DSA), a polyfluorene (PFO)-based polymer, and a poly(p-phenylene vinylene) (PPV)-based polymer. As another example, the second dopant may be a metal complex or an organometallic complex (such as $(4,6-F_2ppy)_2Irpic$, perylene the derivatives thereof, etc.).

In some embodiments, in the organic electroluminescence device 10 including the polycyclic compound of an embodiment as the first dopant of the emission layer EML, the emission layer EML may be to emit green light or red light, and in this case, the second dopant material may be any suitable dopant as described above, any suitable green fluorescence dopant, or any suitable red fluorescence dopant.

In the organic electroluminescence device 10 of an embodiment, the emission layer EML may be a phosphorescence (e.g., phosphorescent) emission layer. For example, the polycyclic compound according to an embodiment may be included in the emission layer EML as a phosphorescence host material.

In the organic electroluminescence device 10 of an embodiment, as shown in FIGS. 1 to 4, the electron transport region ETR is provided on the emission layer EML. The electron transport region ETR may include at least one of a hole blocking layer HBL, an electron transport layer ETL, or an electron injection layer EIL. However, an embodiment of the present disclosure is not limited thereto.

The electron transport region ETR may have or be a single layer formed using a single material, a single layer formed using a plurality of different materials, or a multilayer structure having a plurality of layers formed using a plurality of different materials.

For example, the electron transport region ETR may have a single layer structure of an electron injection layer EIL or an electron transport layer ETL, or a single layer structure formed using an electron injection material and an electron transport material (e.g., together). In some embodiments, the electron transport region ETR may have a single layer structure formed using a plurality of different materials, or a structure stacked from the emission layer EML of electron transport layer ETL/electron injection layer EIL, or hole blocking layer HBL/electron transport layer ETL/electron injection layer EIL, without limitation. The thickness of the electron transport region ETR may be, for example, about 100 Å to about 1,500 Å.

The electron transport region ETR may be formed using any suitable method (such as a vacuum deposition method, a spin coating method, a cast method, a Langmuir-Blodgett (LB) method, an inkjet printing method, a laser printing method, and/or a laser induced thermal imaging (LITI) method).

When the electron transport region ETR includes an electron transport layer ETL, the electron transport region ETR may include an anthracene-based compound. Embodiments of the present disclosure are not limited thereto, and the electron transport region ETR may include, for example, tris(8-hydroxyquinolinato)aluminum (Alq3), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzimidazolyl-1-ylphenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato) aluminum (BAlq), beryllium bis(benzoquinolin-10-olate (Bebq2), 9,10-di(naphthalene-2-yl)anthracene (ADN), diphenyl(4-(triphenylsilyl)phenyl)phosphine oxide (TSPO1), or a mixture thereof. The thickness of the electron transport layer ETL may be about 100 Å to about 1,000 Å and may be, for example, about 150 Å to about 500 Å. When the thickness of the electron transport layer ETL satisfies the above-described range, satisfactory electron transport properties may be obtained without a substantial increase in driving voltage.

When the electron transport region ETR includes the electron injection layer EIL, the electron transport region ETR may include a metal halide (such as LiF, NaCl, CsF, RbCl, RbI, and/or CuI), a lanthanide metal (such as ytterbium (Yb), a metal oxide (such as $Li_2O$ and/or BaO), and/or lithium quinolate (LiQ). However, an embodiment of the present disclosure is not limited thereto. In some embodiments, the electron injection layer EIL may be formed using a mixture of an electron transport material and an insulating organo metal salt. The organo metal salt may be a material having an energy band gap of about 4 eV or more. The organo metal salt may include, for example, metal acetates, metal benzoates, metal acetoacetates, metal acetylacetonates, and/or metal stearates. The thickness of the electron injection layer EIL may be about 1 Å to about 500 Å, or about 3 Å to about 300 Å. When the thickness of the electron injection layer EIL satisfies the above described range, satisfactory electron injection properties may be obtained without inducing substantial increase of a driving voltage.

The electron transport region ETR may include a hole blocking layer HBL as described above. The hole blocking layer HBL may include, for example, at least one of 2,9- dimethyl-4,7-diphenyl-1,10-phenanthroline (BCP), or 4,7-diphenyl-1,10-phenanthroline (Bphen). However, an embodiment of the present disclosure is not limited thereto.

The second electrode EL2 is provided on the electron transport region ETR. The second electrode EL2 may be a common electrode or a cathode. The second electrode EL2 may be a transmissive electrode, a transflective electrode, or a reflective electrode. When the second electrode EL2 is a transmissive electrode, the second electrode EL2 may be formed using a transparent metal oxide, for example, ITO, IZO, ZnO, ITZO, etc.

When the second electrode EL2 is the transflective electrode or a reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, a compound thereof, and/or a mixture thereof (for example, a mixture of Ag and Mg). In some embodiments, the second electrode EL2 may have a multilayered structure including a reflective layer and/or a transflective layer formed using the above-described materials, and a transparent conductive layer formed using ITO, IZO, ZnO, ITZO, etc.

In some embodiments, the second electrode EL2 may be connected with an auxiliary electrode. When the second electrode EL2 is connected with the auxiliary electrode, the resistance of the second electrode EL2 may decrease.

In some embodiments, a capping layer CPL may be further disposed on the second electrode EL2 of the organic electroluminescence device 10 of an embodiment. The capping layer CPL may include, for example, α-NPD, NPB, TPD, m-MTDATA, Alq3, CuPc, N4,N4,N4',N4'-tetra(biphenyl-4-yl) biphenyl-4,4'-diamine (TPD15), 4,4',4''-tris(carbazol-9-yl)triphenylamine (TCTA), etc.

The organic electroluminescence device 10 according to an embodiment of the present disclosure includes the polycyclic compound of an embodiment in the emission layer EML between the first electrode EL1 and the second electrode EL2, and may thereby exhibit high emission efficiency properties. In some embodiments, the polycyclic compound according to an embodiment may be a thermally activated delayed fluorescence dopant, and the emission layer EML may include the polycyclic compound of an embodiment to emit thermally activated delayed fluorescence. Accordingly, high emission efficiency properties may be achieved.

In some embodiments, the polycyclic compound of an embodiment may be included in an organic layer other than the emission layer EML as a material for the organic electroluminescence device 10. For example, the organic electroluminescence device 10 according to an embodiment of the present disclosure may include the polycyclic compound in at least one organic layer disposed between the first electrode EL1 and the second electrode EL2, and/or in the capping layer CPL disposed on the second electrode EL2.

The polycyclic compound of an embodiment may have a smaller energy difference ($\Delta E_{ST}$) between the lowest triplet excitation energy level (T1 level) and the lowest singlet excitation energy level (S1 level) through a novel structure including an indolophenazine or indolophenoxazine moiety when compared with compounds in the related art. Accordingly, when the polycyclic compound of an embodiment is used as a material for an organic electroluminescence device, the efficiency of the organic electroluminescence device may be further improved.

Hereinafter, the fused polycyclic compound according to an embodiment and the organic electroluminescence device of an embodiment of the present disclosure will be explained in more detail with reference to embodiments and comparative embodiments. The following embodiments are only illustrations to assist the understanding of the present disclosure, and the scope of the present disclosure is not limited thereto.

Examples

1. Synthesis of Fused Polycyclic Compounds

The synthetic method of the polycyclic compounds according to example embodiments will be explained by referring to synthetic methods for Compound 4, Compound 5, Compound 6, Compound 10, Compound 11, Compound 38, Compound 72, and Compound 77. However, the synthetic methods of the polycyclic compounds explained below are only embodiments, and synthetic methods of the polycyclic compound according to an embodiment of the present disclosure are not limited thereto.

(1) Synthesis of Compound 4

Polycyclic Compound 4 according to an embodiment may be synthesized, for example, by Reaction 1:

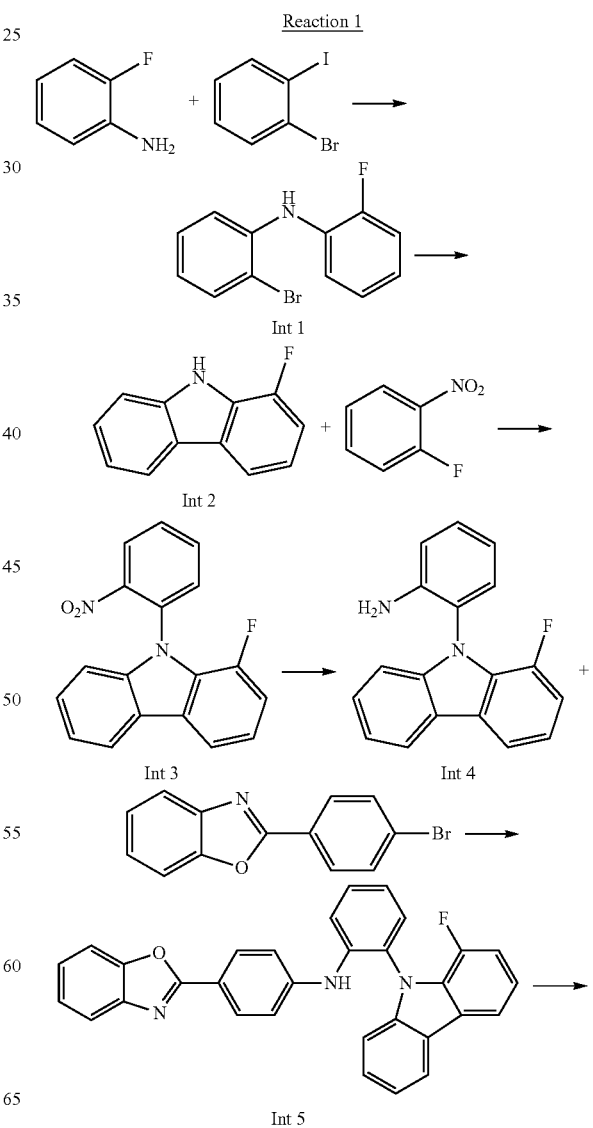

Reaction 1

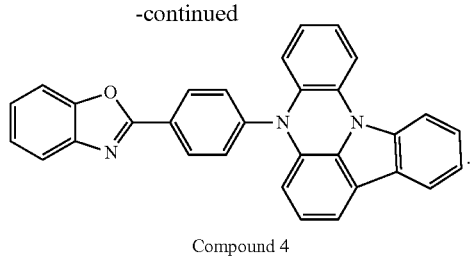

Compound 4

Synthesis of Intermediate (1)

40.0 g (360.0 mmol) of 2-fluoroaniline, 106.9 g (378.0 mmol) of 2-bromoiodobenzene and 1,200 mL of toluene were added to a one-neck, 2,000 mL flask. 6.2 g (10.8 mmol) of Pd(dba)$_2$, 69.2 g (719.9 mmol) of NaOtBu, and 11.97 g (21.6 mmol) of 1,1'-bis(diphenylphosphino)ferrocene (DPPF) were added thereto, followed by stirring at about 100° C. for about 3 hours. After finishing the reaction, the reaction product was cooled to room temperature and passed through a Celite pad using dichloromethane, and solvents were removed by distillation under reduced pressure. The resultant product was separated using SiO$_2$ column chromatography (dichloromethane (DCM):hexane=1:5) to obtain 81.7 g (yield: 85.3%) of an orange liquid compound (Intermediate (1)).

Synthesis of Intermediate (2)

81.7 g (307.02 mmol) of Intermediate (1) and 1,535 mL of dimethylacetamide (DMAc) were added to a two-neck, 3,000 mL flask. 6.9 g (30.7 mmol) of Pd(OAc)$_2$, 89.1 g (644.7 mmol) of K$_2$CO$_3$, and 22.6 g (61.4 mmol) of tricyclohexylphosphine tetrafluoroborate were added thereto, followed by stirring at about 150° C. for about 2 hours. After finishing the reaction, the reaction product was cooled to room temperature and passed through a Celite pad using dichloromethane, and solvents were removed by distillation under reduced pressure. The resultant product was separated using SiO$_2$ column chromatography (starting solvent DCM:hexane=1:5, with a gradual change to 100% DCM). The compound thus obtained was treated with a slurry process (e.g., rinsing and/or recrystallization) using dichloromethane and hexane to obtain 41.6 g (yield: 73.1%) of a pale pink solid compound (Intermediate (2)).

Synthesis of Intermediate (3)

25.0 g (135.0 mmol) of Intermediate (2), 22.9 g (162.0 mmol) of 2-fluoronitrobenzene, and 540 mL of dimethylformamide (DMF) were added to a one-neck, 2,000 mL flask, and 88.0 g (270.0 mmol) of Cs$_2$CO$_3$ was added thereto, followed by stirring at about 100° C. for one day. After finishing the reaction, the reaction product was cooled to room temperature and passed through a Celite pad using 500 mL of dichloromethane, and solvents were removed by distillation under reduced pressure. The resultant product was separated using SiO$_2$ column chromatography (DCM:hexane=1:2). The compound thus obtained was treated with a slurry process (e.g., rinsing and/or recrystallization) using dichloromethane and hexane to obtain 34.6 g (yield: 83.8%) of a yellow solid compound (Intermediate (3)).

Synthesis of Intermediate (4)

34.6 g (113.0 mmol) of Intermediate (3) and 565 mL of ethanol were added to a one-neck, 2,000 mL flask, and 75.0 g (395.4 mmol) of SnCl$_2$ was added thereto, followed by stirring at about 85° C. for about 30 minutes. After finishing the reaction, the reaction product was cooled to room temperature, 500 mL of an aqueous solution of 20% NaOH was added for basification, and ethyl acetate was added thereto, followed by stirring at room temperature for about one hour. An inorganic material precipitated and was removed by filtering through a Celite pad. The filtrate was extracted with ethyl acetate, and water therein was removed using anhydrous magnesium sulfate. The solvents were removed by distillation under reduced pressure. The resultant mixture was separated using SiO$_2$ column chromatography (DCM:hexane=1:1). A slurry process (e.g., rinsing and/or recrystallization) was performed for the compound thus obtained using dichloromethane and hexane to obtain 25.5 g (yield: 81.6%) of a pale orange solid compound (Intermediate (4)).

Synthesis of Intermediate (5)

2.0 g (7.2 mmol) of 2-(4-bromophenyl)benzo[d]oxazole, 2.0 g (7.2 mmol) of Intermediate (4), and 28 mL of xylene were added to a one-neck, 250 mL flask. 0.4 g (0.7 mmol) of Pd(dba)2, 7.1 g (21.7 mmol) of Cs$_2$CO$_3$, and 0.7 g (1.5 mmol) of [2-dicyclohexylphosphino-2',4',6'-triisopropylbiphenyl] (XPhos) were added thereto, followed by stirring at about 140° C. for about 4 hours. After finishing the reaction, the reaction product was cooled to room temperature, and 100 mL of distilled water was added thereto, followed by stirring at room temperature for about one hour. The solid thus precipitated was filtered under reduced pressure using distilled water and methanol to obtain a gray solid. The solid thus obtained was separated by SiO$_2$ column chromatography (ethyl acetate (EA):hexane=1:5). A slurry process (e.g., rinsing and/or recrystallization) was performed for the solid thus obtained using dichloromethane and methanol to obtain 1.7 g (yield: 50.8%) of an ivory solid compound (Intermediate (5)).

Synthesis of Compound 4

3.7 g (7.9 mmol) of Intermediate (5) and 78 mL of DMF were added to a one-neck, 250 mL flask, and the resultant mixture was stirred at room temperature. 1.3 g (11.8 mmol) of NaOtBu was added and the resultant mixture was stirred at about 100° C. for about 4 hours. After finishing the reaction, the reaction product was cooled to room temperature, and distilled water was added thereto, followed by stirring at room temperature for about one hour. The solid thus precipitated was filtered under reduced pressure using distilled water and methanol to obtain a yellow solid. The solid thus obtained was dissolved in 200 mL of dichloromethane and then separated by SiO$_2$ column chromatography (DCM:hexane=2:1). A slurry process (e.g., rinsing and/or recrystallization) was performed using dichloromethane and methanol to obtain 3.1 g (yield: 88.4%) of Compound 4 as a yellow solid. The molecular weight of Compound 4 measured by FAB-MS was 450. Through the results, the compound thus obtained was identified as Compound 4.

(2) Synthesis of Compound 5

Polycyclic Compound 5 according to an embodiment may be synthesized, for example, by Reaction 2:

Reaction 2

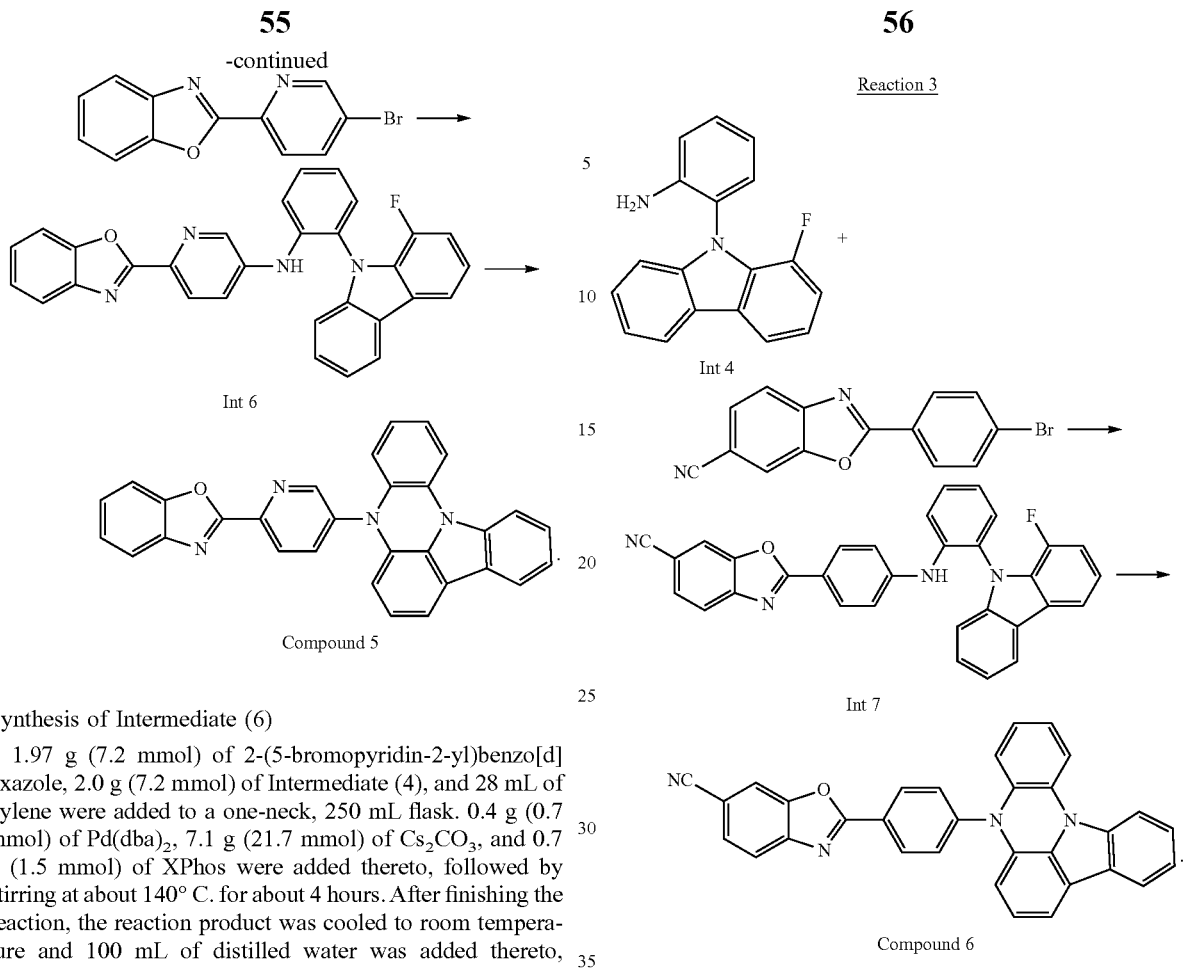

Synthesis of Intermediate (6)

1.97 g (7.2 mmol) of 2-(5-bromopyridin-2-yl)benzo[d]oxazole, 2.0 g (7.2 mmol) of Intermediate (4), and 28 mL of xylene were added to a one-neck, 250 mL flask. 0.4 g (0.7 mmol) of Pd(dba)$_2$, 7.1 g (21.7 mmol) of Cs$_2$CO$_3$, and 0.7 g (1.5 mmol) of XPhos were added thereto, followed by stirring at about 140° C. for about 4 hours. After finishing the reaction, the reaction product was cooled to room temperature and 100 mL of distilled water was added thereto, followed by stirring at room temperature for about one hour. The solid thus precipitated was filtered using distilled water and methanol to obtain a gray solid. The solid thus obtained was separated using SiO$_2$ column chromatography (EA:hexane=1:5). A slurry process (e.g., rinsing and/or recrystallization) was performed for the solid thus obtained using dichloromethane and methanol to obtain 1.52 g (yield: 45.5%) of an ivory solid compound (Intermediate (6)).

Synthesis of Compound 5

3.5 g (7.4 mmol) of Intermediate (6) and 78 mL of DMF were added to a one-neck, 250 mL flask, followed by stirring at room temperature. 1.3 g (11.8 mmol) of NaOtBu was added thereto and the resultant solution was stirred at about 100° C. for about 4 hours. After finishing the reaction, the reaction product was cooled to room temperature, and distilled water was added thereto, followed by stirring at room temperature for about one hour. The solid thus precipitated was filtered under reduced pressure using distilled water and methanol to obtain a yellow solid. The solid thus obtained was dissolved in 200 mL of dichloromethane and then separated by SiO$_2$ column chromatography (DCM:hexane=2:1). A slurry process (e.g., rinsing and/or recrystallization) was performed using dichloromethane and methanol to obtain 2.5 g (yield: 76.4%) of Compound 5 as a yellow solid. The molecular weight of Compound 5 measured by FAB-MS was 451. Through the results, the compound thus obtained was identified as Compound 5.

(3) Synthesis of Compound 6

Polycyclic Compound 6 according to an embodiment may be synthesized, for example, by Reaction 3:

Synthesis of Intermediate (7)

1.97 g (7.2 mmol) of 2-(4-bromophenyl)benzo[d]oxazole-6-carbonitrile, 2.15 g (7.2 mmol) of Intermediate (4), and 28 mL of xylene were added to a one-neck, 250 mL flask. 0.4 g (0.7 mmol) of Pd(dba)$_2$, 7.1 g (21.7 mmol) of Cs$_2$CO$_3$, and 0.7 g (1.5 mmol) of XPhos were added thereto, followed by stirring at about 140° C. for about 4 hours. After finishing the reaction, the reaction product was cooled to room temperature and 100 mL of distilled water was added thereto, followed by stirring at room temperature for about one hour. The solid thus precipitated was filtered under reduced pressure using distilled water and methanol to obtain a gray solid. The solid thus obtained was separated using SiO$_2$ column chromatography (EA:hexane=1:5). A slurry process (e.g., rinsing and/or recrystallization) was performed for the solid thus obtained using dichloromethane and methanol to obtain 1.85 g (yield: 51.9%) of an ivory solid compound (Intermediate (7)).

Synthesis of Compound 6

3.3 g (7.0 mmol) of Intermediate (7) and 78 mL of DMF were added to a one-neck, 250 mL flask, followed by stirring at room temperature. 1.3 g (11.8 mmol) of NaOtBu was added thereto and the resultant solution was stirred at about 100° C. for about 4 hours. After finishing the reaction, the reaction product was cooled to room temperature, and distilled water was added thereto, followed by stirring at room temperature for about one hour. The solid thus precipitated was filtered under reduced pressure using distilled water and methanol to obtain a yellow solid. The solid thus obtained was dissolved in 200 mL of dichloromethane and separated by SiO$_2$ column chromatography (DCM:

hexane=2:1). A slurry process (e.g., rinsing and/or recrystallization) was performed using dichloromethane and methanol to obtain 2.3 g (yield: 70.2%) of Compound 6 as a yellow solid. The molecular weight of Compound 6 measured by FAB-MS was 475. Through the results, the compound thus obtained was identified as Compound 6.

(4) Synthesis of Compound 10

Polycyclic Compound 10 according to an embodiment may be synthesized, for example, by Reaction 4:

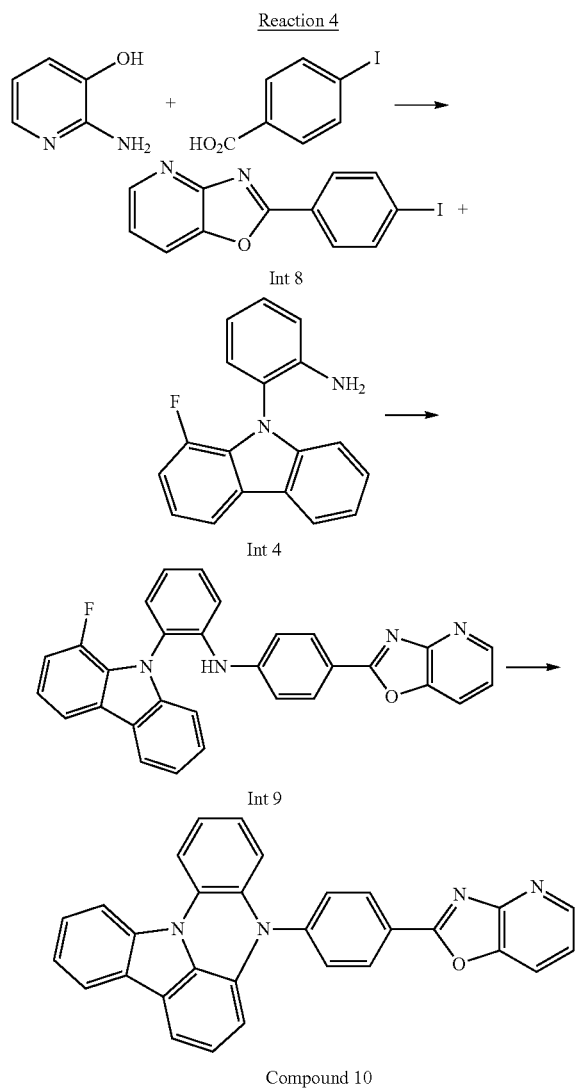

Synthesis of Intermediate (8)

20.0 g (181.6 mmol) of 2-aminopyridin-3-ol and 45.1 g (181.6 mmol) of 4-iodobenzoic acid were added to a one-neck, 500 mL flask and mixed well, and 140 mL of POCl₃ was slowly added thereto at about 0° C. and stirred. The temperature was elevated to about 90° C. and the reaction was carried out for about 12 hours. After finishing the reaction, the reaction product was cooled to room temperature and the reaction product was dropwisely added to ice. The resultant solution was neutralized with a sodium carbonate solution. The solid thus formed was filtered, washed with water and methanol, and dried to obtain 43.0 g (yield: 73.5%) of a white solid compound (Intermediate (8)).

Synthesis of Intermediate (9)

3.5 g (12.6 mmol) of Intermediate (4), 4.1 g (12.6 mmol) of Intermediate (9), 1.4 g (2.5 mmol) of Pd(dba)₂, 2.4 g (5.1 mmol) of XPhos, 8.3 g (25.3 mmol) of Cs₂O₃, and 40 mL of xylene were added to a two-neck, 250 mL flask, followed by refluxing and stirring for about 26 hours. After finishing the reaction, the reaction product was cooled to room temperature, filtered, and washed with ethyl acetate. The filtrate was extracted with purified water and the organic phase was dried with anhydrous magnesium sulfate, filtered, and concentrated under reduced pressure. The resultant product was separated by silica gel column chromatography (hexane:EA=2:1), and dichloromethane and hexane were added to the solid thus obtained, stirred for about one hour, and filtered to obtain 2.4 g (yield: 40.4%) of a yellow solid compound (Intermediate (9)).

Synthesis of Compound 10

2.2 g (4.7 mmol) of Intermediate (9), 0.8 g (7.1 mmol) of KOtBu, and 50 mL of DMF were added to a two-neck, 250 mL flask, followed by stirring at about 110° C. for about 5 hours. After checking the termination of the reaction, the reaction product was cooled to room temperature, and 50 mL of distilled water was added thereto. The solid thus obtained was separated by silica gel column chromatography (hexane:EA:DCM=1:1:2). Dichloromethane and hexane were added to the solid thus obtained, followed by stirring for about one hour and filtering to obtain 0.7 g (yield: 35.6%) of Compound 10 as a yellow solid. The molecular weight of Compound 10 measured by FAB-MS was 451. Through the results, the compound thus obtained was identified as Compound 10.

(5) Synthesis of Compound 11

Polycyclic Compound 11 according to an embodiment may be synthesized, for example, by Reaction 5:

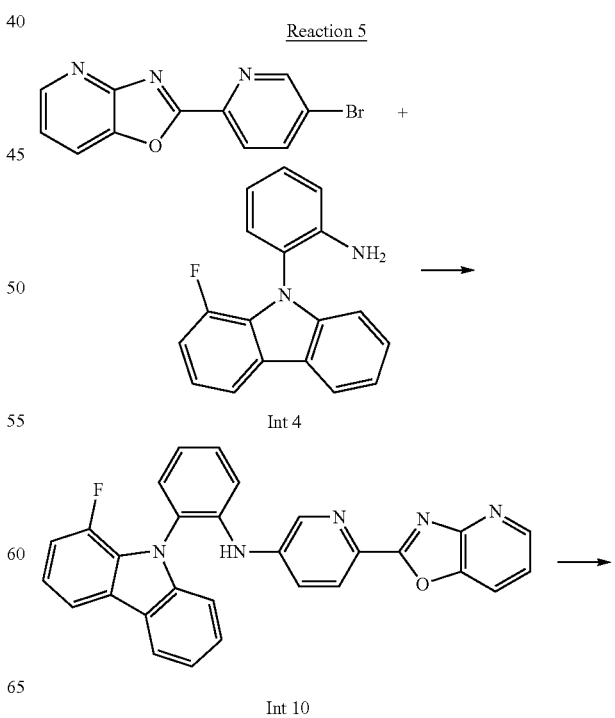

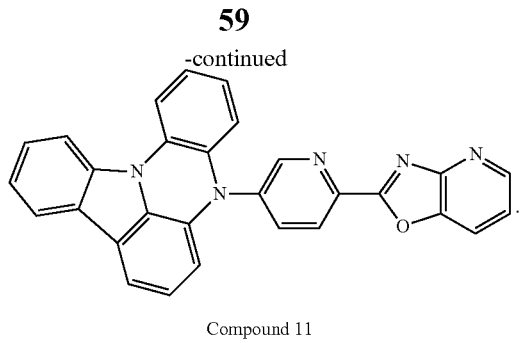

Compound 11

Synthesis of Intermediate (10)

1.97 g (7.2 mmol) of 2-(5-bromopyridin-2-yl)benzo[d] oxazole, 2.15 g (7.2 mmol) of Intermediate (4), and 28 mL of xylene were added to a one-neck, 250 mL flask. 0.4 g (0.7 mmol) of Pd(dba)$_2$, 7.1 g (21.7 mmol) of Cs$_2$CO$_3$, and 0.7 g (1.5 mmol) of XPhos were added thereto, followed by stirring at about 140° C. for about 4 hours. After finishing the reaction, the reaction product was cooled to room temperature and 100 mL of distilled water was added thereto, followed by stirring at room temperature for about one hour. The solid thus precipitated was filtered using distilled water and methanol to obtain a gray solid. The solid thus obtained was separated using SiO$_2$ column chromatography (EA: hexane=1:5). A slurry process (e.g., rinsing and/or recrystallization) was performed for the solid thus obtained using dichloromethane and methanol to obtain 0.90 g (yield: 26.6%) of an ivory solid compound (Intermediate (10)).

Synthesis of Compound 11

3.3 g (7.0 mmol) of Intermediate (10) and 78 mL of DMF were added to a one-neck, 250 mL flask, followed by stirring at room temperature. 1.3 g (11.8 mmol) of NaOtBu was added thereto and the resultant solution was stirred at about 100° C. for about 4 hours. After finishing the reaction, the reaction product was cooled to room temperature, and distilled water was added thereto, followed by stirring at room temperature for about one hour. The solid thus precipitated was filtered under reduced pressure using distilled water and methanol to obtain a yellow solid. The solid thus obtained was dissolved in 200 mL of dichloromethane and separated by SiO$_2$ column chromatography (DCM: hexane=2:1). A slurry process (e.g., rinsing and/or recrystallization) was performed using dichloromethane and methanol to obtain 1.4 g (yield: 44.7%) of Compound 11 as a yellow solid. The molecular weight of Compound 11 measured by FAB-MS was 452. Through the results, the compound thus obtained was identified as Compound 11.

(6) Synthesis of Compound 38

Polycyclic Compound 38 according to an embodiment may be synthesized, for example, by Reaction 6:

Reaction 6

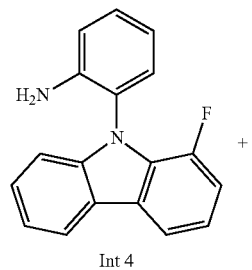

Int 4

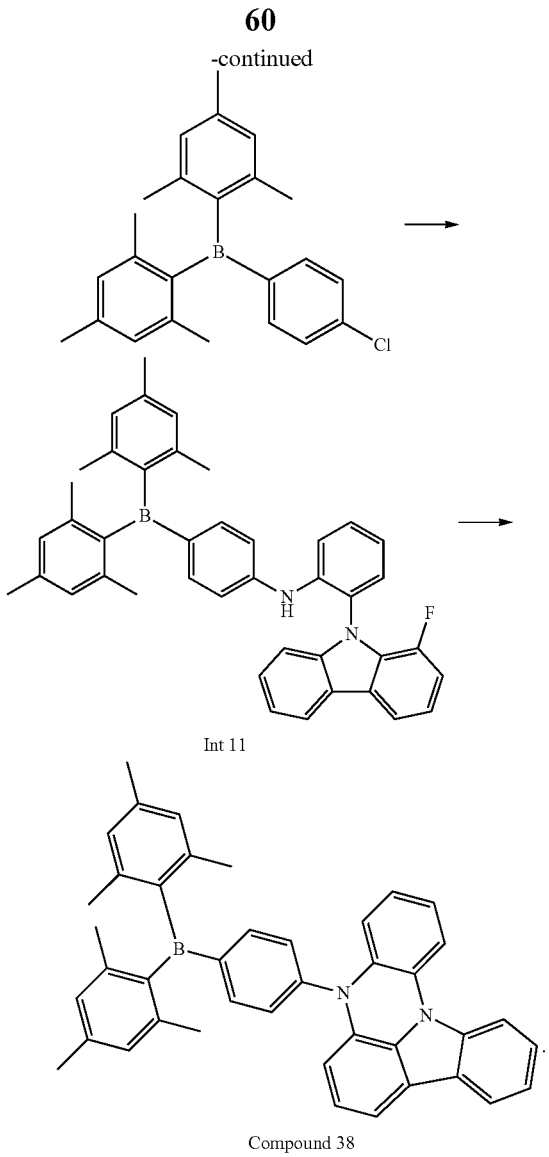

Int 11

Compound 38

Synthesis of Intermediate (11)

2.6 g (7.2 mmol) of (4-chlorophenyl)dimesitylborane, 2.15 g (7.2 mmol) of Intermediate (4), and 28 mL of xylene were added to a one-neck, 250 mL flask. 0.4 g (0.7 mmol) of Pd(dba)$_2$, 7.1 g (21.7 mmol) of Cs$_2$CO$_3$, and 0.7 g (1.5 mmol) of XPhos were added thereto, followed by stirring at about 140° C. for about 4 hours. After finishing the reaction, the reaction product was cooled to room temperature and 100 mL of distilled water was added thereto, followed by stirring at room temperature for about one hour. The solid thus precipitated was filtered under reduced pressure using distilled water and methanol to obtain a gray solid. The solid thus obtained was separated using SiO$_2$ column chromatography (EA:hexane=1:5). A slurry process (e.g., rinsing and/or recrystallization) was performed for the solid thus obtained using dichloromethane and methanol to obtain 2.68 g (yield: 61.9%) of an ivory solid compound, Intermediate (11).

Synthesis of Compound 38

4.2 g (7.0 mmol) of Intermediate (11) and 78 mL of DMF were added to a one-neck, 250 mL flask, followed by stirring at room temperature. 1.3 g (11.8 mmol) of NaOtBu was added thereto, and the resultant solution was stirred at about 100° C. for about 4 hours. After finishing the reaction, the reaction product was cooled to room temperature, and distilled water was added thereto, followed by stirring at room temperature for about one hour. The solid thus precipitated was filtered under reduced pressure using distilled water and methanol to obtain a yellow solid. The solid thus obtained was dissolved in 200 mL of dichloromethane and separated by SiO₂ column chromatography (DCM: hexane=2:1). A slurry process (e.g., rinsing and/or recrystallization) was performed using dichloromethane and methanol to obtain 0.74 g (yield: 18.3%) of Compound 38 as a yellow solid. The molecular weight of Compound 38 measured by FAB-MS was 581. Through the results, the compound thus obtained was identified as Compound 38.

(7) Synthesis of Compound 72

Polycyclic Compound 72 according to an embodiment may be synthesized, for example, by Reaction 7:

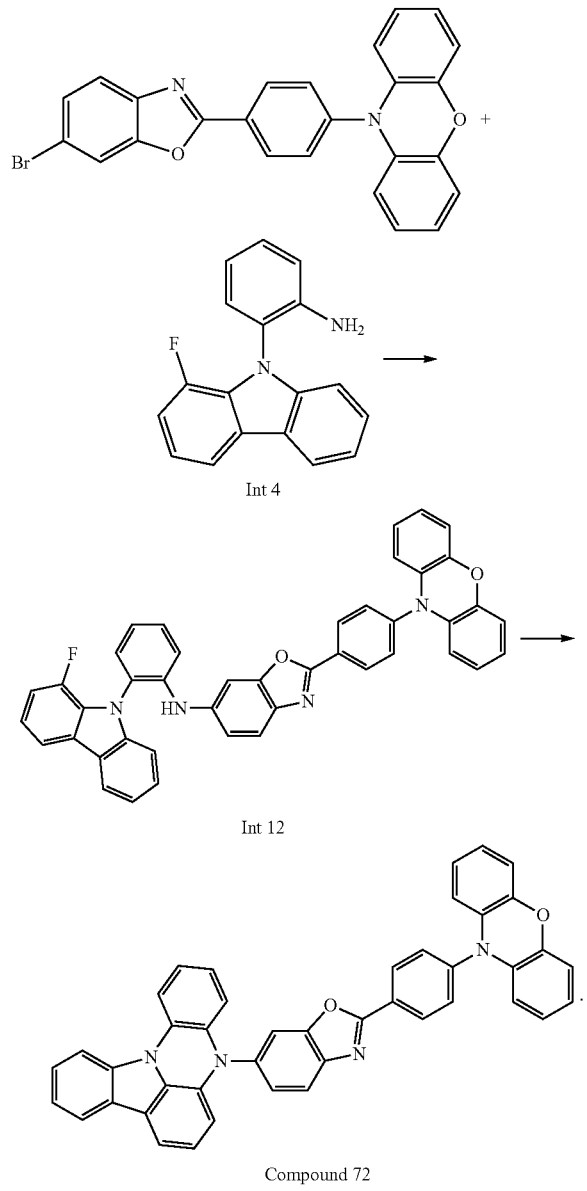

Synthesis of Intermediate (12)

3.3 g (7.2 mmol) of 10-(4-(6-bromobenzo[d]oxazol-2-yl)phenyl)-10H-phenoxazine, 2.15 g (7.2 mmol) of Intermediate (4), and 28 mL of xylene were added to a one-neck, 250 mL flask. 0.4 g (0.7 mmol) of Pd(dba)₂, 7.1 g (21.7 mmol) of Cs₂CO₃, and 0.7 g (1.5 mmol) of XPhos were added thereto, followed by stirring at about 140° C. for about 4 hours. After finishing the reaction, the reaction product was cooled to room temperature and 100 mL of distilled water was added thereto, followed by stirring at room temperature for about one hour. The solid thus precipitated was filtered using distilled water and methanol to obtain a gray solid. The solid thus obtained was separated using SiO₂ column chromatography (EA:hexane=1:5). A slurry process (e.g., rinsing and/or recrystallization) was performed for the solid thus obtained using dichloromethane and methanol to obtain 2.85 g (yield: 60.8%) of an ivory solid compound, Intermediate (12).

Synthesis of Compound 72

4.6 g (7.0 mmol) of Intermediate (12) and 78 mL of DMF were added to a one-neck, 250 mL flask, followed by stirring at room temperature. 1.3 g (11.8 mmol) of NaOtBu was added thereto, and the resultant solution was stirred at about 100° C. for about 4 hours. After finishing the reaction, the reaction product was cooled to room temperature, and distilled water was added thereto, followed by stirring at room temperature for about one hour. The solid thus precipitated was filtered under reduced pressure using distilled water and methanol to obtain a yellow solid. The solid thus obtained was dissolved in 200 mL of dichloromethane and separated by SiO₂ column chromatography (DCM: hexane=2:1). A slurry process (e.g., rinsing and/or recrystallization) was performed using dichloromethane and methanol to obtain 2.21 g (yield: 50.1%) of Compound 72 as a yellow solid. The molecular weight of Compound 72 measured by FAB-MS was 631. Through the results, the compound thus obtained was identified as Compound 72.

(8) Synthesis of Compound 77

Polycyclic Compound 77 according to an embodiment may be synthesized, for example, by Reaction 8:

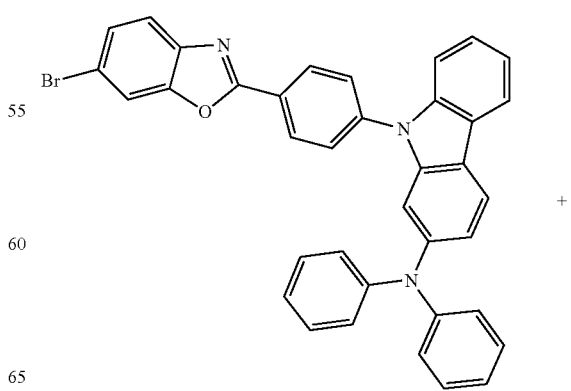

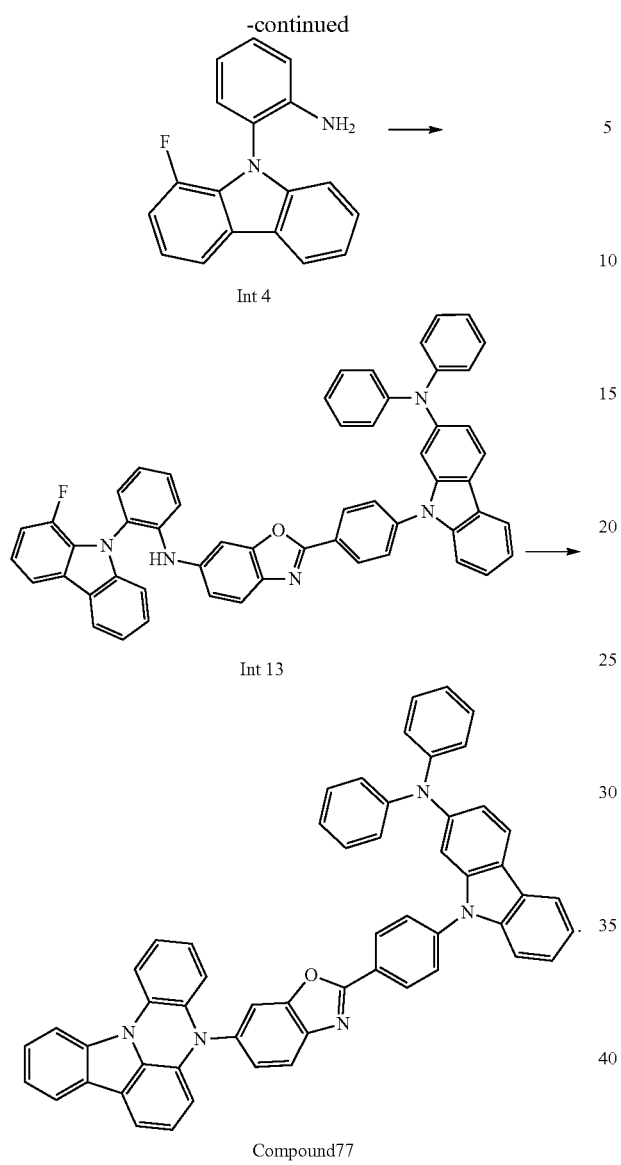

Int 4

Int 13

Compound77

Synthesis of Intermediate (13)

4.36 g (7.2 mmol) of 9-(4-(6-bromobenzo[d]oxazol-2-yl)phenyl)-2-diphenylamino carbazole, 2.15 g (7.2 mmol) of Intermediate (4), and 28 mL of xylene were added to a one-neck, 250 mL flask. 0.4 g (0.7 mmol) of Pd(dba)$_2$, 7.1 g (21.7 mmol) of Cs$_2$CO$_3$, and 0.7 g (1.5 mmol) of XPhos were added thereto, followed by stirring at about 140° C. for about 4 hours. After finishing the reaction, the reaction product was cooled to room temperature and 100 mL of distilled water was added thereto, followed by stirring at room temperature for about one hour. The solid thus precipitated was filtered under reduced pressure using distilled water and methanol to obtain a gray solid. The solid thus obtained was separated using SiO$_2$ column chromatography (EA:hexane=1:5). A slurry process (e.g., rinsing and/or recrystallization) was performed for the solid thus obtained using dichloromethane and methanol to obtain 3.88 g (yield: 67.2%) of an ivory solid compound, Intermediate (13).

Synthesis of Compound 77

5.6 g (7.0 mmol) of Intermediate (13) and 78 mL of DMF were added to a one-neck, 250 mL flask, followed by stirring at room temperature. 1.3 g (11.8 mmol) of NaOtBu was added thereto, and the resultant solution was stirred at about 100° C. for about 4 hours. After finishing the reaction, the reaction product was cooled to room temperature, and distilled water was added thereto, followed by stirring at room temperature for about one hour. The solid thus precipitated was filtered under reduced pressure using distilled water and methanol to obtain a yellow solid. The solid thus obtained was dissolved in 200 mL of dichloromethane and separated by SiO$_2$ column chromatography (DCM:hexane=2:1). A slurry process (e.g., rinsing and/or recrystallization) was performed using dichloromethane and methanol to obtain 2.8 g (yield: 51.4%) of Compound 77 as a yellow solid. The molecular weight of Compound 77 measured by FAB-MS was 782. Through the results, the compound thus obtained was identified as Compound 77.

2. Evaluation of Energy Levels of Polycyclic Compounds

The structures of the compounds of the Examples and Comparative Examples used in Examples 1 to 8 and Comparative Examples 1 and 2 are as follows.

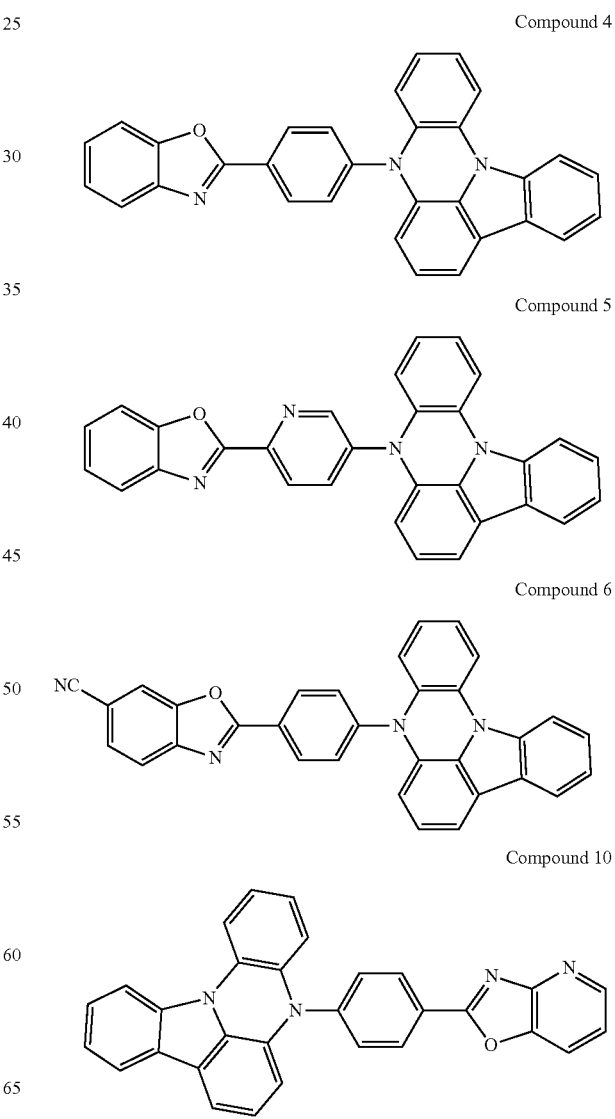

Compound 4

Compound 5

Compound 6

Compound 10

-continued

Compound 11

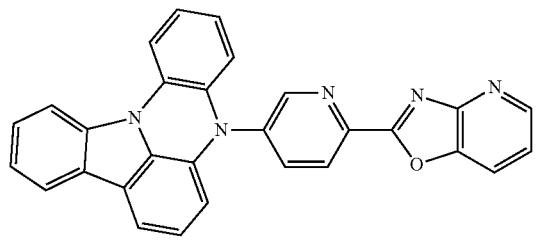

Compound 38

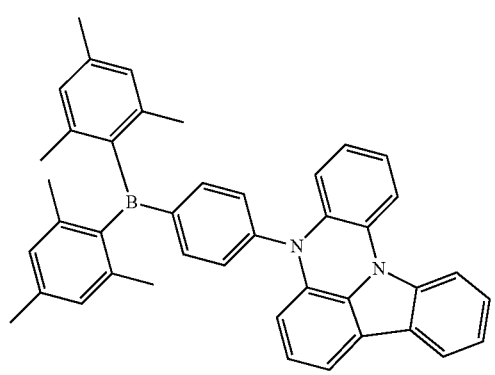

Compound 72

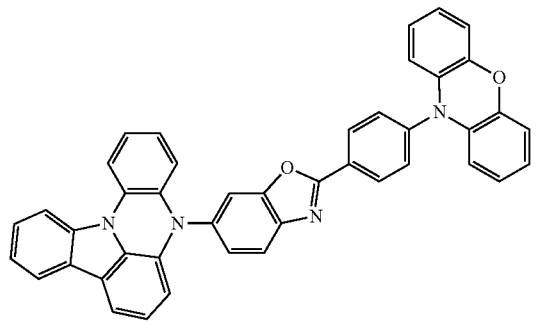

Compound 77

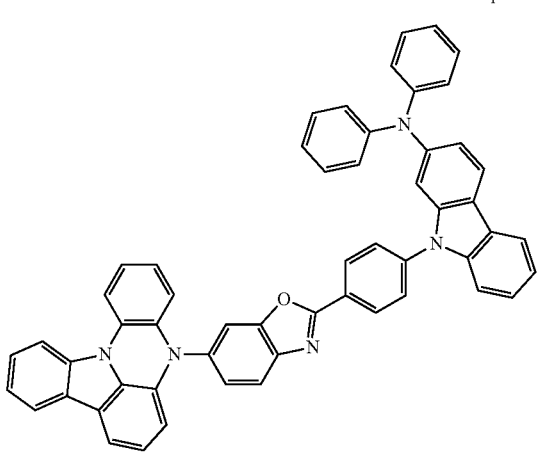

-continued

Compound C1

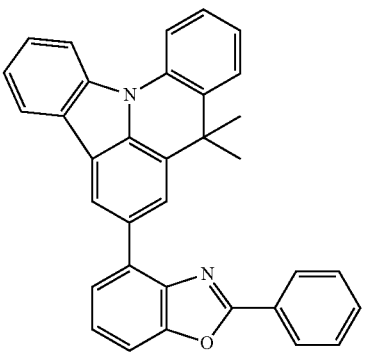

Compound C2

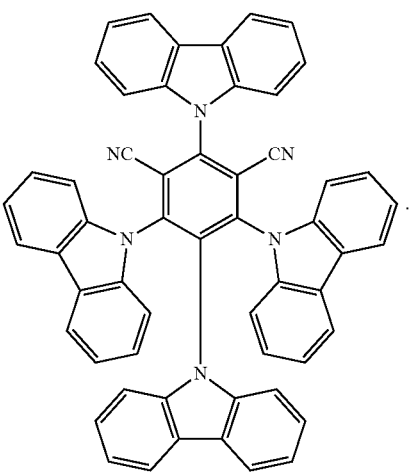

Table 1 shows the lowest singlet excitation energy level (S1 level), the lowest triplet excitation energy level (T1 level), and the $\Delta E_{ST}$ of each of Compound 4, Compound 5, Compound 6, Compound 10, Compound 11, Compound 38, Compound 72, Compound 77, Comparative Compound C1, and Comparative Compound C2. The energy level values in Table 1 were calculated by a nonempirical molecular orbital method, e.g., using a B3LYP/6-31G(d) hybrid density functional and basis set using Gaussian 09 of Gaussian Co. In Table 1, $\Delta E_{ST}$ refers to the difference between the lowest singlet excitation energy level (S1 level) and the lowest triplet excitation energy level (T1 level).

TABLE 1

| Example | Compound | S1 level (eV) | T1 level (eV) | $\Delta E_{ST}$ (eV) |
|---|---|---|---|---|
| Example 1 | Compound 4 | 2.23 | 2.22 | 0.01 |
| Example 2 | Compound 5 | 2.13 | 2.12 | 0.01 |
| Example 3 | Compound 6 | 1.88 | 1.87 | 0.01 |
| Example 4 | Compound 10 | 2.05 | 2.04 | 0.01 |
| Example 5 | Compound 11 | 1.97 | 1.96 | 0.01 |
| Example 6 | Compound 38 | 2.14 | 2.12 | 0.02 |
| Example 7 | Compound 72 | 2.14 | 2.13 | 0.01 |
| Example 8 | Compound 77 | 2.22 | 2.21 | 0.01 |
| Comparative Example 1 | Compound C1 | 3.17 | 2.68 | 0.49 |
| Comparative Example 2 | Compound C2 | 2.48 | 2.36 | 0.12 |

3. Manufacture and Evaluation of Organic Electroluminescence Device Including Polycyclic Compound (Manufacture of Organic Electroluminescence Device)

Organic electroluminescence devices including the polycyclic compound of an embodiment in an emission layer were manufactured according to the method below. The organic electroluminescence devices of Example 1 to Example 8 were manufactured using the polycyclic compounds of Compound 4, Compound 5, Compound 6, Compound 10, Compound 11, Compound 38, Compound 72, and Compound 77, respectively, as the dopant materials of an emission layer. Comparative Example 1 and Comparative Example 2 were manufactured using Compound C1 and Compound C2, respectively, as the emission layer dopant materials.

A glass substrate including a patterned ITO layer was washed using ultrapure water and ultrasonic waves, exposed to ultraviolet light for about 30 minutes, and treated with ozone. Then, HT1 was deposited to a thickness of about 1,200 Å, and HT2 was deposited to a thickness of about 100 Å to form a hole transport region.

Next, the compound of an embodiment or a Comparative Compound was co-deposited with mCBP in a ratio of about 20:80 to a thickness of about 400 Å to thereby form an emission layer. For example, the emission layer co-deposited was formed by mixing and depositing each compound of the present disclosure with mCBP in the Examples, and by mixing and depositing the Comparative Compounds with mCBP in the Comparative Examples.

Then, ET and LiQ were mixed and deposited in a ratio of about 5:5 on the emission layer to form a layer having a thickness of about 300 Å, and a layer was formed using LiQ to a thickness of about 10 Å to form an electron transport region. After that, a second electrode was formed using Mg:Ag (10:1) to a thickness of about 100 Å.

In an embodiment, the hole transport region, the emission layer, the electron transport region, and the second electrode were formed using a vacuum deposition apparatus.

The structures of the compounds of all layers used for the manufacture of the device are as follows:

HT1

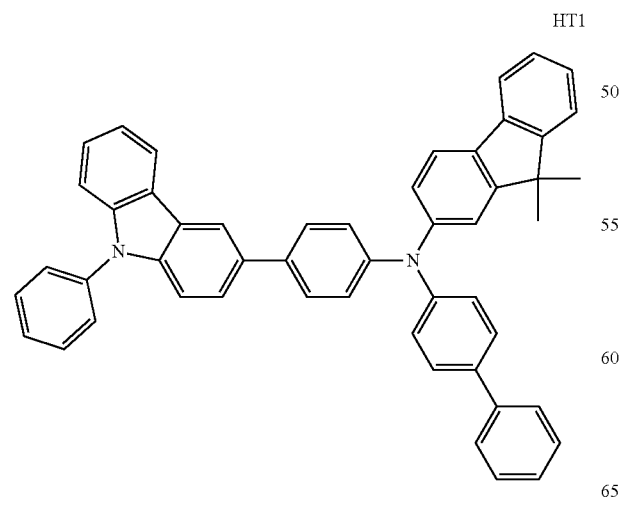

HT2

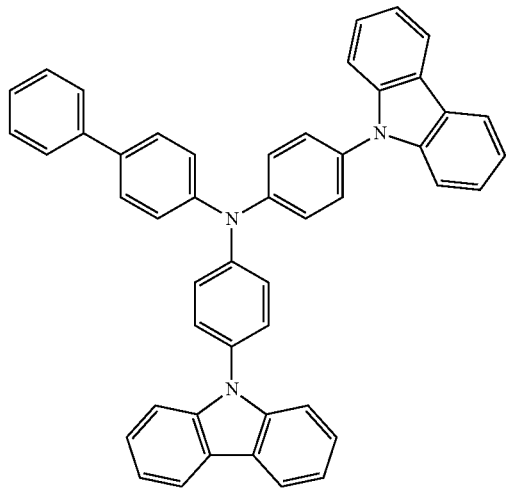

ET

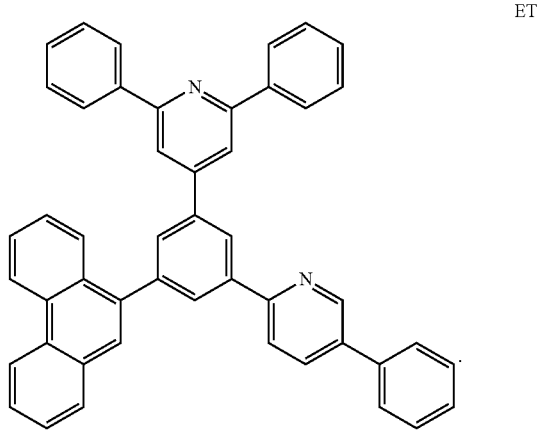

Evaluation of Properties of Organic Electroluminescence Devices

The evaluation results on the organic electroluminescence devices of Example 1 to Example 8, and Comparative Example 1 and Comparative Example 2 are shown in Table 2.

In the evaluation results on the properties of the Examples and Comparative Examples shown in Table 2, the emission efficiency and device life are shown as relative values with respect to the device of Comparative Example 1, which was set to 100%.

TABLE 2

| Device manufacturing example | Dopant material of emission layer | Efficiency | Life | Emission color |
|---|---|---|---|---|
| Example 1 | Compound 4 | 255% | 165% | Green |
| Example 2 | Compound 5 | 280% | 190% | Yellowish green |
| Example 3 | Compound 6 | 236% | 161% | Green |
| Example 4 | Compound 10 | 271% | 173% | Green |
| Example 5 | Compound 11 | 268% | 180% | Yellow |
| Example 6 | Compound 38 | 291% | 150% | Green |
| Example 7 | Compound 72 | 273% | 196% | Green |
| Example 8 | Compound 77 | 275% | 175% | Green |
| Comparative Example 1 | Compound C1 | 100% | 100% | Blue |
| Comparative Example 2 | Compound C2 | 190% | 157% | Green |

Referring to the results of Table 2, when the polycyclic compound according to an embodiment of the present disclosure was used as a material for an emission layer in the organic electroluminescence devices of the Examples, the devices achieved relatively high emission efficiency and external quantum efficiency compared with the devices of the Comparative Examples. The Example Compounds exhibit TADF properties because they have multiple resonance phenomenon due to the polycyclic aromatic ring, include indolophenazine or indolophenoxazine moiety as an electron donor, and have a structure in which an electron donor and an electron acceptor are connected via a linker, such that a small $\Delta E_{ST}$ value may be achieved when compared with Comparative Compounds C1 and C2. Accordingly, the organic electroluminescence devices of the Examples may show improved emission efficiency than the organic electroluminescence devices of the Comparative Examples. For example, because the organic electroluminescence device of an embodiment includes the polycyclic compound of an embodiment as a material for an emission layer, high emission efficiency could be achieved in a red light or green light wavelength region.

The organic electroluminescence device of an embodiment may show improved device properties showing high emission efficiency in a blue region.

The polycyclic compound of an embodiment may be included in the emission layer of an organic electroluminescence device, and may contribute to the high efficiency of the organic electroluminescence device.

As used herein, the terms "substantially", "about", and similar terms are used as terms of approximation and not as terms of degree, and are intended to account for the inherent deviations in measured or calculated values that would be recognized by those of ordinary skill in the art.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Although the example embodiments of the present disclosure have been described, it is understood that the present disclosure should not be limited to these example embodiments, but various changes and modifications can be made by one ordinary skilled in the art within the spirit and scope of the present disclosure as set forth in the following claims and equivalents thereof.

What is claimed is:

1. An organic electroluminescence device, comprising:
    a first electrode;
    a second electrode facing the first electrode; and
    an emission layer between the first electrode and the second electrode and comprising a polycyclic compound represented by Formula 1,
    wherein the first electrode and the second electrode each independently comprise at least one selected from Ag, Mg, Cu, Al, Pt, Pd, Au, Ni, Nd, Ir, Cr, Li, Ca, LiF/Ca, LiF/Al, Mo, Ti, In, Sn, and Zn, a compound of two or more thereof, a mixture of two or more thereof, and an oxide of one or more thereof:

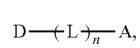

Formula 1 wherein in Formula 1,

L is a substituted or unsubstituted arylene group of 6 to 30 carbon atoms for forming a ring, or a substituted or unsubstituted heteroarylene group of 2 to 30 carbon atoms for forming a ring, A is represented by any one selected from Formula A-1 to Formula A-3, where at least one selected from L and A comprises an electron acceptor substituent, n is an integer of 1 to 3, and D is represented by Formula 2:

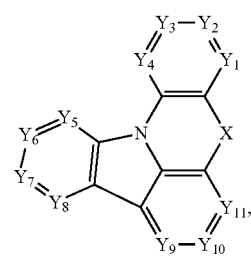

Formula 2 wherein in Formula 2,

X is O, S, $NR_1$, or $SiR_2R_3$, $Y_1$ to $Y_{11}$ are each independently N or $CR_4$, $R_1$ to $R_4$ are each independently a hydrogen atom, a deuterium atom, a halogen atom, a substituted or unsubstituted silyl group, a substituted or unsubstituted amine group, a substituted or unsubstituted alkyl group of 1 to 20 carbon atoms, a substituted or unsubstituted aryl group of 6 to 30 carbon atoms for forming a ring, or a substituted or unsubstituted heteroaryl group of 2 to 30 carbon atoms for forming a ring, or are combined with an adjacent group to form a ring, and any one selected from $R_1$ to $R_4$ is a connecting part with L in Formula 1:

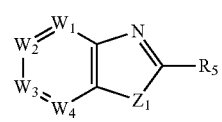

Formula A-1

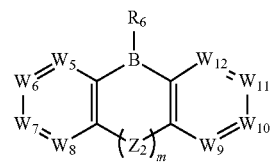

Formula A-2

Formula A-3

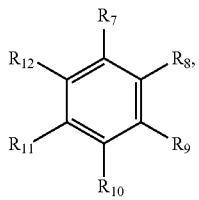

wherein in Formula A-1 to Formula A-3,
$W_1$ to $W_{12}$ are each independently N or $CR_{13}$
$Z_1$ is O or S,
$Z_2$ is O, S, $NR_{14}$, $CR_{15}R_{16}$, or $SiR_{17}R_{18}$,
m is 0 or 1,
$R_5$ to $R_{18}$ are each independently a hydrogen atom, a deuterium atom, a halogen atom, a cyano group, a substituted or unsubstituted silyl group, a substituted or unsubstituted amine group, a substituted or unsubstituted alkyl group of 1 to 20 carbon atoms, a substituted or unsubstituted aryl group of 6 to 30 carbon atoms for forming a ring, or a substituted or unsubstituted heteroaryl group of 2 to 30 carbon atoms for forming a ring, or are combined with an adjacent group to form a ring,
at least one selected from $R_7$ to $R_{12}$ is a halogen atom or a cyano group, and
any one selected from $R_5$ to $R_{18}$ is a connecting part with L in Formula 1.

2. The organic electroluminescence device of claim 1, wherein the emission layer is to emit delayed fluorescence.

3. The organic electroluminescence device of claim 2, wherein the emission layer is a delayed fluorescence emission layer comprising a host and a dopant, and
the dopant comprises the polycyclic compound represented by Formula 1.

4. The organic electroluminescence device of claim 2, wherein the emission layer comprises:
a host having a first lowest triplet excitation energy level;
a first dopant having a second lowest triplet excitation energy level lower than the first lowest triplet excitation energy level; and
a second dopant having a third lowest triplet excitation energy level lower than the second lowest triplet excitation energy level,
wherein the first dopant comprises the polycyclic compound represented by Formula 1.

5. The organic electroluminescence device of claim 4, wherein the first dopant is a delayed fluorescence dopant, and
the second dopant is a fluorescence dopant.

6. The organic electroluminescence device of claim 1, further comprising a hole transport region between the first electrode and the emission layer; and
an electron transport region between the emission layer and the second electrode.

7. The organic electroluminescence device of claim 1, wherein A is represented by any one selected from Formula A-1-1 to Formula A-3-3:

Formula A-1-1

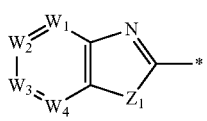

Formula A-1-2

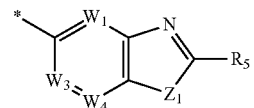

Formula A-2-1

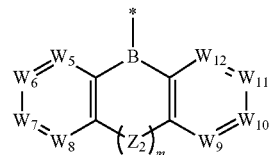

Formula A-2-2

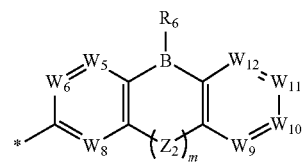

Formula A-3-1

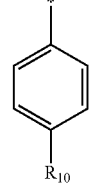

Formula A-3-2

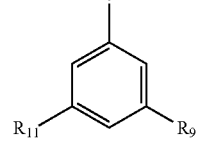

Formula A-3-3

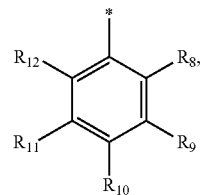

wherein in Formula A-1-1 to Formula A-3-3,
$W_1$ to $W_{12}$, $Z_1$, $Z_2$, m, and $R_5$ to $R_{18}$ are each independently the same as defined in connection with Formula A-1 to Formula A-3.

8. The organic electroluminescence device of claim 1, wherein the polycyclic compound represented by Formula 1 is represented by Formula 3:

$$D_1\text{-}L_1\text{-}A\text{-}L_2\text{-}D_2, \quad \text{Formula 3}$$

wherein in Formula 3,
$L_1$ and $L_2$ are each independently a substituted or unsubstituted arylene group of 6 to 30 carbon atoms for forming a ring, or a substituted or unsubstituted heteroarylene group of 2 to 30 carbon atoms for forming a ring,
$D_1$ is represented by Formula 2,
$D_2$ is an electron donor substituent, and
A is the same as defined in connection with Formula 1.

9. The organic electroluminescence device of claim 8, wherein $D_2$ is a substituted or unsubstituted arylamine group, a substituted or unsubstituted carbazole group, a substituted or unsubstituted acridine group, or a substituted or unsubstituted phenoxazine group.

10. The organic electroluminescence device of claim 1, wherein D is represented by one selected from Formula 2-1 to Formula 2-5:

Formula 2-1
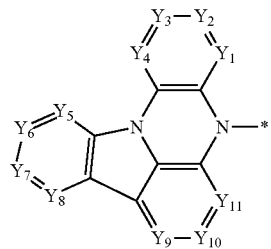

Formula 2-2
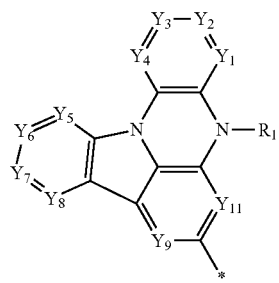

Formula 2-3
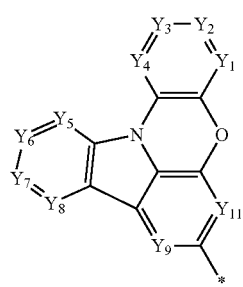

Formula 2-4
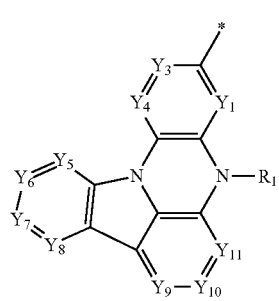

Formula 2-5
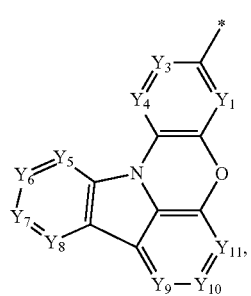

wherein in Formula 2-1 to Formula 2-5,
$Y_1$ to $Y_{11}$, and $R_1$ to $R_4$ are each independently the same as defined in connection with Formula 2.

11. The organic electroluminescence device of claim 1, wherein L is a substituted or unsubstituted phenylene group, a substituted or unsubstituted pyridinylene group, a substituted or unsubstituted triazinylene group, a substituted or unsubstituted benzoxazolylene group, a substituted or unsubstituted benzothiazolylene group, a substituted or unsubstituted benzimidazolylene group, a substituted or unsubstituted imidazopyridinylene group, a substituted or unsubstituted oxazolopyridinylene group, a substituted or unsubstituted thiazolopyridinylene group, a substituted or unsubstituted dibenzoborynylene group, or a substituted or unsubstituted dibenzoxaborynylene group.

12. The organic electroluminescence device of claim 1, wherein the polycyclic compound represented by Formula 1 is at least one selected from Compound Group 1 and Compound Group 2:

Compound Group 1

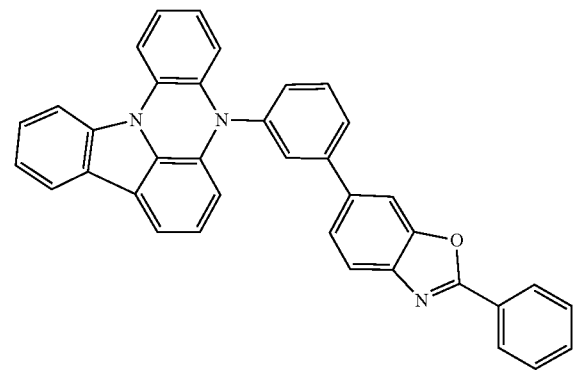

4
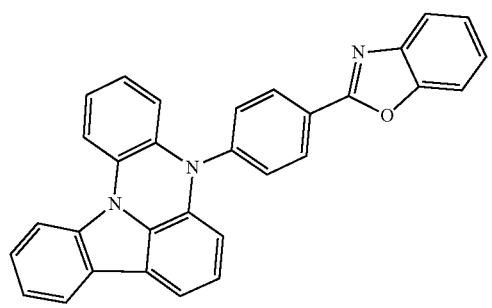
5
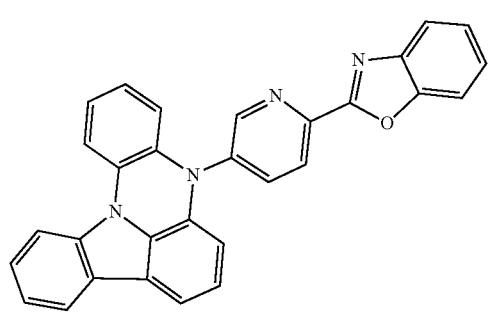
6
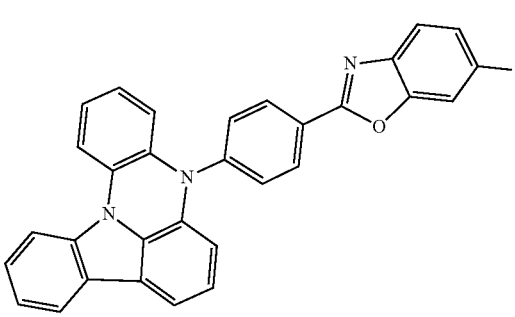
7
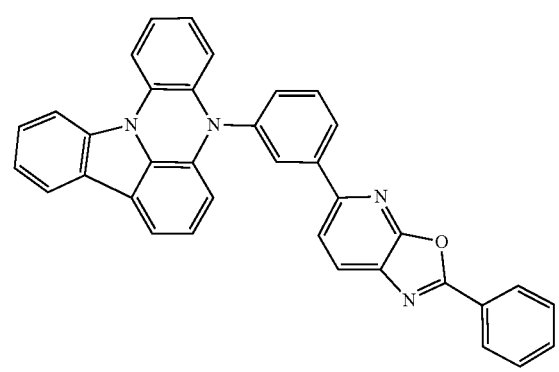
8
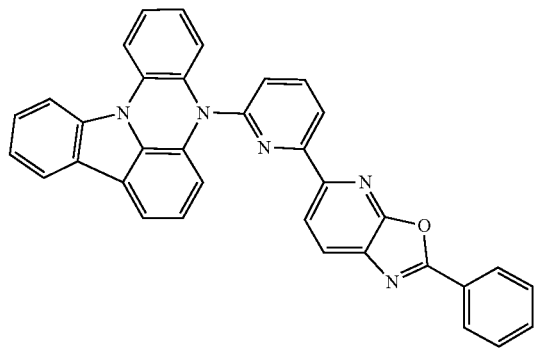
9
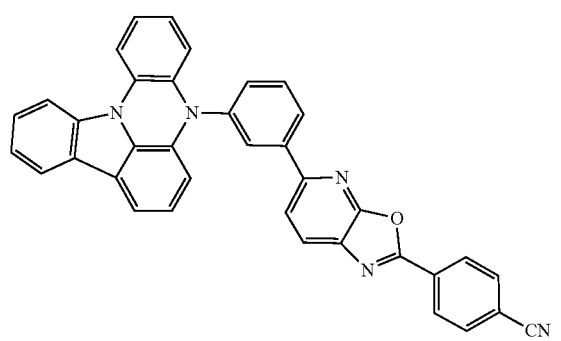
10
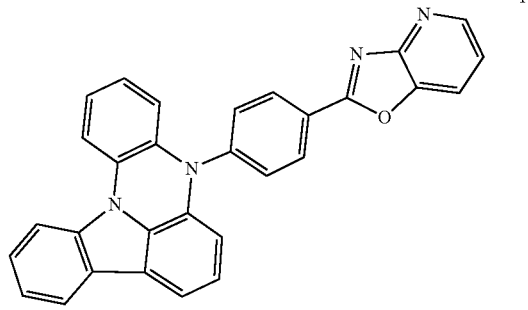
11
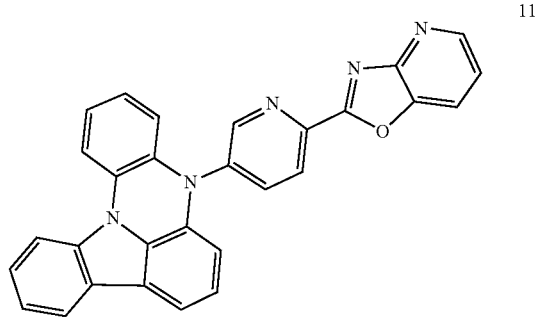

77
12
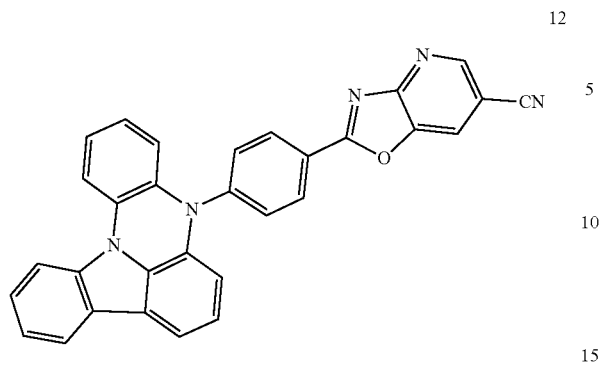
13
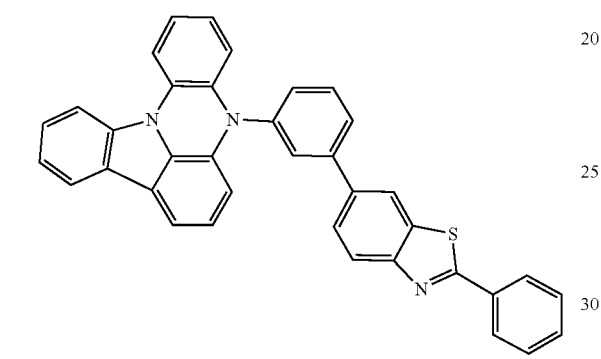
14
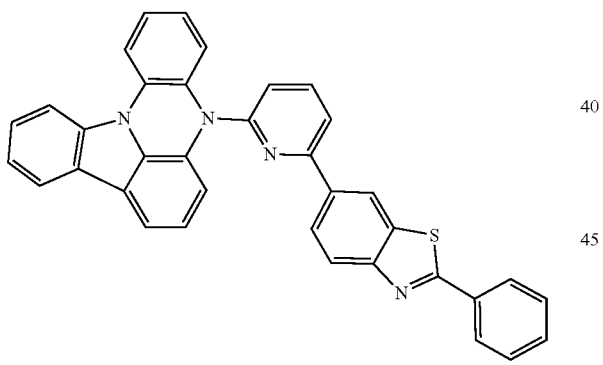
15
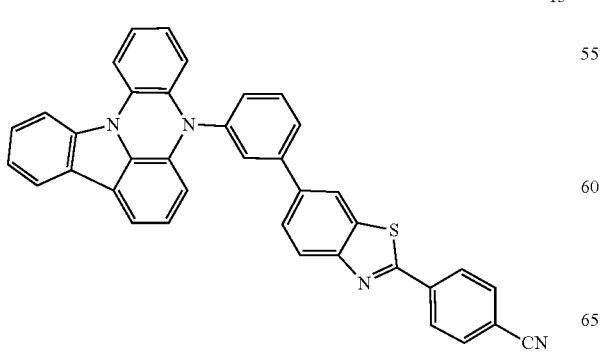
78
16
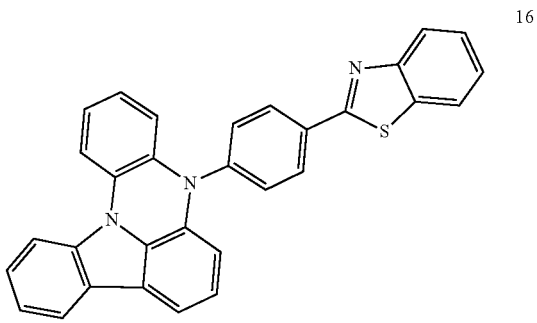
17
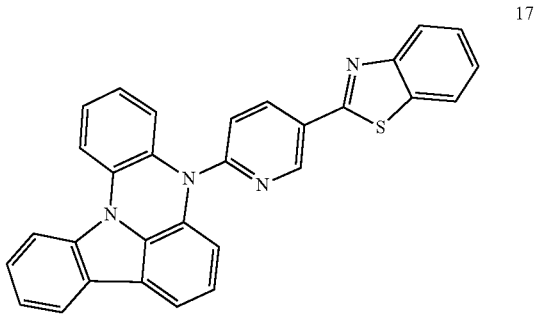
18
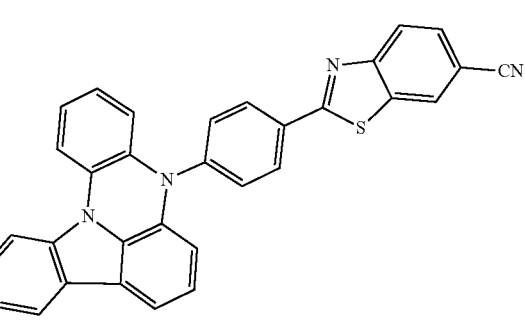
19
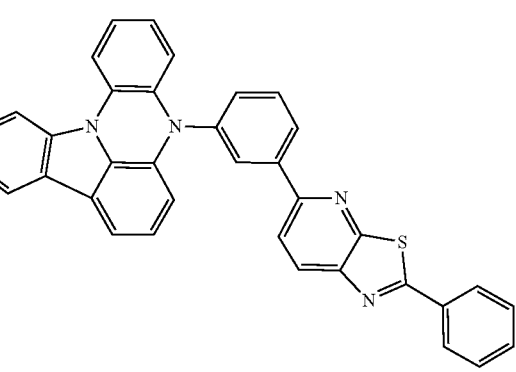

20
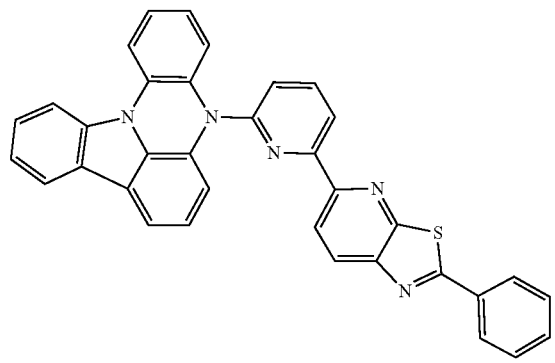
21
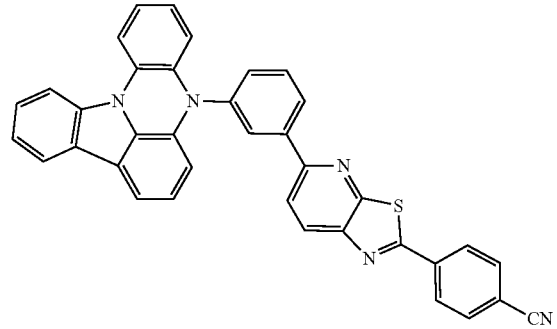
22
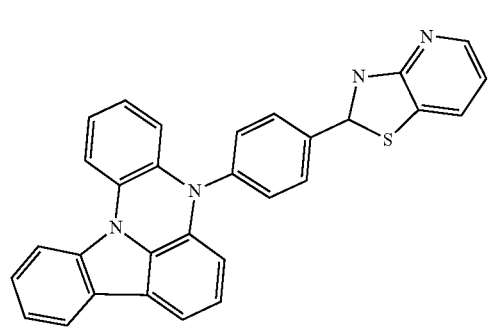
23
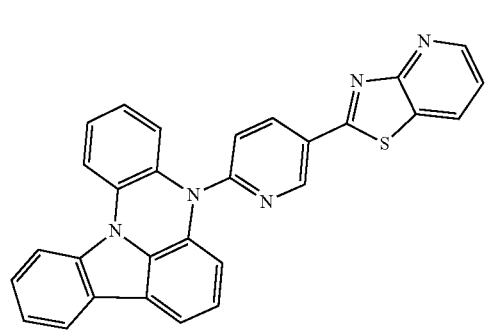
24
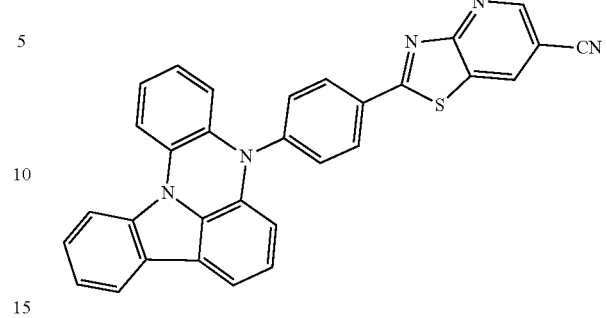
25
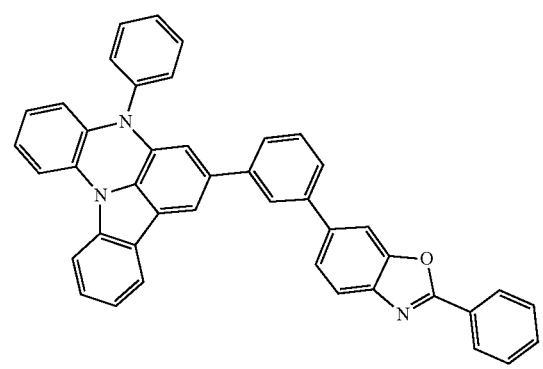
26
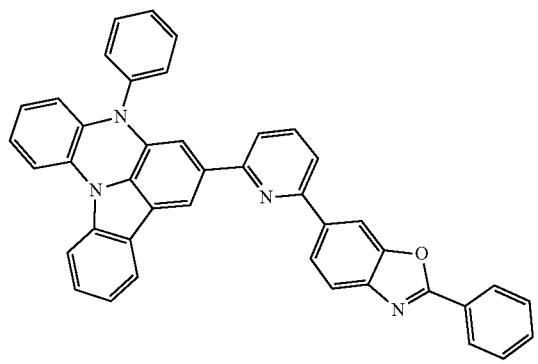
27
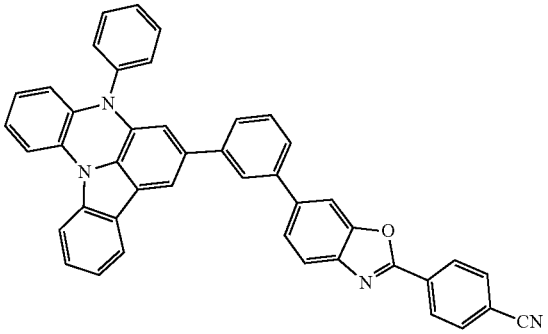

28
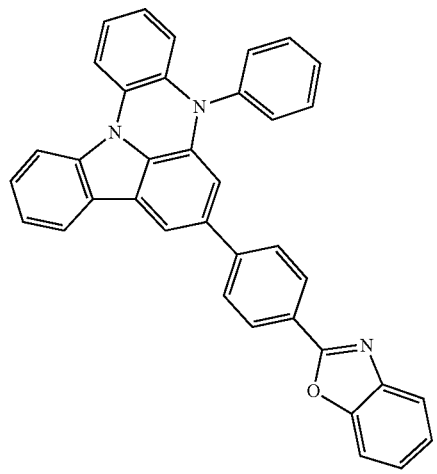
29
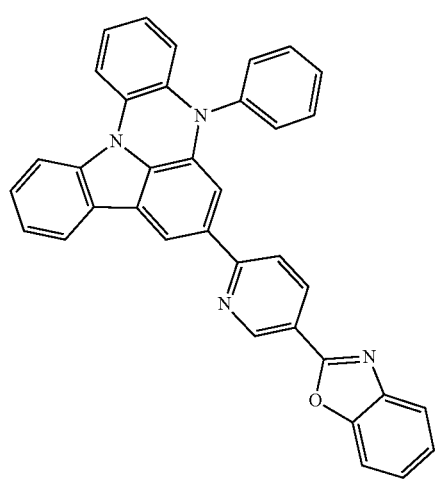
30
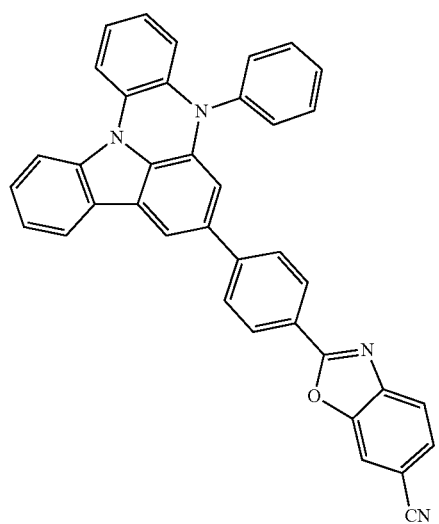
31
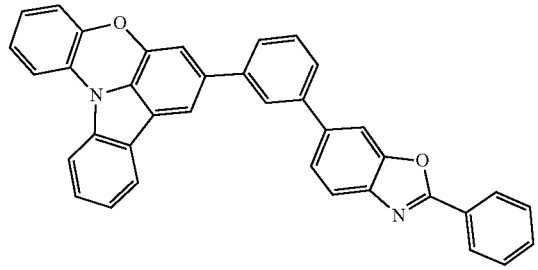
32
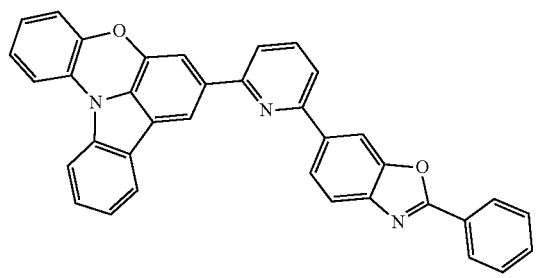
33
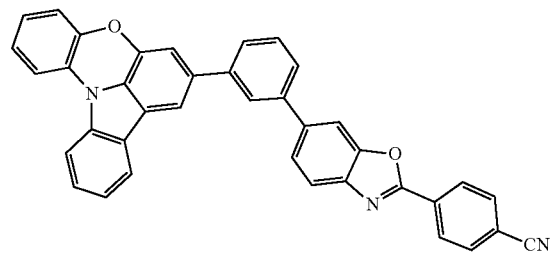
34
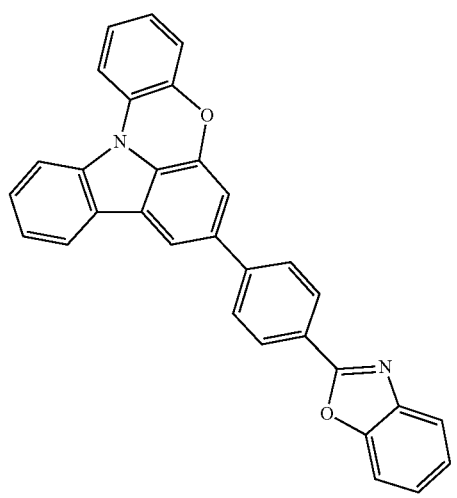

35
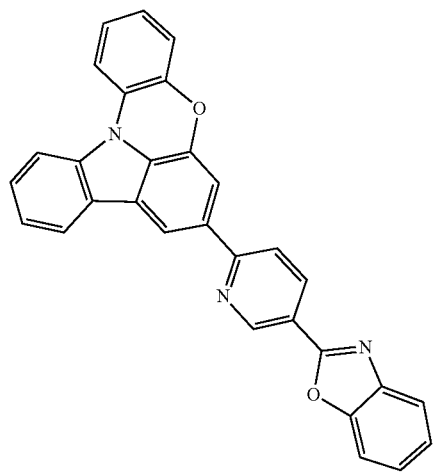
36
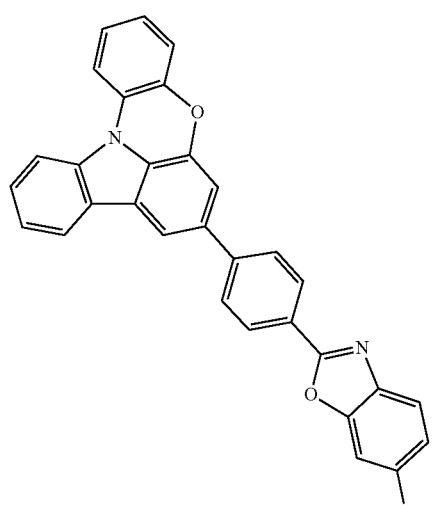
37
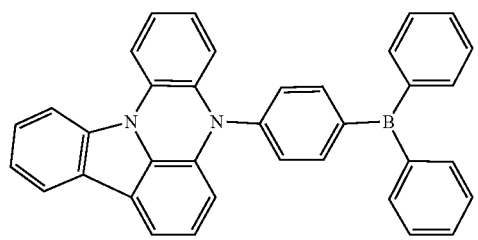
38
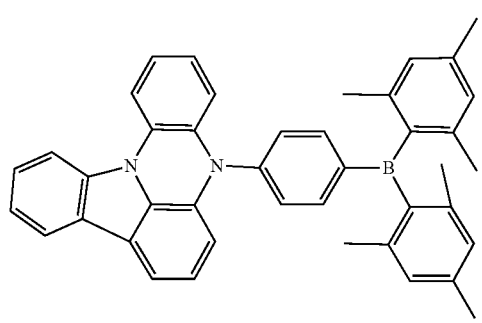
39
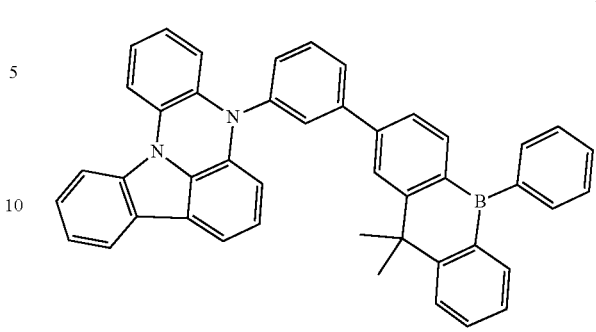
40
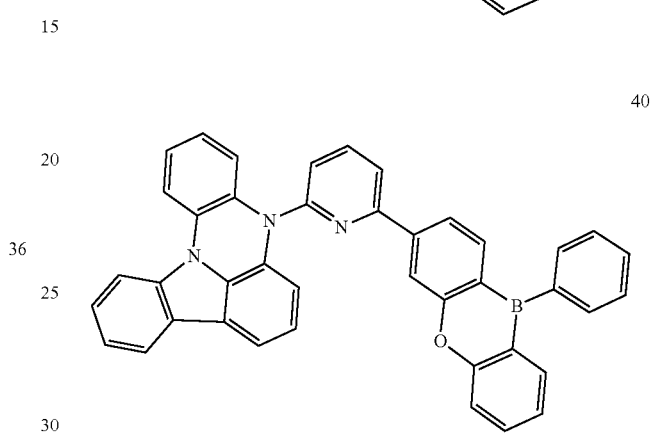
41
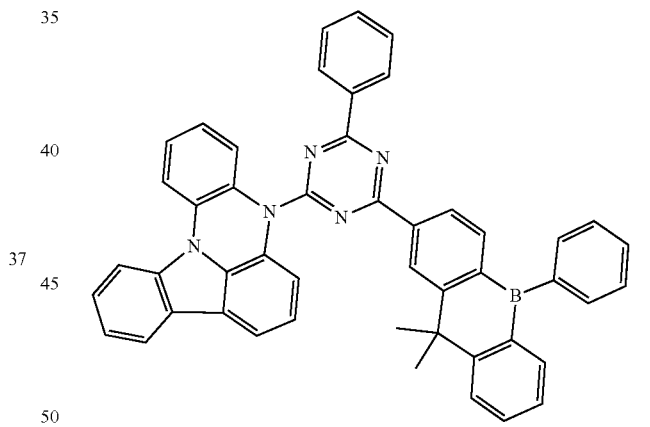
42
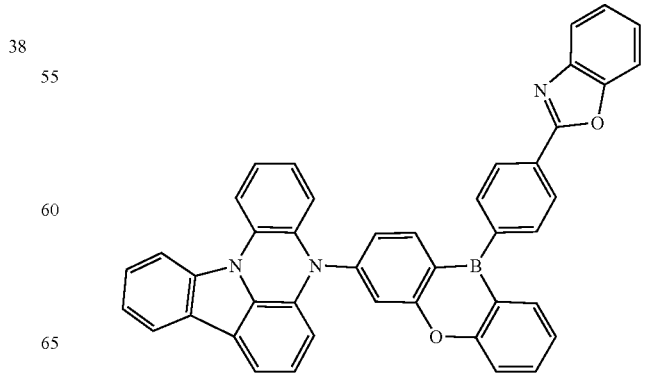

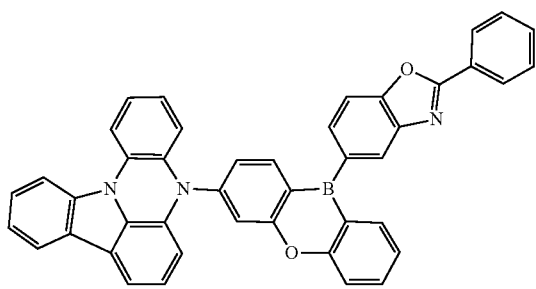
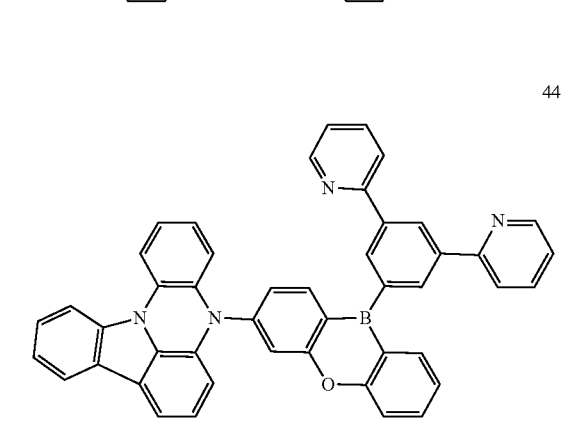
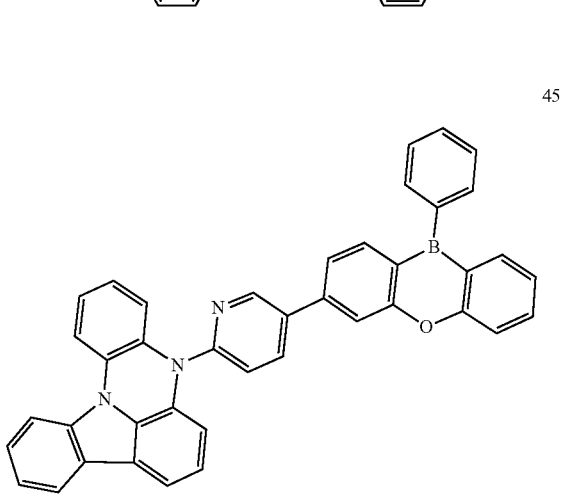
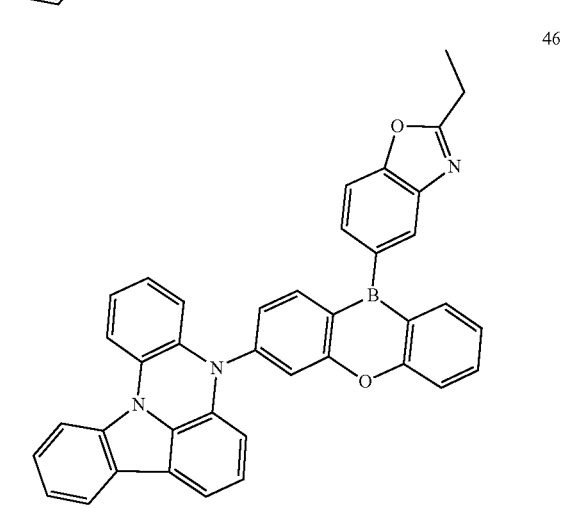
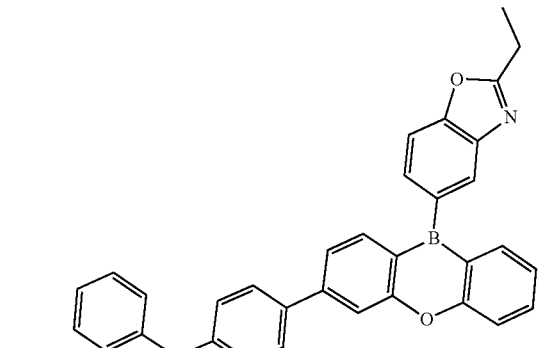
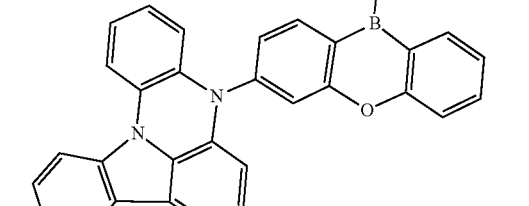
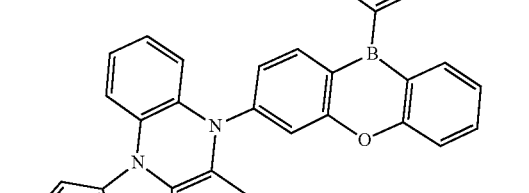

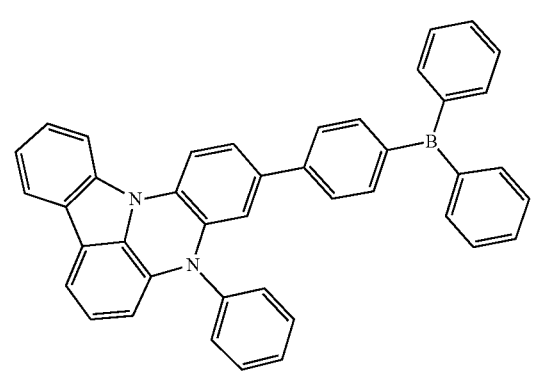
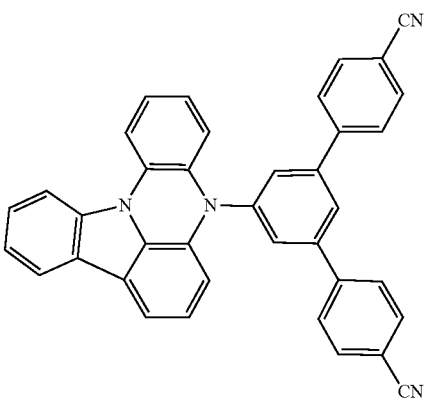
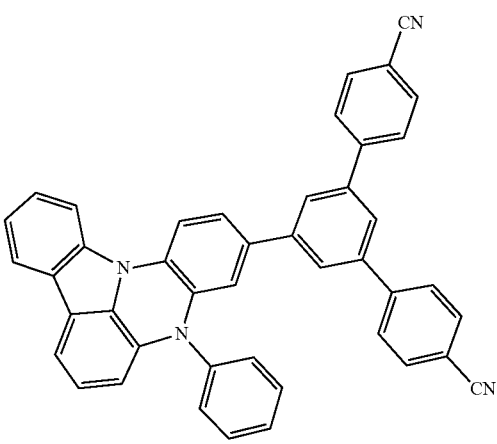
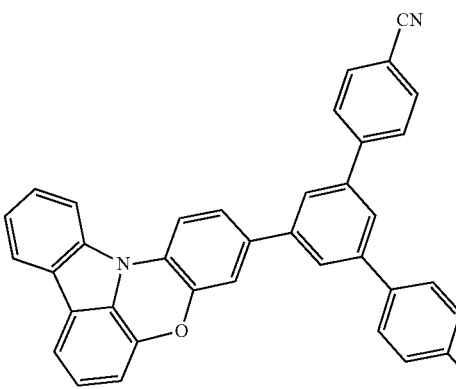
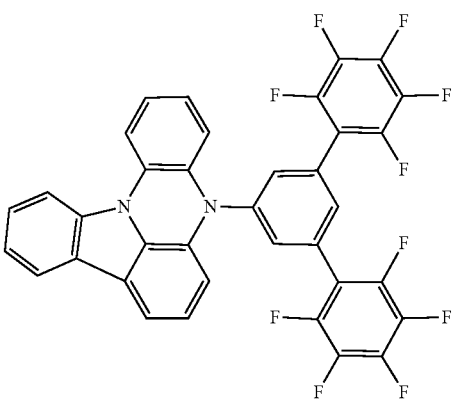

Compound Group 2

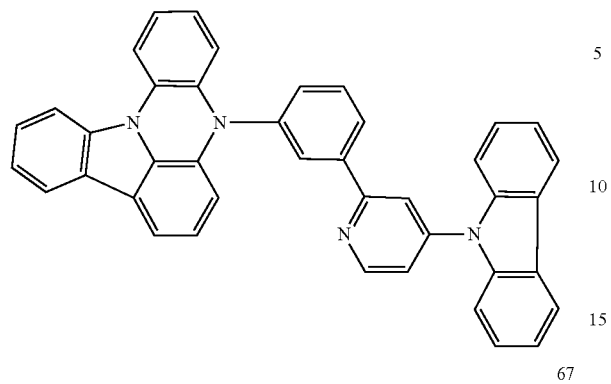
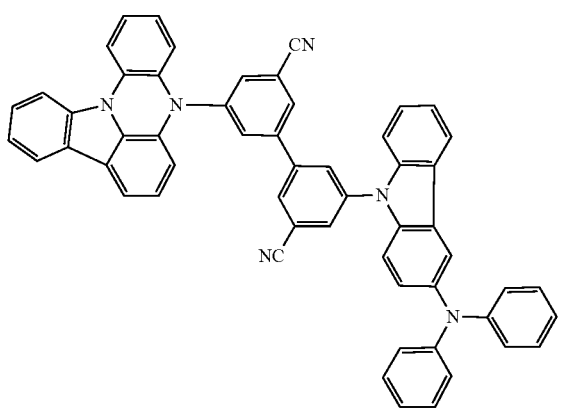
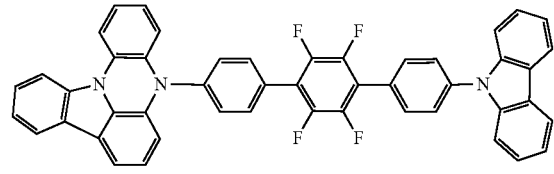
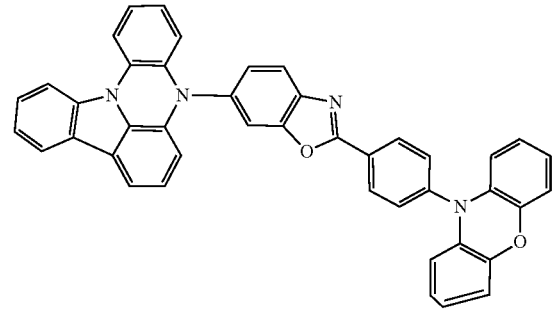
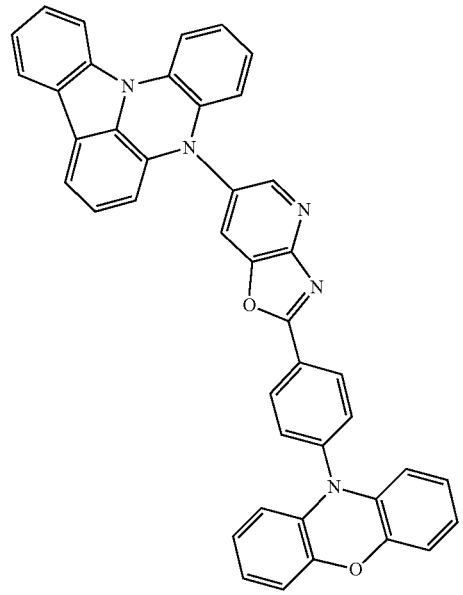

93
94
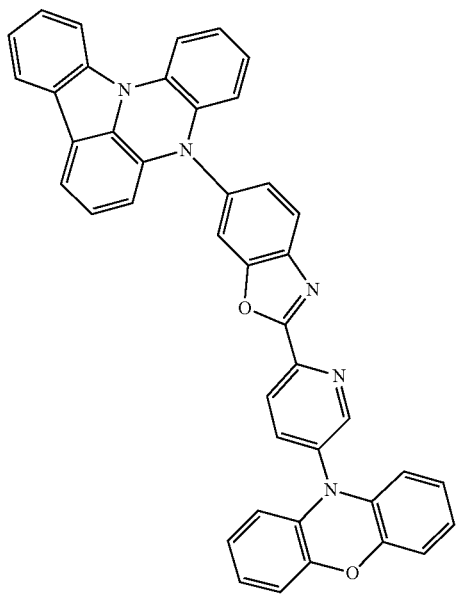
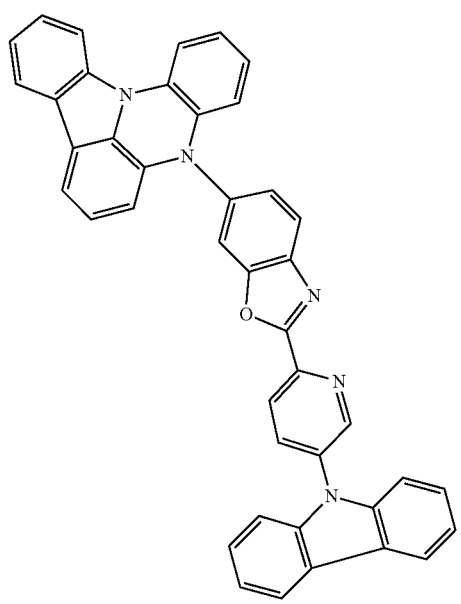
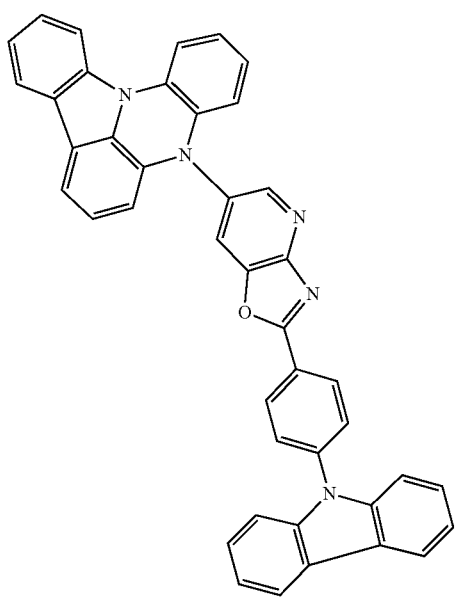
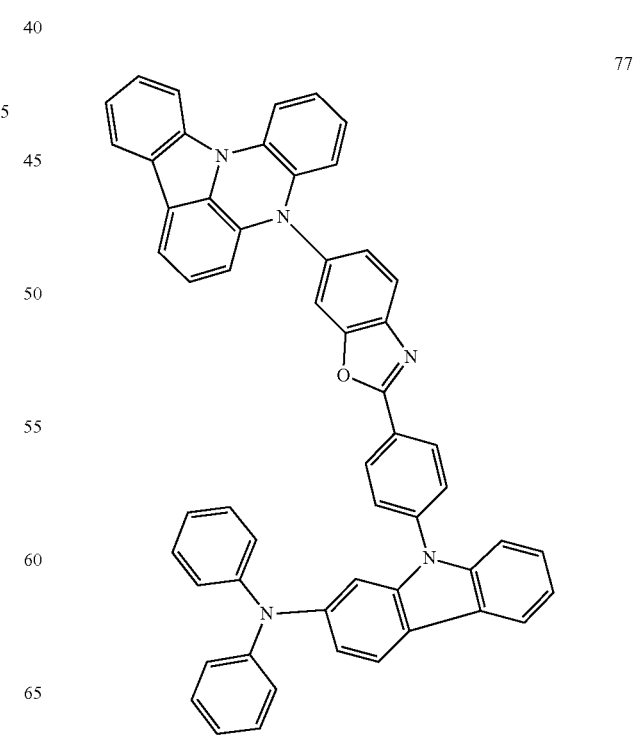

95
-continued
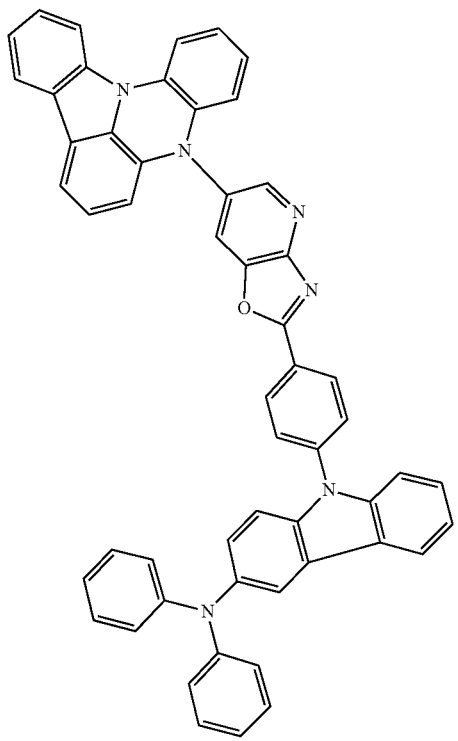
78
79
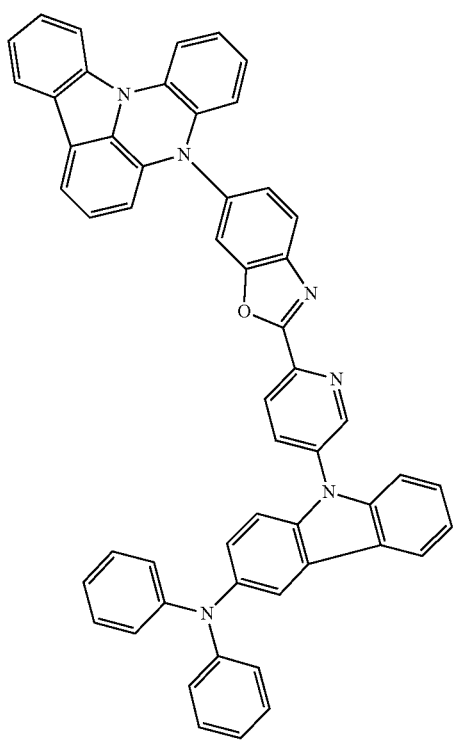
96
-continued
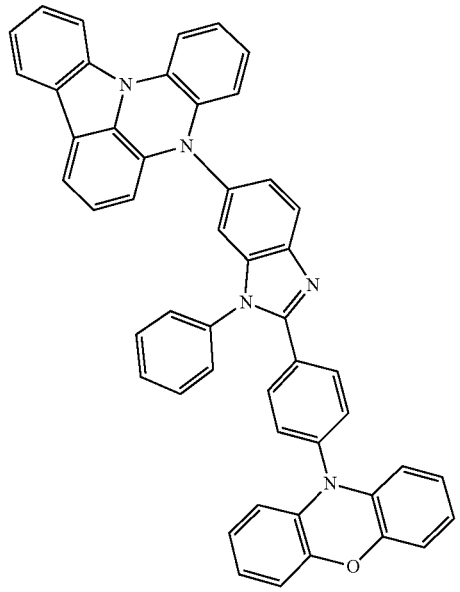
80
81
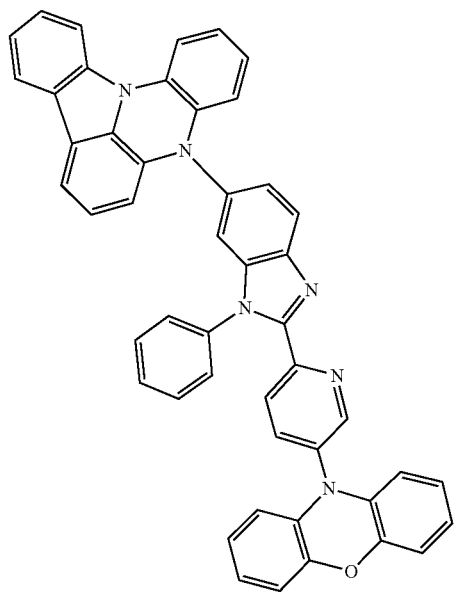

82
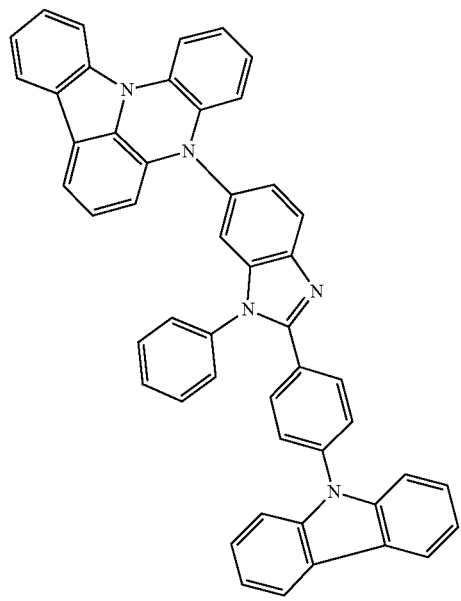
83
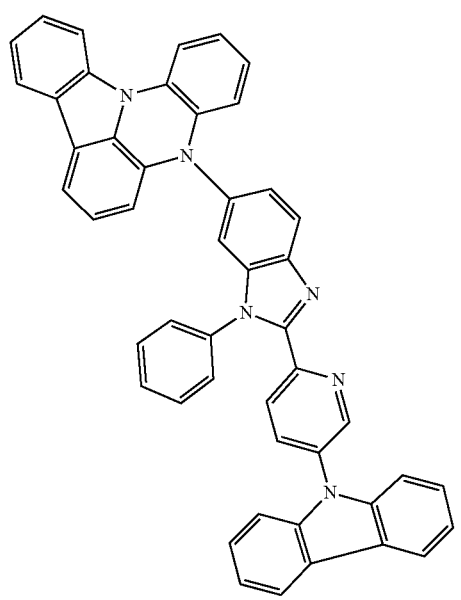
84
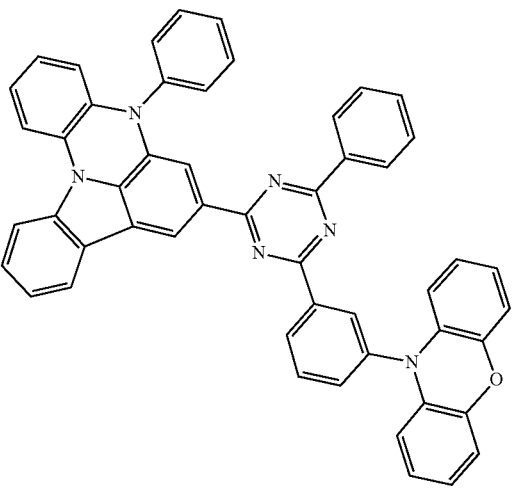
85
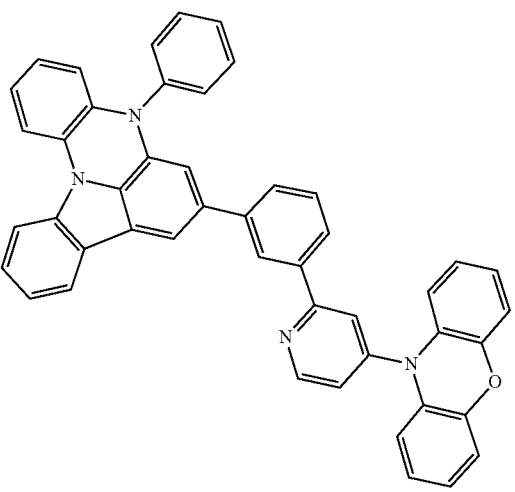
86
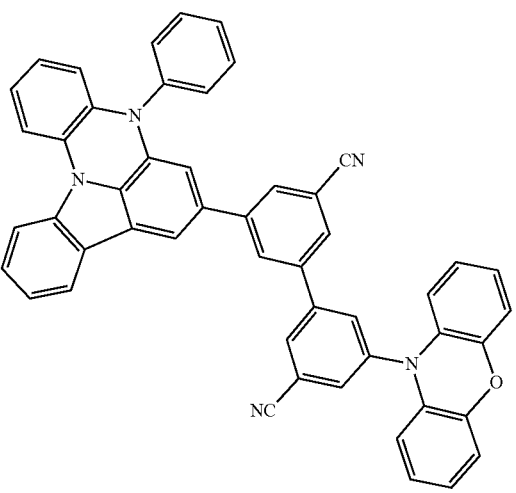

-continued

87
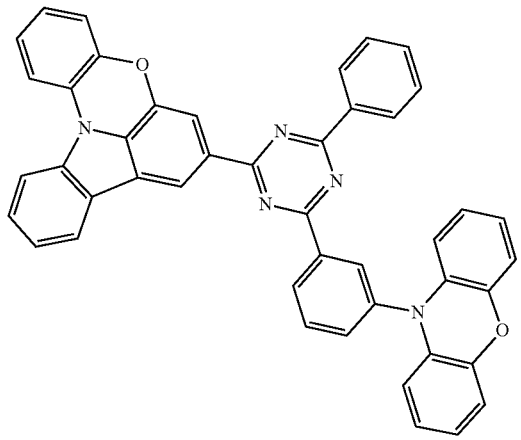

88
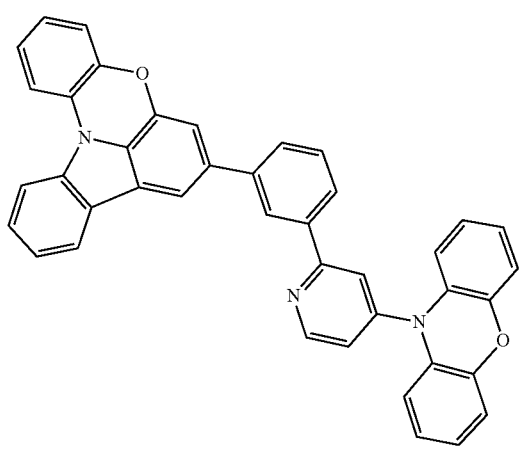

89
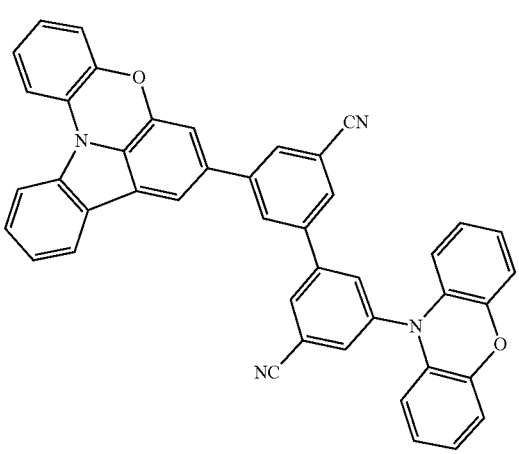

13. A polycyclic compound represented by Formula 1:

$$D\text{—}(L)_n\text{—}A,\quad \text{Formula 1}$$

wherein in Formula 1,
L is a substituted or unsubstituted arylene group of 6 to 30 carbon atoms for forming a ring, or a substituted or unsubstituted heteroarylene group of 2 to 30 carbon atoms for forming a ring,
A is represented by any one selected from Formula A-1 to Formula A-3,
where at least one selected from L and A comprises an electron acceptor substituent,
n is an integer of 1 to 3, and
D is represented by Formula 2:

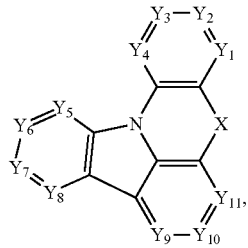

Formula 2 wherein in Formula 2,
X is O, S, $NR_1$, or $SiR_2R_3$,
$Y_1$ to $Y_{11}$ are each independently N or $CR_4$,
$R_1$ to $R_4$ are each independently a hydrogen atom, a deuterium atom, a halogen atom, a substituted or unsubstituted silyl group, a substituted or unsubstituted amine group, a substituted or unsubstituted alkyl group of 1 to 20 carbon atoms, a substituted or unsubstituted aryl group of 6 to 30 carbon atoms for forming a ring, or a substituted or unsubstituted heteroaryl group of 2 to 30 carbon atoms for forming a ring, or are combined with an adjacent group to form a ring, and
any one selected from $R_1$ to $R_4$ is a connecting part with L in Formula 1:

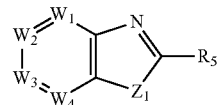

Formula A-1

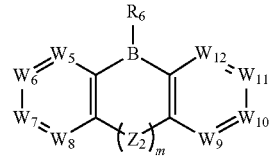

Formula A-2

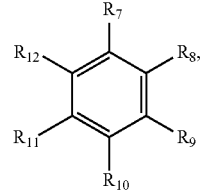

Formula A-3 wherein in Formula A-1 to Formula A-3,
$W_1$ to $W_{12}$ are each independently N or $CR_{13}$,
$Z_1$ is O or S,
$Z_2$ is O, S, $NR_{14}$, $CR_{15}R_{16}$, or $SiR_{17}R_{18}$,
m is 0 or 1, R₅ to R₁₈ are each independently a hydrogen atom, a deuterium atom, a halogen atom, a cyano group, a substituted or unsubstituted silyl group, a substituted or unsubstituted amine group, a substituted or unsubstituted alkyl group of 1 to 20 carbon atoms, a substituted or unsubstituted aryl group of 6 to 30 carbon atoms for forming a ring, or a substituted or unsubstituted heteroaryl group of 2 to 30 carbon atoms for forming a ring, or are combined with an adjacent group to form a ring, at least one selected from R₇ to R₁₂ is a halogen atom or a cyano group, and any one selected from R₅ to R₁₈ is a connecting part with L in Formula 1.

14. The polycyclic compound of claim 13, wherein an absolute value of a difference between a lowest singlet excitation energy level (S1) and a lowest triplet excitation energy level (T1) in the polycyclic compound represented by Formula 1 is about 0.2 eV.

15. The polycyclic compound of claim 13, wherein the polycyclic compound represented by Formula 1 is represented by Formula 3:

D₁-L₁-A-L₂-D₂        Formula 3 wherein in Formula 3,

L₁ and L₂ are each independently a substituted or unsubstituted arylene group of 6 to 30 carbon atoms for forming a ring, or a substituted or unsubstituted heteroarylene group of 2 to 30 carbon atoms for forming a ring, D₁ is represented by Formula 2, D₂ is an electron donor substituent, and A is the same as defined in connection with Formula 1.

16. The polycyclic compound of claim 13, wherein D is represented by one selected from Formula 2-1 to Formula 2-3:

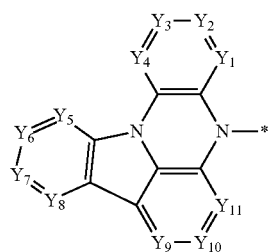

Formula 2-1

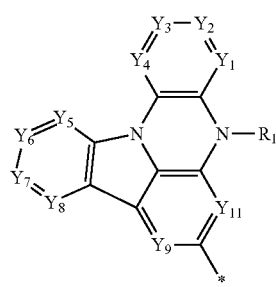

Formula 2-2

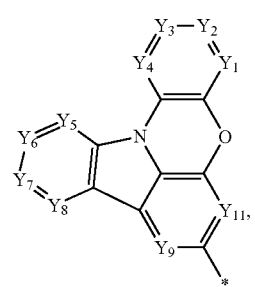

Formula 2-3 wherein in Formula 2-1 to Formula 2-3,

Y₁ to Y₁₁ are the same as defined in connection with Formula 2.

17. The polycyclic compound of claim 13, wherein L is a substituted or unsubstituted phenylene group, a substituted or unsubstituted pyridinylene group, a substituted or unsubstituted triazinylene group, a substituted or unsubstituted benzoxazolylene group, a substituted or unsubstituted benzothiazolylene group, a substituted or unsubstituted benzimidazolylene group, a substituted or unsubstituted imidazopyridinylene group, a substituted or unsubstituted oxazolopyridinylene group, a substituted or unsubstituted thiazolopyridinylene group, a substituted or unsubstituted dibenzoborynylene group, or a substituted or unsubstituted dibenzoxaborynylene group.

18. The polycyclic compound of claim 13, wherein the polycyclic compound represented by Formula 1 is at least one selected from Compound Group 1 and Compound Group 2:

Compound Group 1

1

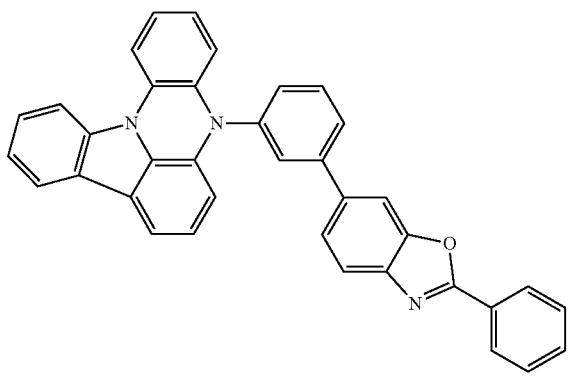

2

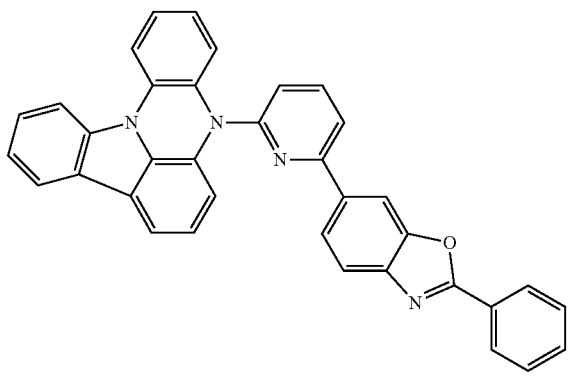

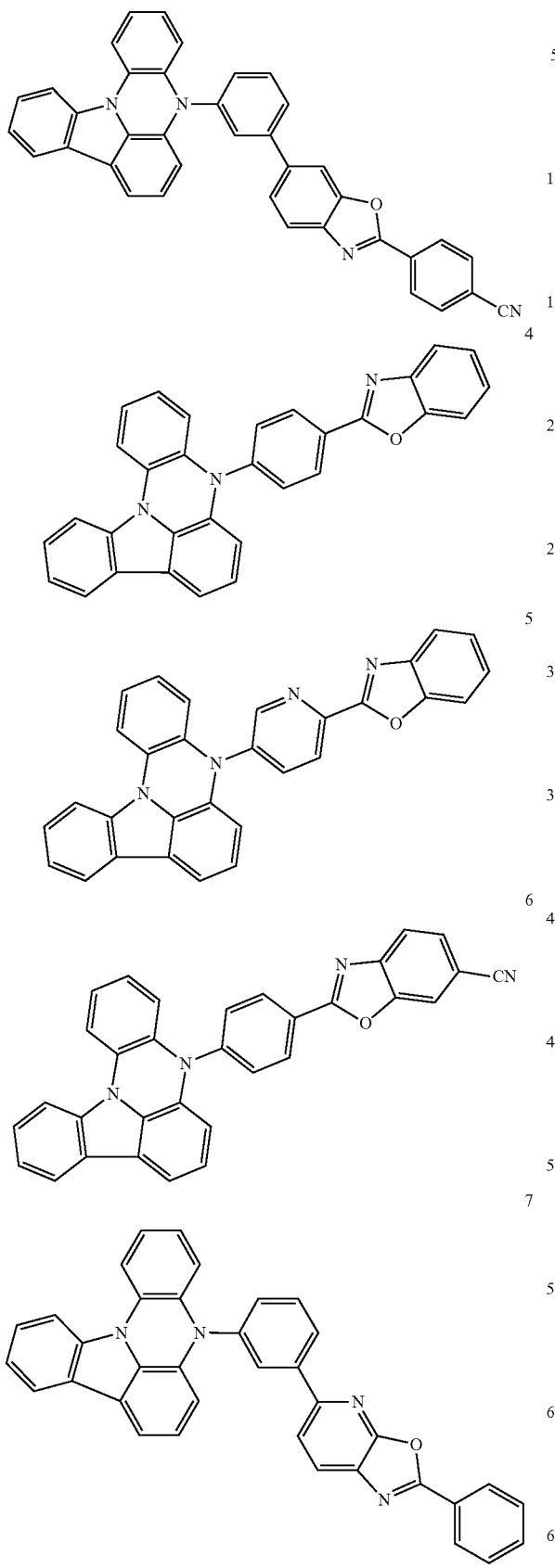
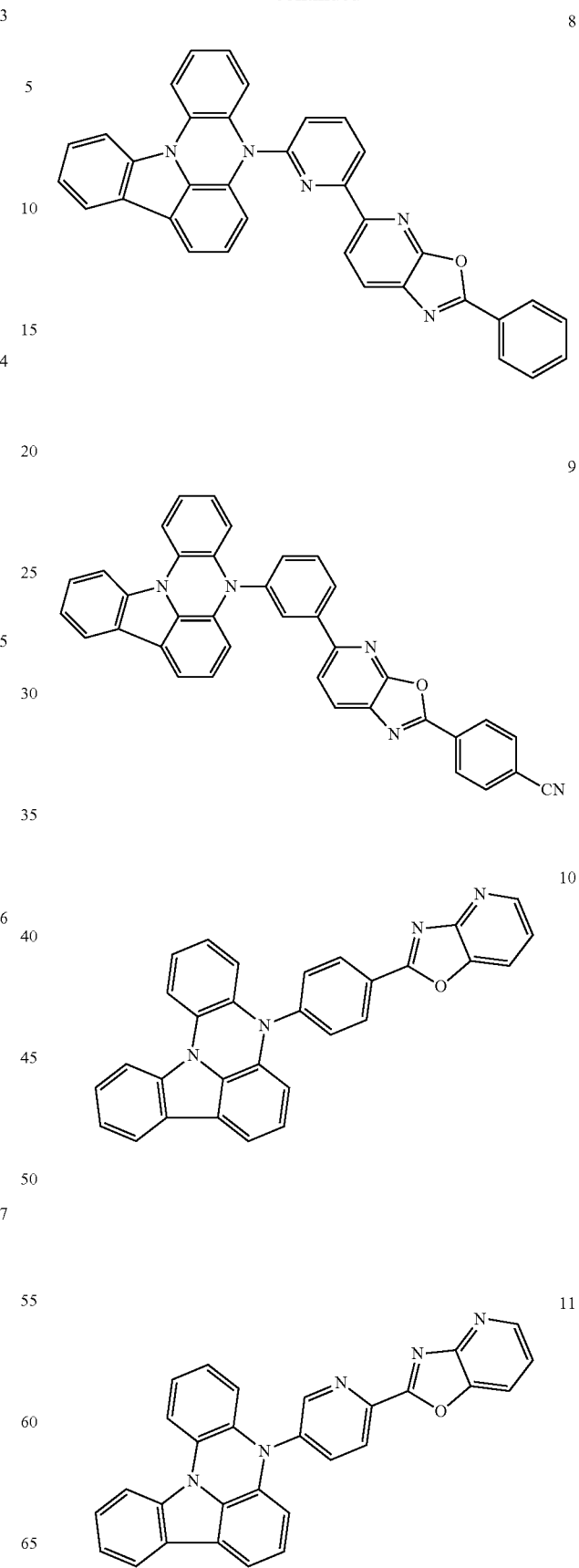

12
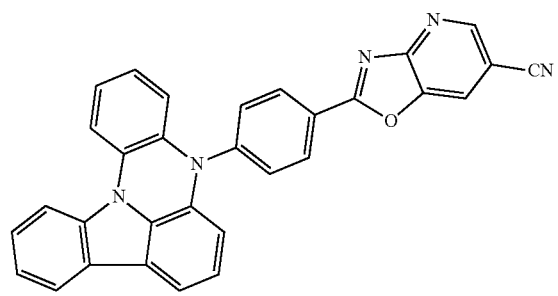
13
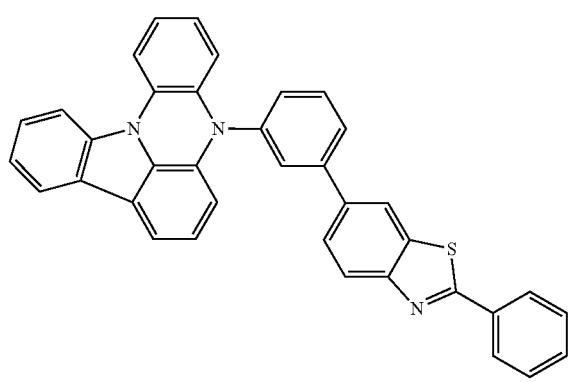
14
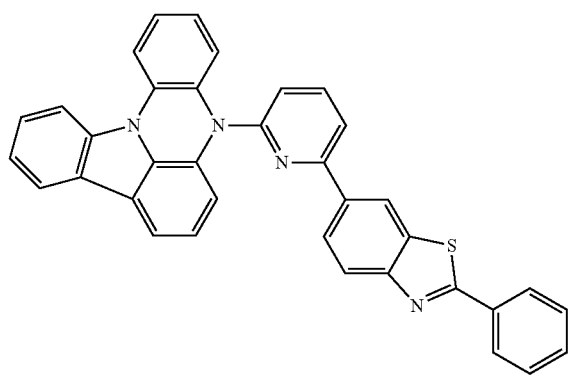
15
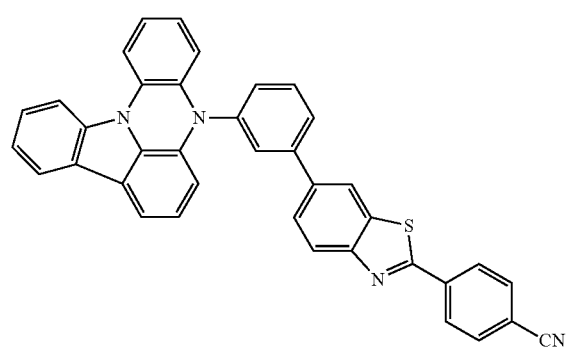
16
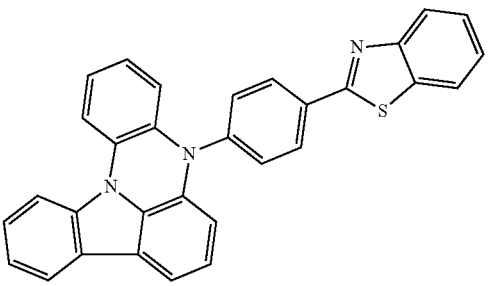
17
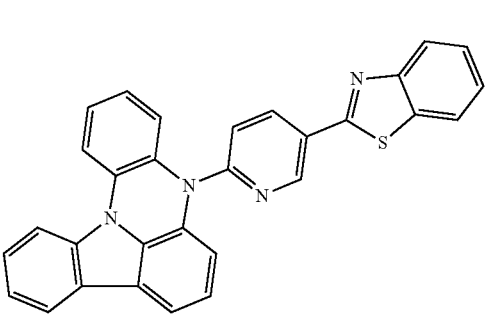
18
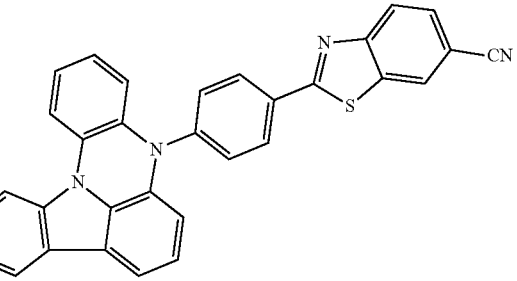
19
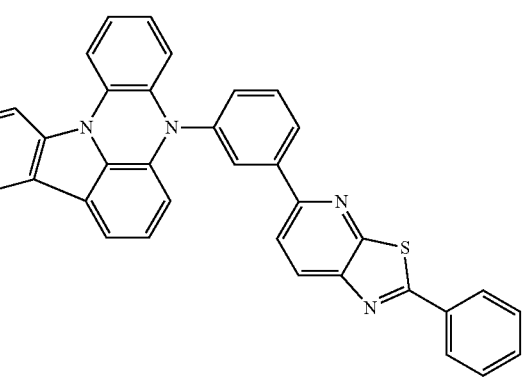

107 -continued
20
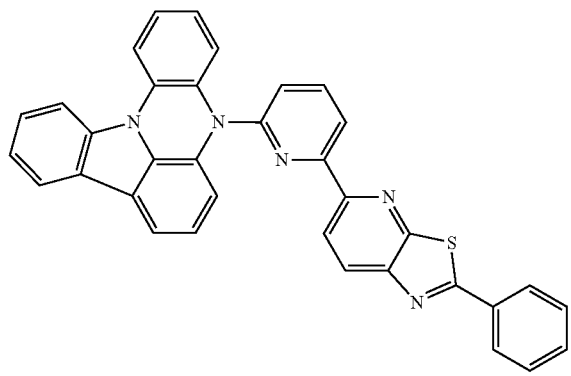
21
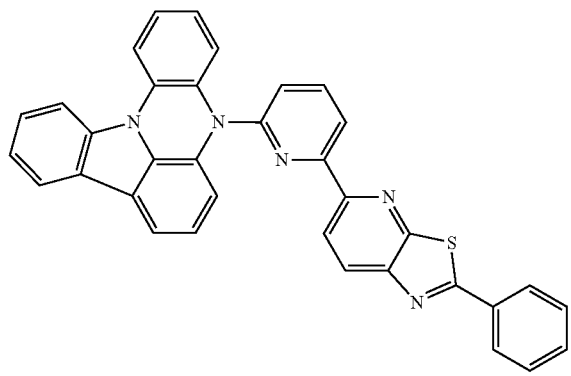
22
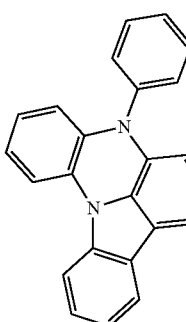
23
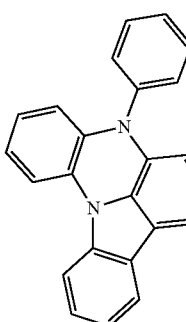
108 -continued
24
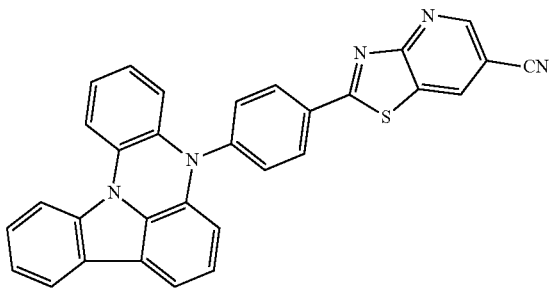
25
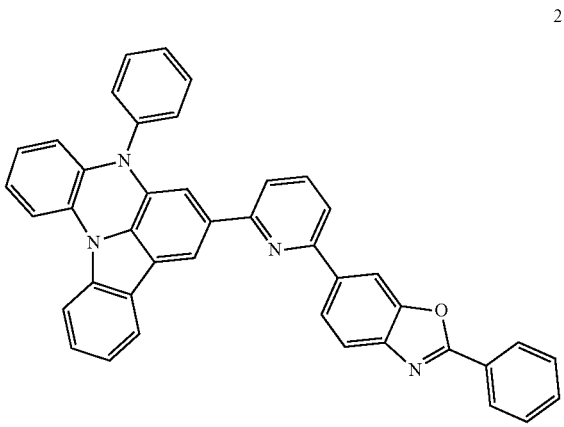
26
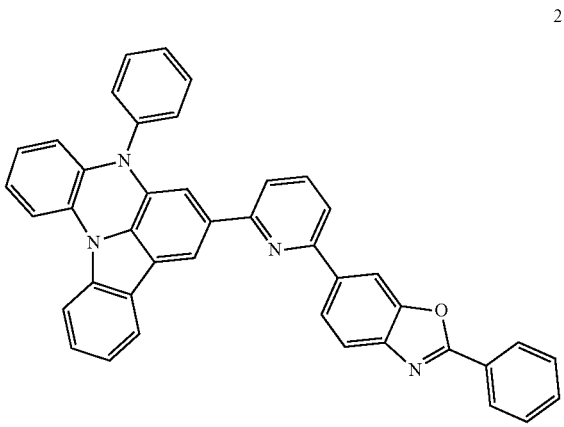
27
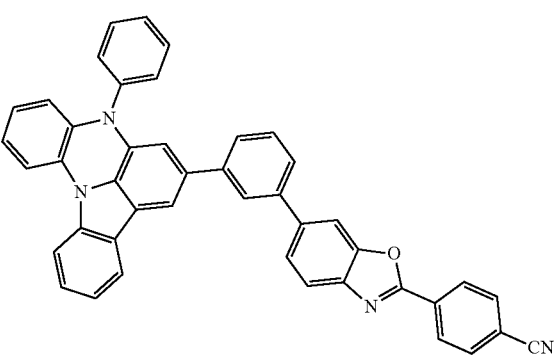

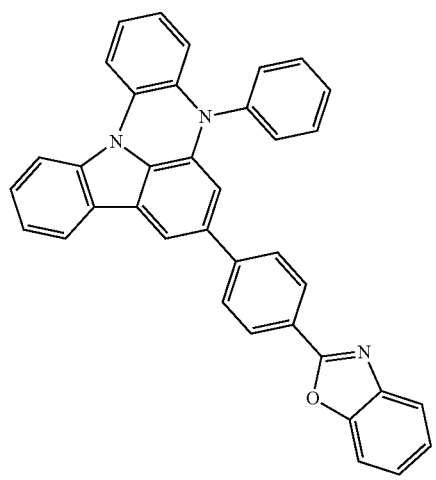
28
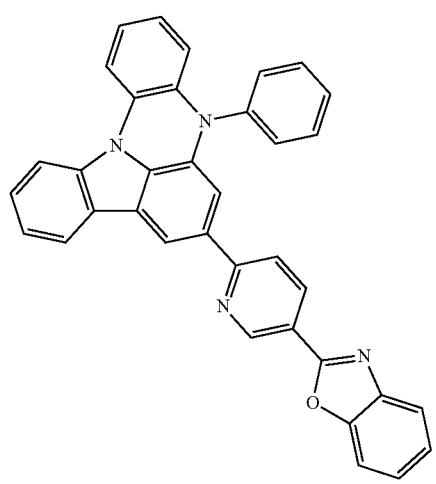
29
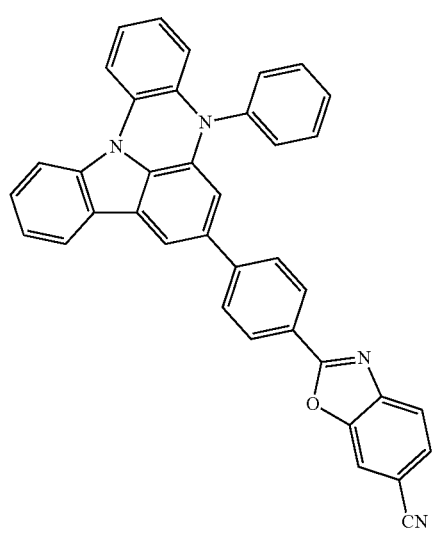
30
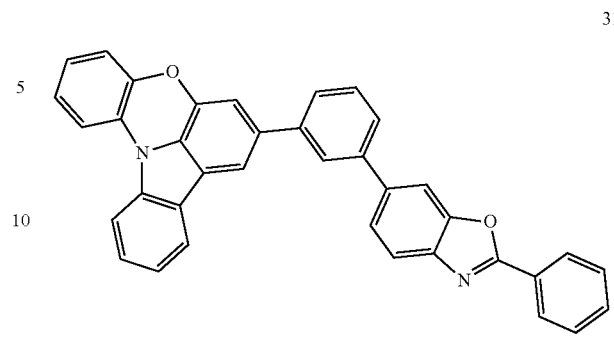
31
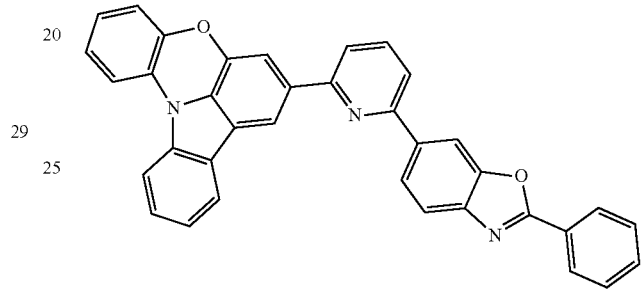
32
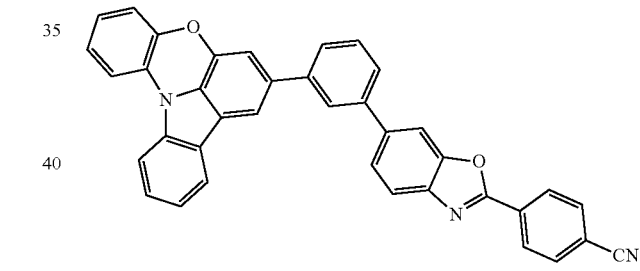
33
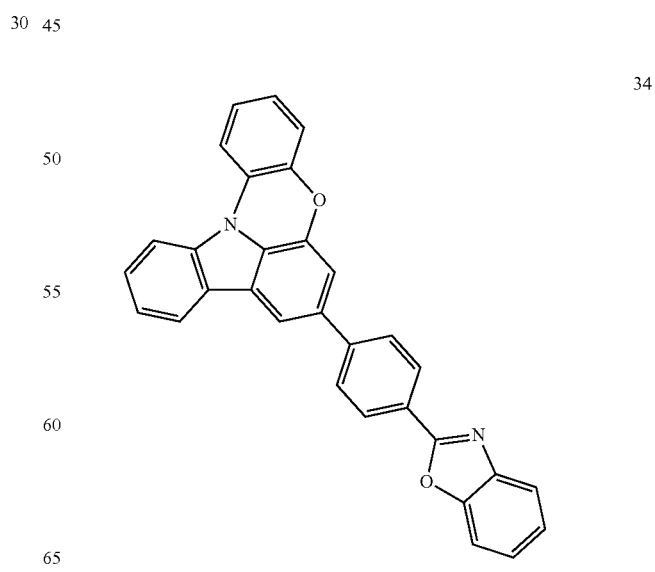
34

-continued
35
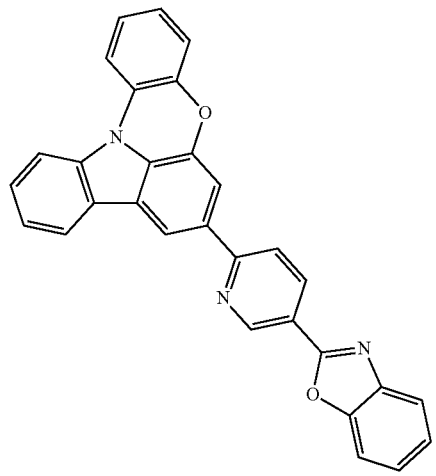
36
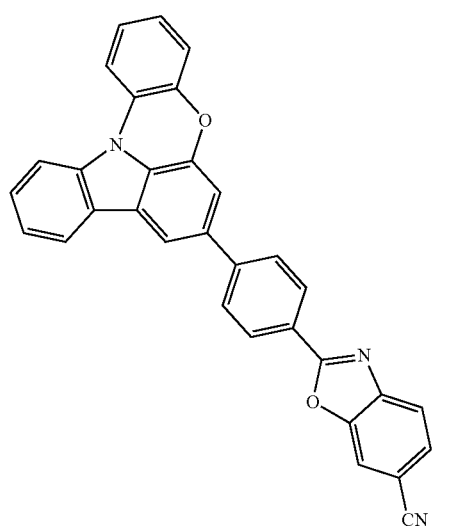
37
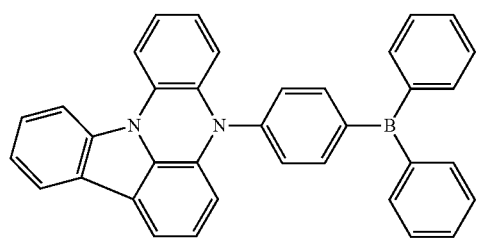
38
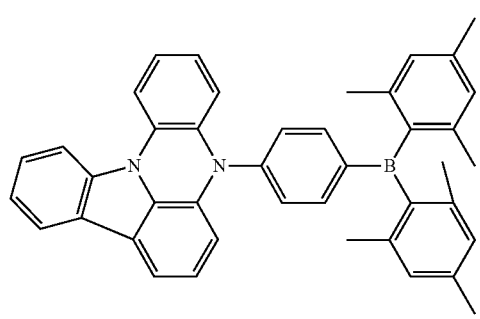
-continued
39
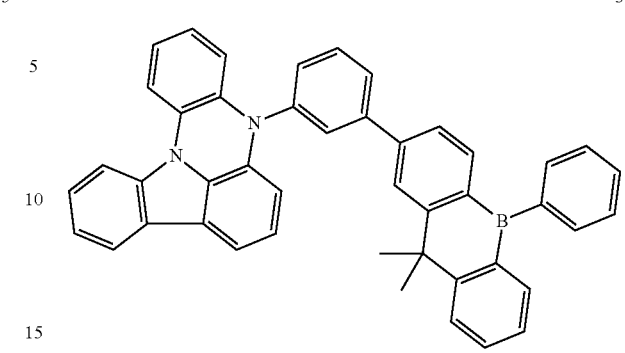
40
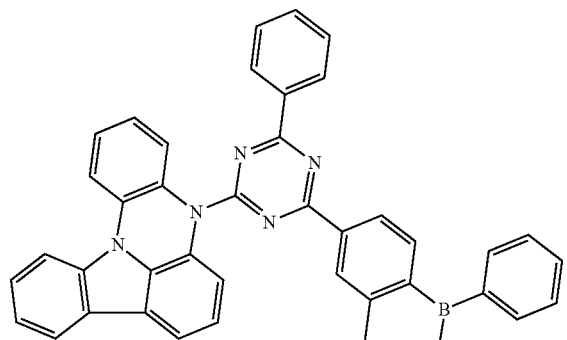
41
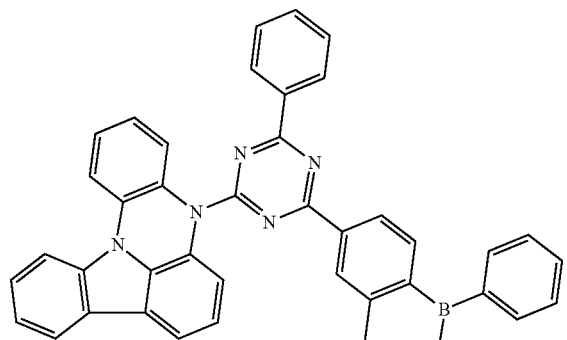
42
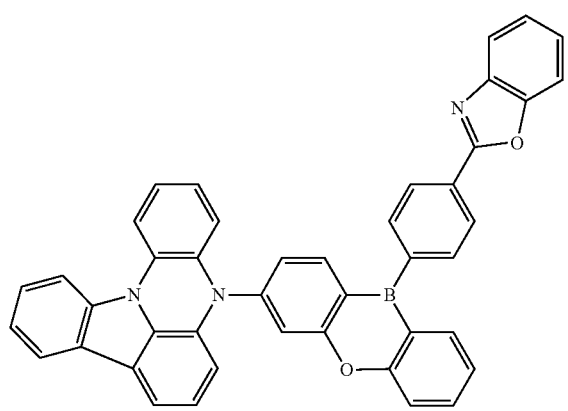

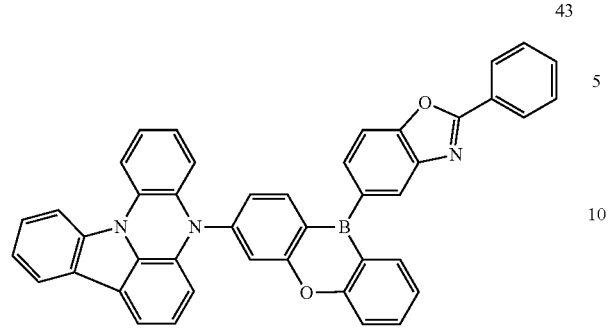
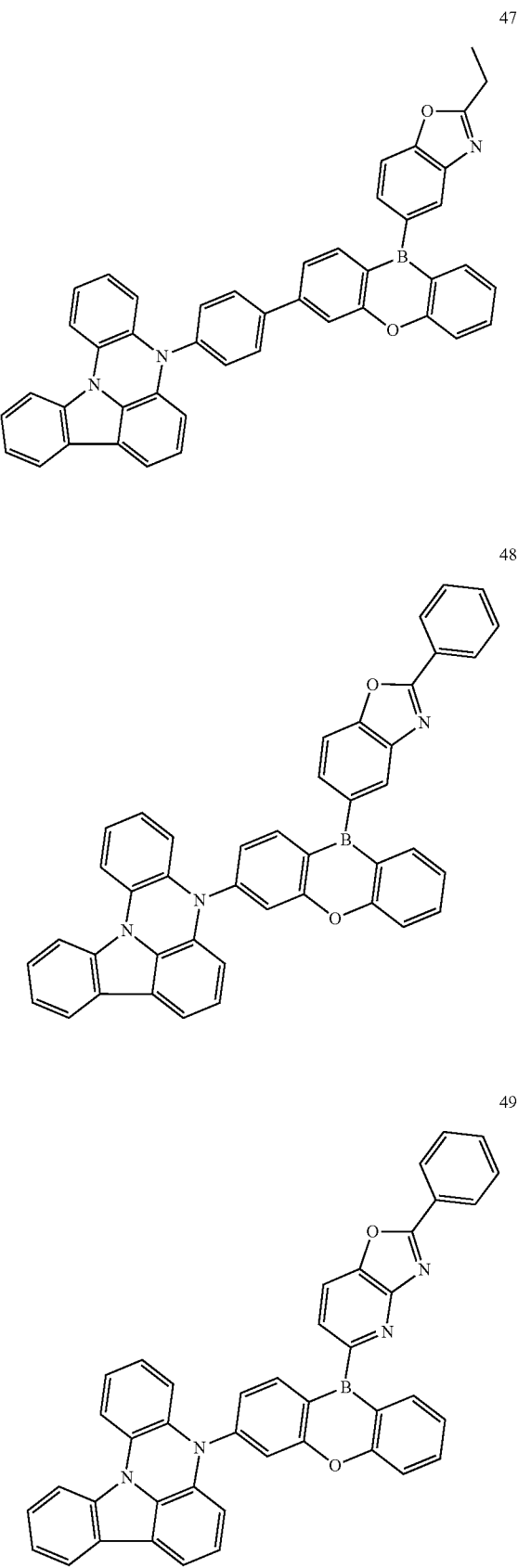

50
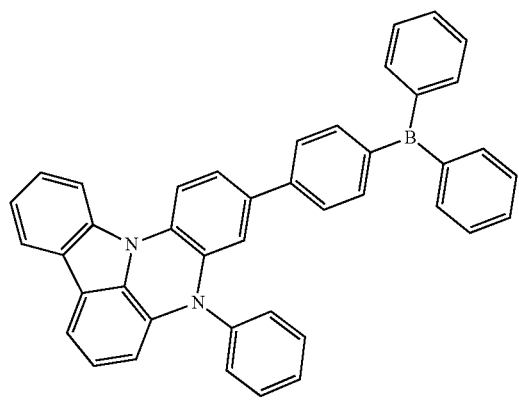
51
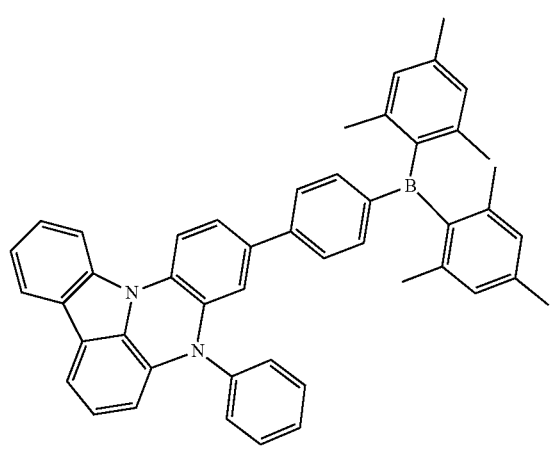
52
53
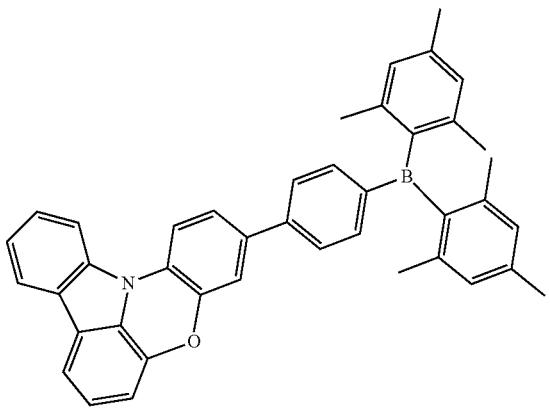
54
55
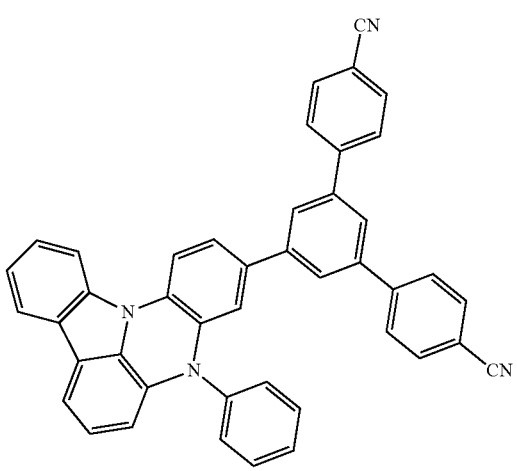

56 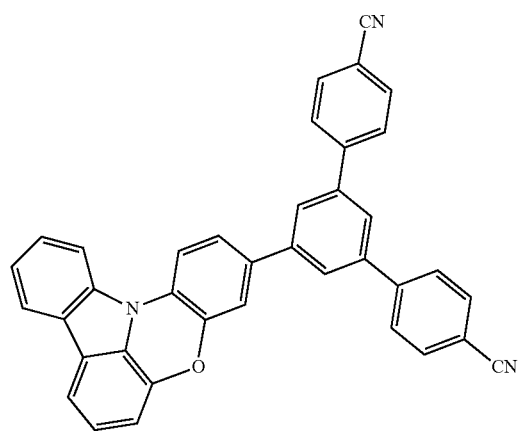
57 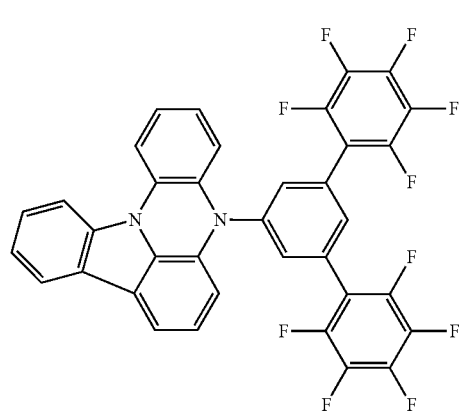
58 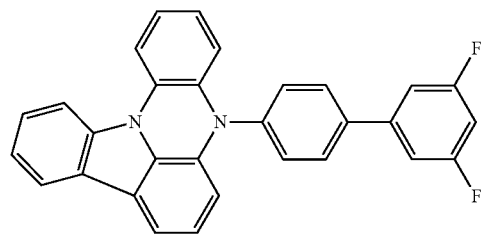
Compound Group 2
59 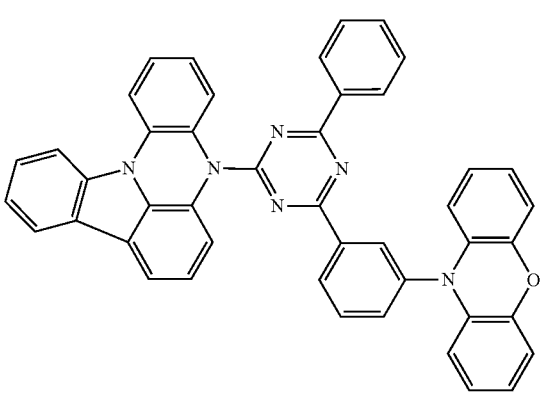
60 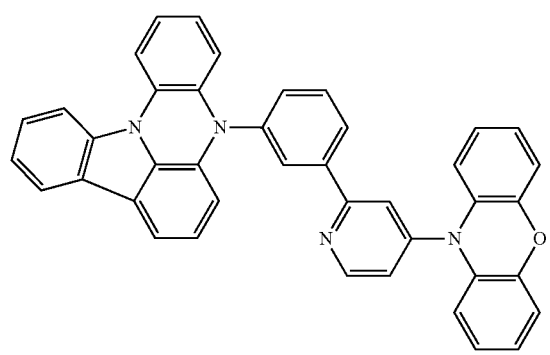
61
62
63

64
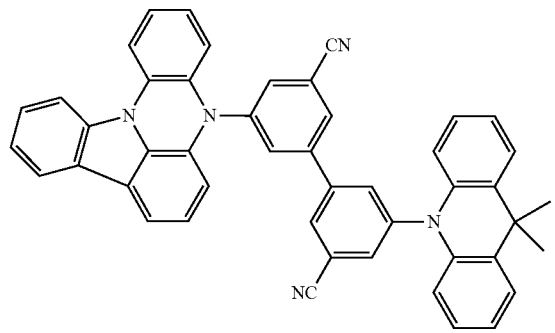
65
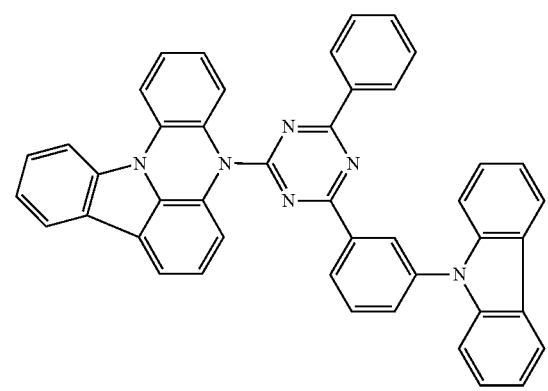
66
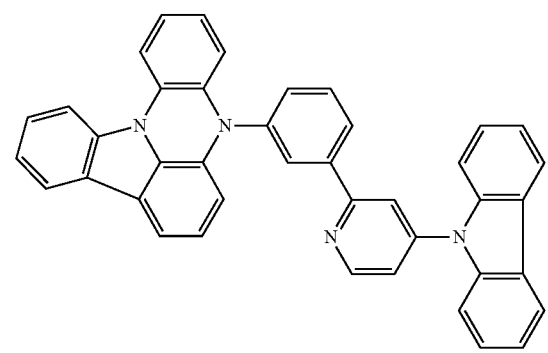
67
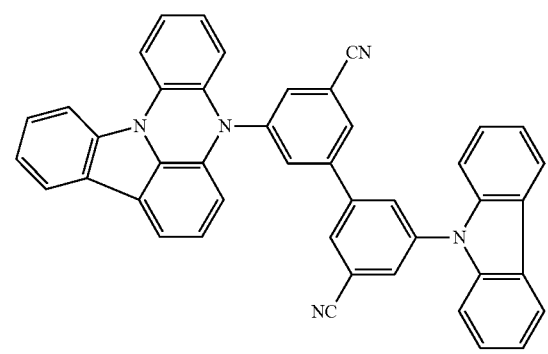
68
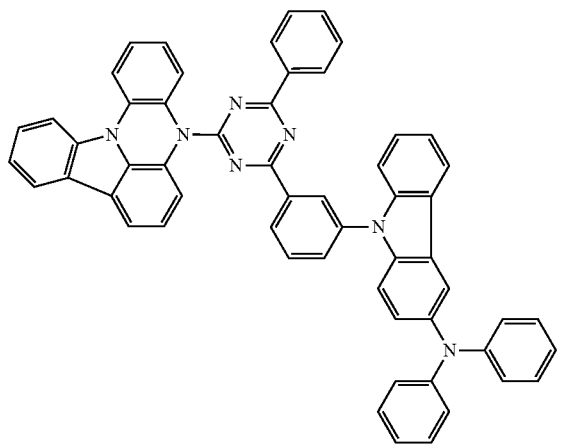
69
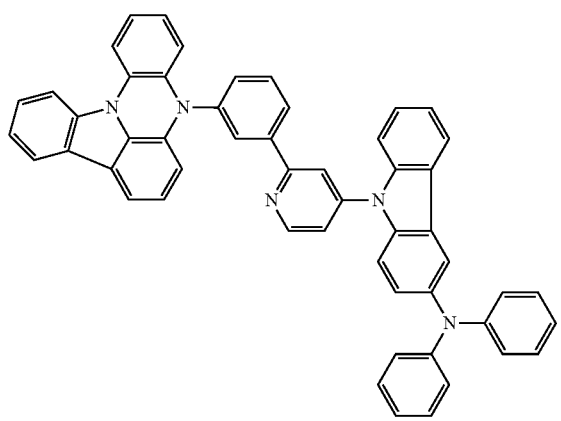
70
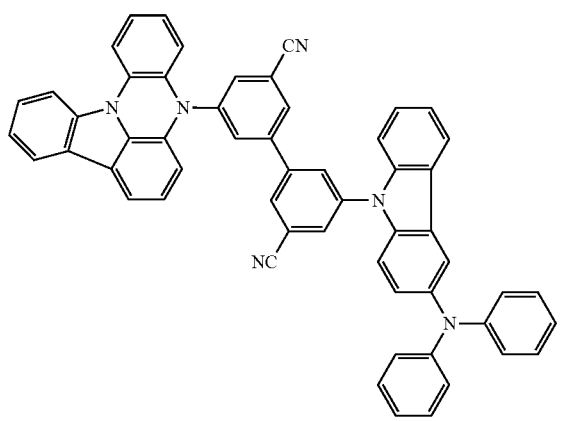
71
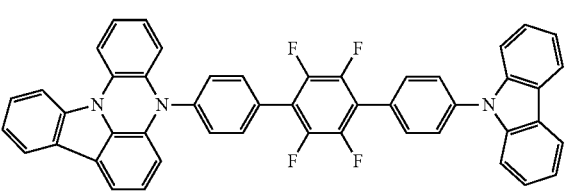

-continued
72
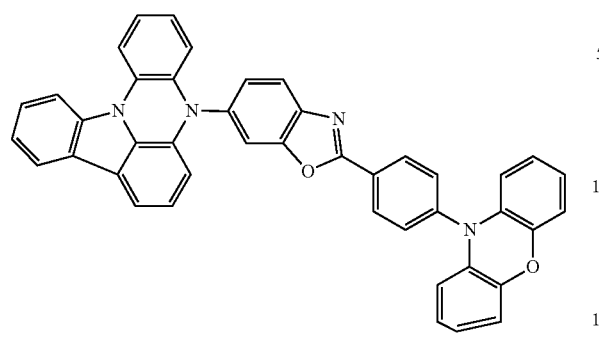
73
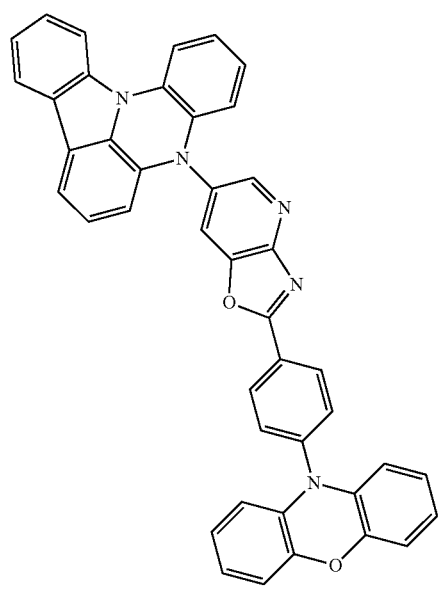
74
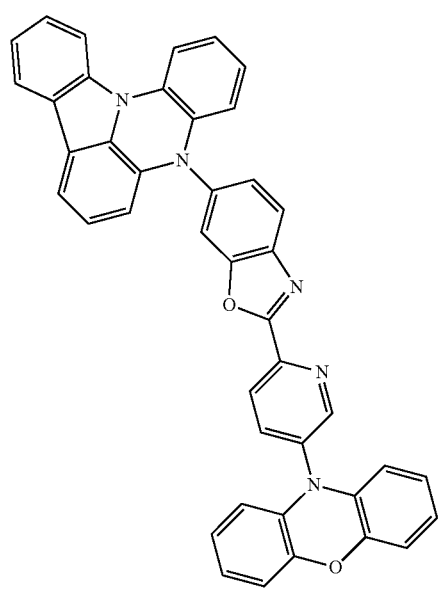
-continued
75
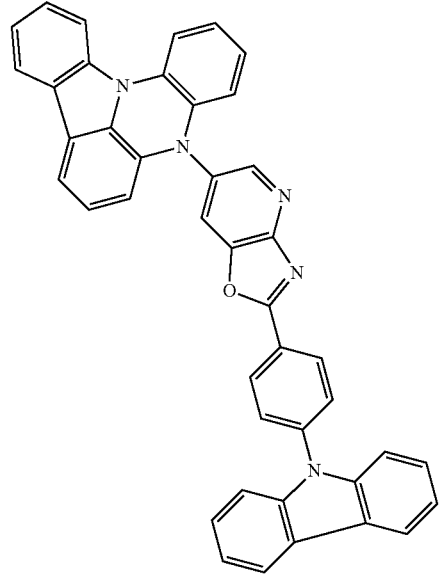
76
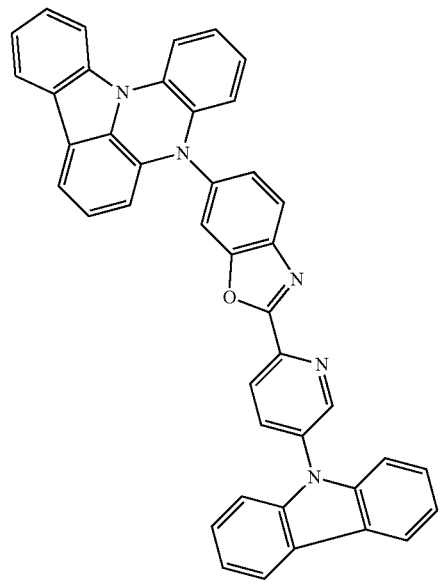

123 -continued
77
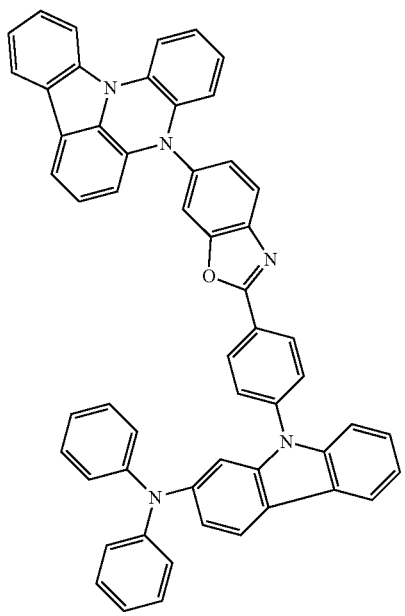
78
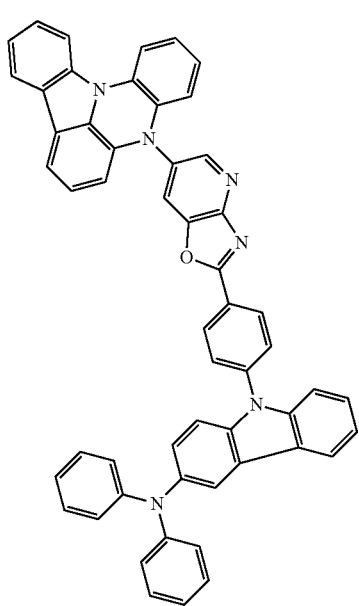
124 -continued
79
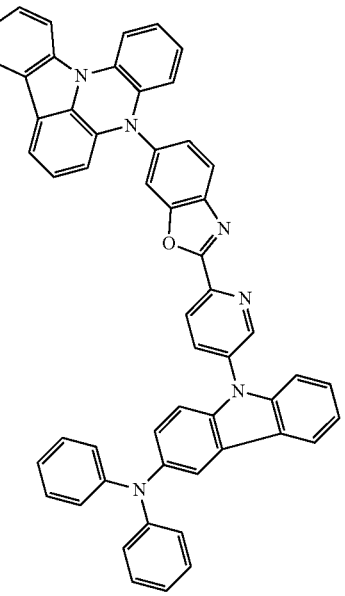
80
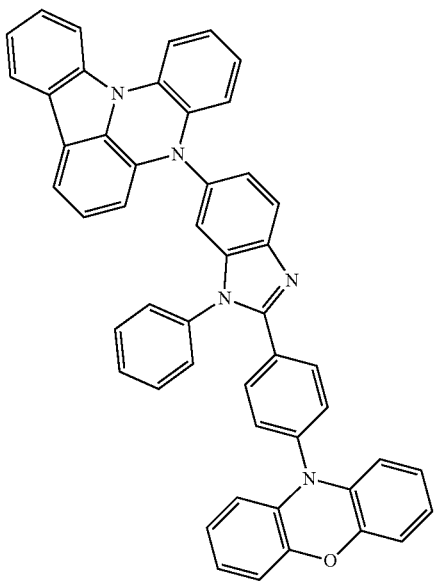

81
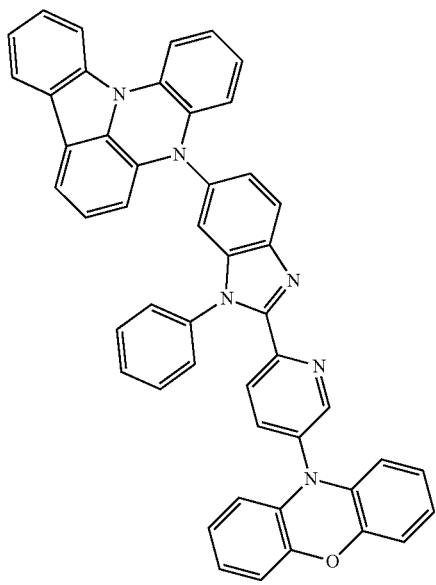
82
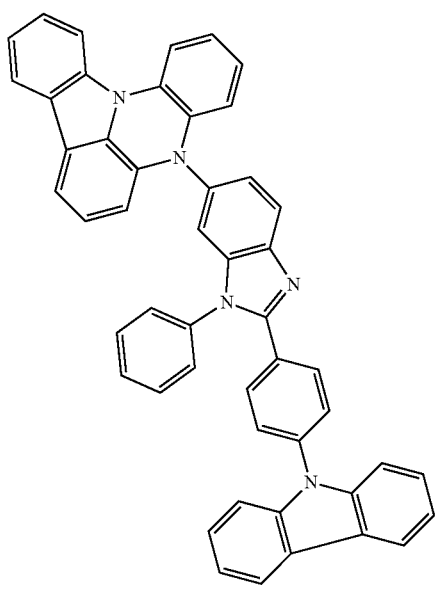
83
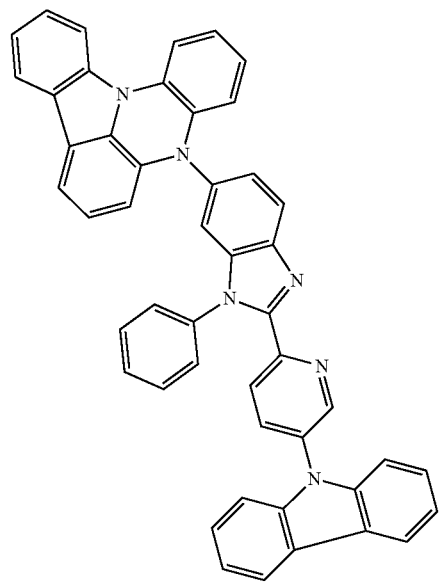
84
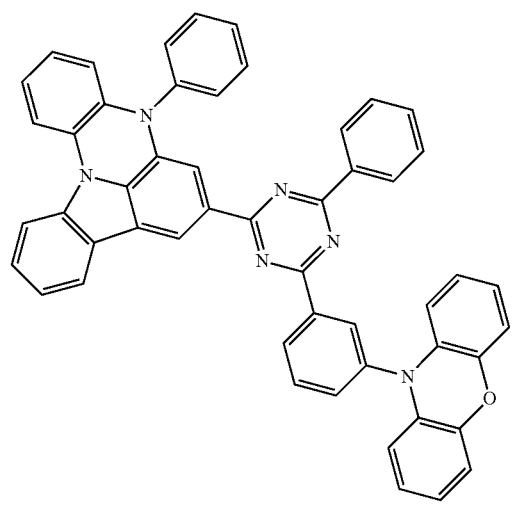
85

86
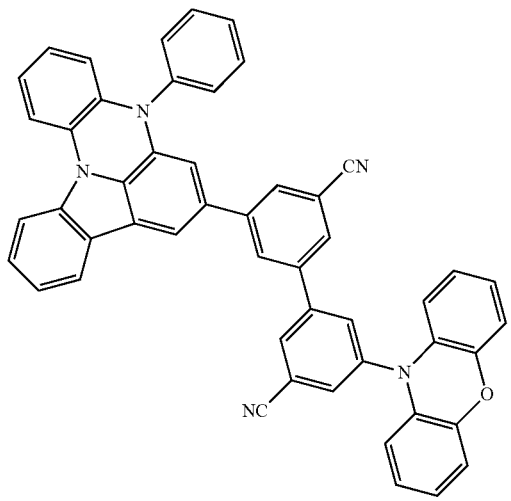
87
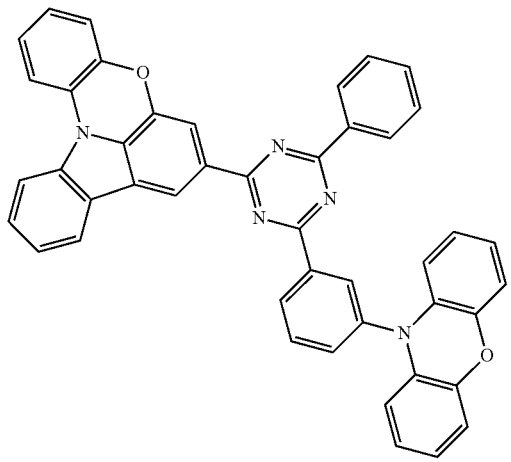
88
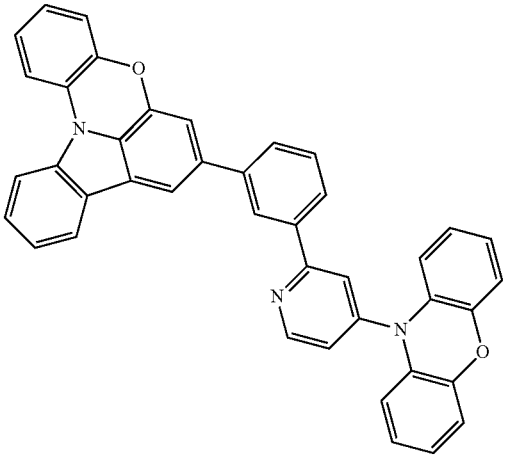
89
* * * * *